United States Patent
Gulati et al.

(10) Patent No.: US 11,329,789 B2
(45) Date of Patent: May 10, 2022

(54) TRANSMISSION METHODS TO HANDLE VULNERABLE SYMBOLS

(71) Applicant: QUALCOMM Incorporated, San Diego, CA (US)

(72) Inventors: Kapil Gulati, Hillsborough, NJ (US); Shuanshuan Wu, San Diego, CA (US); Naga Bhushan, San Diego, CA (US); Junyi Li, Chester, NJ (US); Sudhir Kumar Baghel, Hillsborough, NJ (US); Arjun Bharadwaj, Cupertino, CA (US); Shailesh Patil, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 125 days.

(21) Appl. No.: 16/790,375

(22) Filed: Feb. 13, 2020

(65) Prior Publication Data

US 2020/0266957 A1 Aug. 20, 2020

Related U.S. Application Data

(60) Provisional application No. 62/805,938, filed on Feb. 14, 2019.

(51) Int. Cl.
*H04L 5/00* (2006.01)
*H04W 72/10* (2009.01)
(Continued)

(52) U.S. Cl.
CPC .......... *H04L 5/0082* (2013.01); *H04L 1/0041* (2013.01); *H04L 1/0063* (2013.01);
(Continued)

(58) Field of Classification Search
CPC ... H04L 5/0082; H04L 5/0064; H04L 1/0071; H04L 1/0041; H04L 1/0089;
(Continued)

(56) References Cited

U.S. PATENT DOCUMENTS

2008/0310535 A1   12/2008   Kwon et al.
2008/0313526 A1*  12/2008   Choi .................. H04L 27/34
                                              714/780

(Continued)

FOREIGN PATENT DOCUMENTS

| EP | 3637653 A1 | 4/2020 |
| WO | WO-2018222312 A1 | 12/2018 |
| WO | WO-2018228601 A1 | 12/2018 |

OTHER PUBLICATIONS

International Search Report and Written Opinion—PCT/US2020/018361—ISAEPO—dated Jun. 9, 2020.

*Primary Examiner* — Min Jung
(74) *Attorney, Agent, or Firm* — Holland & Hart LLP

(57) ABSTRACT

Methods, systems, and devices for wireless communications are described. A first device may identify that a first set of transmission resources in a transmission time interval (TTI) has a higher priority at a second device than a second set of transmission resources in the TTI. The first device may identify that a message is to be transmitted from the first device to the second device via the TTI and process the message into a bit sequence based on the identification of the second set of transmission resources in the TTI, where the processing increases a likelihood that systematic bits of the message are received at the second device despite presence of the second set of transmission resources in the TTI. The first device may transmit the bit sequence to the second device via the TTI.

102 Claims, 20 Drawing Sheets

(51) Int. Cl.
  *H04W 4/70* (2018.01)
  *H04W 72/04* (2009.01)
  *H04L 1/00* (2006.01)
  *H04W 4/40* (2018.01)
  *H04W 76/27* (2018.01)

(52) U.S. Cl.
  CPC .......... *H04L 1/0071* (2013.01); *H04L 5/0064* (2013.01); *H04W 4/40* (2018.02); *H04W 4/70* (2018.02); *H04W 72/0446* (2013.01); *H04W 72/10* (2013.01); *H04W 76/27* (2018.02)

(58) Field of Classification Search
  CPC ... H04L 1/0045; H04L 1/0067; H04L 5/0058; H04L 1/0063; H04W 72/10; H04W 4/40; H04W 4/70; H04W 72/0046; H04W 76/27
  See application file for complete search history.

(56) References Cited

U.S. PATENT DOCUMENTS

| | | | |
|---|---|---|---|
| 2009/0276671 A1* | 11/2009 | Fang | H04L 1/1819 714/748 |
| 2010/0027704 A1* | 2/2010 | Ho | H04L 1/0041 375/267 |
| 2011/0249569 A1* | 10/2011 | Mashino | H04L 1/1893 370/242 |
| 2012/0113928 A1* | 5/2012 | Hwang | H04L 1/06 370/329 |
| 2018/0049220 A1 | 2/2018 | Patil et al. | |
| 2018/0115964 A1 | 4/2018 | Lin et al. | |
| 2018/0212628 A1 | 7/2018 | Chen et al. | |
| 2018/0351697 A1* | 12/2018 | Kim | H04W 28/04 |
| 2020/0099472 A1* | 3/2020 | Wang | H03M 13/116 |
| 2020/0351018 A1* | 11/2020 | Gulati | H04L 1/0064 |

* cited by examiner

TRANSMISSION METHODS TO HANDLE VULNERABLE SYMBOLS

CROSS REFERENCE

The present application for patent claims the benefit of U.S. Provisional Patent Application No. 62/805,938 by GULATI et al., entitled "TRANSMISSION METHODS TO HANDLE VULNERABLE SYMBOLS," filed Feb. 14, 2019, assigned to the assignee hereof, and expressly incorporated herein.

INTRODUCTION

The following relates generally to wireless communications, and more specifically at handling vulnerable symbols.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal frequency division multiple access (OFDMA), or discrete Fourier transform spread orthogonal frequency division multiplexing (DFT-S-OFDM). A wireless multiple-access communications system may include a number of base stations or network access nodes, each simultaneously supporting communication for multiple communication devices, which may be otherwise known as user equipment (UE).

In some configurations of a device-to-device wireless communications system, some symbols in a transmission time interval (TTI) may be given higher priority than other symbols in the TTI. If high priority information is transmitted in a symbol which is not considered high priority by the receiver, this may lead to significant reduction in performance for the communications.

SUMMARY

A method of wireless communication is described. The method may include determining, at a first device, that a first set of transmission resources in a TTI has a higher priority at a second device than a second set of transmission resources in the TTI and transmitting a bit sequence to the second device via the TTI, where the bit sequence is based on the first set of transmission resources in the TTI having a higher priority than the second set of transmission resources in the TTI. In some cases, the method includes identifying that a message is to be transmitted from the first device to the second device via the TTI and processing the message into the bit sequence based on the identification of the second set of transmission resources in the TTI, where the processing increases a likelihood that systematic bits of the message are received at the second device despite presence of the second set of transmission resources in the TTI.

An apparatus for wireless communication is described. The apparatus may include a processor and memory coupled to the processor. The processor and memory may be configured to determine, at a first device, that a first set of transmission resources in a TTI has a higher priority at a second device than a second set of transmission resources in the TTI and transmit the bit sequence to the second device via the TTI, where the bit sequence is based on the first set of transmission resources in the TTI having a higher priority than the second set of transmission resources in the TTI. In some cases, the processor and memory may be configured to cause the apparatus to identify that a message is to be transmitted from the first device to the second device via the TTI and process the message into the bit sequence based on the identification of the second set of transmission resources in the TTI, where the processing increases a likelihood that systematic bits of the message are received at the second device despite presence of the second set of transmission resources in the TTI.

Another apparatus for wireless communication is described. The apparatus may include means for identifying, at a first device, that a first set of transmission resources in a TTI has a higher priority at a second device than a second set of transmission resources in the TTI and transmitting the bit sequence to the second device via the TTI, where the bit sequence is based on the first set of transmission resources in the TTI having a higher priority than the second set of transmission resources in the TTI. In some cases, the apparatus may include means for identifying that a message is to be transmitted from the first device to the second device via the TTI and processing the message into the bit sequence based on the identification of the second set of transmission resources in the TTI, where the processing increases a likelihood that systematic bits of the message are received at the second device despite presence of the second set of transmission resources in the TTI.

A non-transitory computer-readable medium storing code for wireless communication is described. The code may include instructions executable by a processor to identify, at a first device, that a first set of transmission resources in a TTI has a higher priority at a second device than a second set of transmission resources in the TTI and transmit a bit sequence to the second device via the TTI, where the bit sequence is based on the first set of transmission resources in the TTI having a higher priority than the second set of transmission resources in the TTI. In some cases, the code may include instructions executable by a processor to identify that a message is to be transmitted from the first device to the second device via the TTI and process the message into the bit sequence based on the identification of the second set of transmission resources in the TTI, where the processing increases a likelihood that systematic bits of the message are received at the second device despite presence of the second set of transmission resources in the TTI.

In some examples of the method, apparatuses, and non-transitory computer-readable medium described herein, at least one of the first set of transmission resources or the second set of transmission resources may be configured.

In some examples of the method, apparatuses, and non-transitory computer-readable medium described herein, transmission resources are selected or assigned within a resource pool; and at least one of the first set of transmission resources or the second set of transmission resources are based at least in part on one or more configurations of the resource pool.

Some examples of the method, apparatuses, and non-transitory computer-readable medium described herein may further include operations, features, means, or instructions for determining that the first set of transmission resources may have a higher priority at the second device than the second set of transmission resources may be based on a RRC configuration of a resource pool that includes the first set of transmission resources and the second set of transmission resources.

In some examples of the method, apparatuses, and non-transitory computer-readable medium described herein, determining that the first set of transmission resources may have a higher priority at the second device than the second set of transmission resources may include operations, features, means, or instructions for determining that the second set of transmission resources may be more likely to be punctured at the second device than the first set of transmission resources.

Some examples of the method, apparatuses, and non-transitory computer-readable medium described herein may further include operations, features, means, or instructions for determining a number of second transmission resources within the second set of transmission resources, determining a target code rate for the bit sequence based on exclusion of the number of second transmission resources from a calculation of the target code rate, and selecting a low-density parity check (LDPC) base graph for use in processing the message into the bit sequence based on the target code rate.

In some examples of the method, apparatuses, and non-transitory computer-readable medium described herein, determining the target code rate for the bit sequence further may include operations, features, means, or instructions for determining the target code rate based on a function that includes a first input target code rate and a second input target code rate, where the first input target code rate may be based on exclusion of the number of second transmission resources from the calculation of the first input target code rate, and where the second input target code rate may be based on inclusion of the number of second transmission resources in the calculation of the second input target code rate.

In some examples of the method, apparatuses, and non-transitory computer-readable medium described herein, the function includes a weighting of the first input target code rate and the second input target code rate based on a traffic type of a message for the second device.

In some examples of the method, apparatuses, and non-transitory computer-readable medium described herein, the first input target code rate may be weighted more heavily than the second input target code rate when the traffic type may be unicast.

In some examples of the method, apparatuses, and non-transitory computer-readable medium described herein, the second input target code rate may be weighted more heavily than the first input target code rate when the traffic type may be multicast.

In some examples of the method, apparatuses, and non-transitory computer-readable medium described herein, the second input target code rate may be weighted more heavily than the first input target code rate when the traffic type may be broadcast.

Some examples of the method, apparatuses, and non-transitory computer-readable medium described herein may further include operations, features, means, or instructions for adapting the function over time based on feedback received from one or more second devices.

Some examples of the method, apparatuses, and non-transitory computer-readable medium described herein may further include operations, features, means, or instructions for generating one or more code blocks corresponding to a message for the second device, wherein each code block includes a set of systematic bits and a set of parity bits, bit-interleaving the set of systematic bits and the set of parity bits of each code block so that at least a majority of the systematic bits may be organized in a first set of columns and so that at least a majority of the parity bits may be organized in a second set of columns, and forming a first set of modulated symbols corresponding to the bit sequence based on the first set of columns and a second set of modulated symbols based on the second set of columns.

In some examples of the method, apparatuses, and non-transitory computer-readable medium described herein, bit-interleaving the set of systematic bits and the set of parity bits of each code block may include operations, features, means, or instructions for organizing the set of systematic bits and the set of parity bits in row-column manner, where a number of rows depends on a modulated symbol order of the first set of modulated symbols and the second set of modulated symbols, bit-interleaving to write the set of systematic bits and the set of parity bits column-wise within the first set of columns first, and then column-wise within the second set of columns next, and reading out the bit-interleaved set of systematic bits and set of parity bits row-wise, starting with a first column and continuing until a last column.

In some examples of the method, apparatuses, and non-transitory computer-readable medium described herein, bit-interleaving the set of systematic bits and the set of parity bits of each code block may include operations, features, means, or instructions for mapping as many as possible of the systematic bits to the first set of columns, mapping any remainder of the systematic bits to the second set of columns, and mapping the parity bits to either the first set of columns or the second set of columns after the systematic bits may be mapped.

Some examples of the method, apparatuses, and non-transitory computer-readable medium described herein may further include operations, features, means, or instructions for determining a ratio between the first set of transmission resources and the second set of transmission resources, and organizing the first set of modulated symbols and the second set of modulated symbols based on the ratio.

Some examples of the method, apparatuses, and non-transitory computer-readable medium described herein may further include operations, features, means, or instructions for organizing the first set of modulated symbols and the second set of modulated symbols may be further based on a number of code blocks used to transmit the bit sequence.

Some examples of the method, apparatuses, and non-transitory computer-readable medium described herein may further include operations, features, means, or instructions for determining that the bit sequence includes a set of code blocks that each include a set of systematic bits and a set of parity bits, determining, for each code block, a first set of coded bits and a second set of coded bits, determining a concatenated third set of coded bits by concatenating the first sets of coded bits of the set of code blocks, starting with a first code block of the set of code blocks and continuing through a last code block of the set of code blocks, determining a concatenated fourth set of coded bits by concatenating the second sets of coded bits of the set of code blocks, starting with the first code block and continuing through the last code block, and determining concatenated code block bits for transmission on the transmission resources by concatenating the concatenated third set of coded bits first, followed by the concatenated fourth set of coded bits.

Some examples of the method, apparatuses, and non-transitory computer-readable medium described herein may further include operations, features, means, or instructions for determining a ratio between the first set of transmission resources and the second set of transmission resources, and determining a size of the first set of coded bits and a size of the second set of coded bits based on the ratio.

In some examples of the method, apparatuses, and non-transitory computer-readable medium described herein, the size of the first set of coded bits and the size of the second set of coded bits may be further based on a number of code blocks corresponding to the bit sequence being transmitted.

Some examples of the method, apparatuses, and non-transitory computer-readable medium described herein may further include operations, features, means, or instructions for mapping coded bits of a message for the second device to the first set of transmission resources in the TTI before mapping to the second set of transmission resources in the TTI.

In some examples of the method, apparatuses, and non-transitory computer-readable medium described herein, the mapping of coded bits of the message may include operations, features, means, or instructions for mapping the coded bits via a frequency-first mapping, where the first set of transmission resources and the second set of transmission resources may be orthogonal frequency-division multiplexing (OFDM) symbols.

In some examples of the method, apparatuses, and non-transitory computer-readable medium described herein, the mapping of coded bits of the message may include operations, features, means, or instructions for determining that the TTI includes at least two or more slots, determining, for each of the at least two or more slots, a first subset of transmission resources that belong to the first set of transmission resources and that may be for transmitting in a corresponding slot, determining a mapping order to map the coded bits based on the first subsets of transmission resources of each slot, and mapping the coded bits based on the mapping order.

In some examples of the method, apparatuses, and non-transitory computer-readable medium described herein, determining the mapping order to map the coded bits may include operations, features, means, or instructions for mapping first to the first subset of transmission resources of a corresponding slot, starting with a first slot of the at least two or more slots and continuing through to a last slot of the at least two or more slots, and mapping next to a second subset of transmission resources of a corresponding slot, starting with the first slot and continuing through to the last slot.

In some examples of the method, apparatuses, and non-transitory computer-readable medium described herein, determining the mapping order to map the coded bits may include operations, features, means, or instructions for mapping first to the first subset of transmission resources of a corresponding slot, mapping next to a second subset of transmission resources of the corresponding slot, and mapping each slot sequentially, starting with a first slot of the at least two or more slots and continuing through to a last slot of the at least two or more slots.

In some examples of the method, apparatuses, and non-transitory computer-readable medium described herein, the first set of transmission resources includes a first set of resource elements, and where the second set of transmission resources includes a second set of resource elements.

In some examples of the method, apparatuses, and non-transitory computer-readable medium described herein, the first set of transmission resources includes a first set of orthogonal frequency-division multiplexing (OFDM) symbols, and where the second set of transmission resources includes a second set of OFDM symbols.

In some examples of the method, apparatuses, and non-transitory computer-readable medium described herein, the first device and the second device may be in communication with each other over a vehicle-to-everything (V2X) network.

In some examples of the method, apparatuses, and non-transitory computer-readable medium described herein, the first device and the second device may be in communication with each other over a device-to-device (D2D) network.)

A method of wireless communication is described. The method may include receiving, at a second device, a bit sequence from a first device in a TTI, determining that a first set of transmission resources in the TTI has a higher priority at the second device than a second set of transmission resources in the TTI, and decoding the bit sequence based on the first set of transmission resources in the TTI having a higher priority than the second set of transmission resources in the TTI.

An apparatus for wireless communication is described. The apparatus may include a processor and memory coupled to the processor. The processor and memory may be configured to receive, at a second device, a bit sequence from a first device in a TTI, determine that a first set of transmission resources in the TTI has a higher priority at the second device than a second set of transmission resources in the TTI, and decode the bit sequence based on the first set of transmission resources in the TTI having a higher priority than the second set of transmission resources in the TTI.

Another apparatus for wireless communication is described. The apparatus may include means for receiving, at a second device, a bit sequence from a first device in a TTI, determining that a first set of transmission resources in the TTI has a higher priority at the second device than a second set of transmission resources in the TTI, and decoding the bit sequence based on the first set of transmission resources in the TTI having a higher priority than the second set of transmission resources in the TTI.

A non-transitory computer-readable medium storing code for wireless communication is described. The code may include instructions executable by a processor to receive, at a second device, a bit sequence from a first device in a TTI, determine that a first set of transmission resources in the TTI has a higher priority at the second device than a second set of transmission resources in the TTI, and decode the bit sequence based on the first set of transmission resources in the TTI having a higher priority than the second set of transmission resources in the TTI.

In some examples of the method, apparatuses, and non-transitory computer-readable medium described herein, at least one of the first set of transmission resources or the second set of transmission resources may be configured.

Some examples of the method, apparatuses, and non-transitory computer-readable medium described herein may further include operations, features, means, or instructions for indicating at least one of the first set of transmission resources or the second set of transmission resources to the second device.

Some examples of the method, apparatuses, and non-transitory computer-readable medium described herein may further include operations, features, means, or instructions for determining a number of second transmission resources within the second set of transmission resources, determining a target code rate for the bit sequence based on exclusion of the number of second transmission resources from a calculation of the target code rate, and selecting a low-density parity check (LDPC) base graph for use in decoding the bit sequence based on the target code rate.

In some examples of the method, apparatuses, and non-transitory computer-readable medium described herein, determining the target code rate for the bit sequence further may include operations, features, means, or instructions for determining the target code rate based on a function that includes a first input target code rate and a second input target code rate, where the first input target code rate may be based on exclusion of the number of second transmission resources from the calculation of the first input target code rate, and where the second input target code rate may be based on inclusion of the number of second transmission resources in the calculation of the second input target code rate.

In some examples of the method, apparatuses, and non-transitory computer-readable medium described herein, the function includes a weighting of the first input target code rate and the second input target code rate based on a traffic type of a message for the second device.

In some examples of the method, apparatuses, and non-transitory computer-readable medium described herein, the first input target code rate may be weighted more heavily than the second input target code rate when the traffic type may be unicast.

In some examples of the method, apparatuses, and non-transitory computer-readable medium described herein, the second input target code rate may be weighted more heavily than the first input target code rate when the traffic type may be multicast.

In some examples of the method, apparatuses, and non-transitory computer-readable medium described herein, the second input target code rate may be weighted more heavily than the first input target code rate when the traffic type may be broadcast.

Some examples of the method, apparatuses, and non-transitory computer-readable medium described herein may further include operations, features, means, or instructions for transmitting feedback to the first device based on the decoding, and adapting the function over time based on the feedback.

Some examples of the method, apparatuses, and non-transitory computer-readable medium described herein may further include operations, features, means, or instructions for demodulating a first set of modulated symbols of the bit sequence into a first set of columns and a second set of modulated symbols of the bit sequence into a second set of columns, de-interleaving the first set of modulated symbols and the second set of modulated symbols based on a majority of a set of systematic bits of a message for the second device being organized into the first set of columns and a majority of parity bits of the message being organized into the second set of columns, and determining one or more code blocks corresponding to the message for the second device based on de-interleaving the first set of modulated symbols and the second set of modulated symbols.

In some examples of the method, apparatuses, and non-transitory computer-readable medium described herein, de-interleaving the set of systematic bits and the set of parity bits of each code block may include operations, features, means, or instructions for reading in a bit-interleaved set of systematic bits and set of parity bits row-wise, starting with a first column and continuing until a last column, and de-interleaving to write the set of systematic bits and the set of parity bits column-wise within the first set of columns first, and then column-wise within the second set of columns next, where the set of systematic bits and the set of parity bits may be organized in row-column manner, where a number of rows depends on a modulated symbol order of the first set of modulated symbols and the second set of modulated symbols.

Some examples of the method, apparatuses, and non-transitory computer-readable medium described herein may further include operations, features, means, or instructions for determining a ratio between the first set of transmission resources and the second set of transmission resources, where the first set of modulated symbols and the second set of modulated symbols may be organized based on the ratio.

In some examples of the method, apparatuses, and non-transitory computer-readable medium described herein, the first set of modulated symbols and the second set of modulated symbols may be organized based on a number of code blocks used to transmit the bit sequence.

In some examples of the method, apparatuses, and non-transitory computer-readable medium described herein, the bit sequence includes a set of concatenated code blocks that each include a set of systematic bits and a set of parity bits.

Some examples of the method, apparatuses, and non-transitory computer-readable medium described herein may further include operations, features, means, or instructions for determining a size of the first set of coded bits and a size of the second set of coded bits may be based on a ratio between the first set of transmission resources and the second set of transmission resources.

In some examples of the method, apparatuses, and non-transitory computer-readable medium described herein, the size of the first set of coded bits and the size of the second set of coded bits may be further based on a number of code blocks corresponding to the bit sequence being transmitted.

Some examples of the method, apparatuses, and non-transitory computer-readable medium described herein may further include operations, features, means, or instructions for determining coded bits of a message for the second device were mapped to the first set of transmission resources in the TTI before coded bits of the message were mapped to the second set of transmission resources in the TTI.

In some examples of the method, apparatuses, and non-transitory computer-readable medium described herein, the determining may include operations, features, means, or instructions for determining the coded bits were mapped via a frequency-first mapping, where the first set of transmission resources and the second set of transmission resources may be OFDM symbols.

In some examples of the method, apparatuses, and non-transitory computer-readable medium described herein, the determining may include operations, features, means, or instructions for determining that the TTI includes at least two or more slots, determining, for each of the at least two or more slots, a first subset of transmission resources that belong to the first set of transmission resources and that may be for transmitting in a corresponding slot, determining a mapping order of the coded bits based on the first subsets of transmission resources of each slot, and determining the coded bits based on the mapping order.

In some examples of the method, apparatuses, and non-transitory computer-readable medium described herein, determining the mapping order for mapping of the coded bits may include operations, features, means, or instructions for determining the transmitter first mapped the coded bits to the first subset of transmission resources of a corresponding slot, starting with a first slot of the at least two or more slots and continuing through to a last slot of the at least two or more slots, and determining the transmitter next mapped the coded bits to a second subset of transmission resources of a corresponding slot, starting with the first slot and continuing through to the last slot.

In some examples of the method, apparatuses, and non-transitory computer-readable medium described herein, determining the mapping order for mapping of the coded bits may include operations, features, means, or instructions for determining the transmitter first mapped the coded bits to the first subset of transmission resources of a corresponding slot, determining the transmitter next mapped the coded bits to a second subset of transmission resources of the corresponding slot, and determining the transmitter then mapped the coded bits to each slot sequentially, starting with a first slot of the at least two or more slots and continuing through to a last slot of the at least two or more slots.

In some examples of the method, apparatuses, and non-transitory computer-readable medium described herein, the first set of transmission resources includes a first set of resource elements, and where the second set of transmission resources includes a second set of resource elements.

In some examples of the method, apparatuses, and non-transitory computer-readable medium described herein, the first set of transmission resources includes a first set of OFDM symbols, and where the second set of transmission resources includes a second set of OFDM symbols.

In some examples of the method, apparatuses, and non-transitory computer-readable medium described herein, the first device and the second device may be in communication with each other over a V2X network.

In some examples of the method, apparatuses, and non-transitory computer-readable medium described herein, the first device and the second device may be in communication with each other over a D2D network.

DETAILED DESCRIPTION

Figure 1:
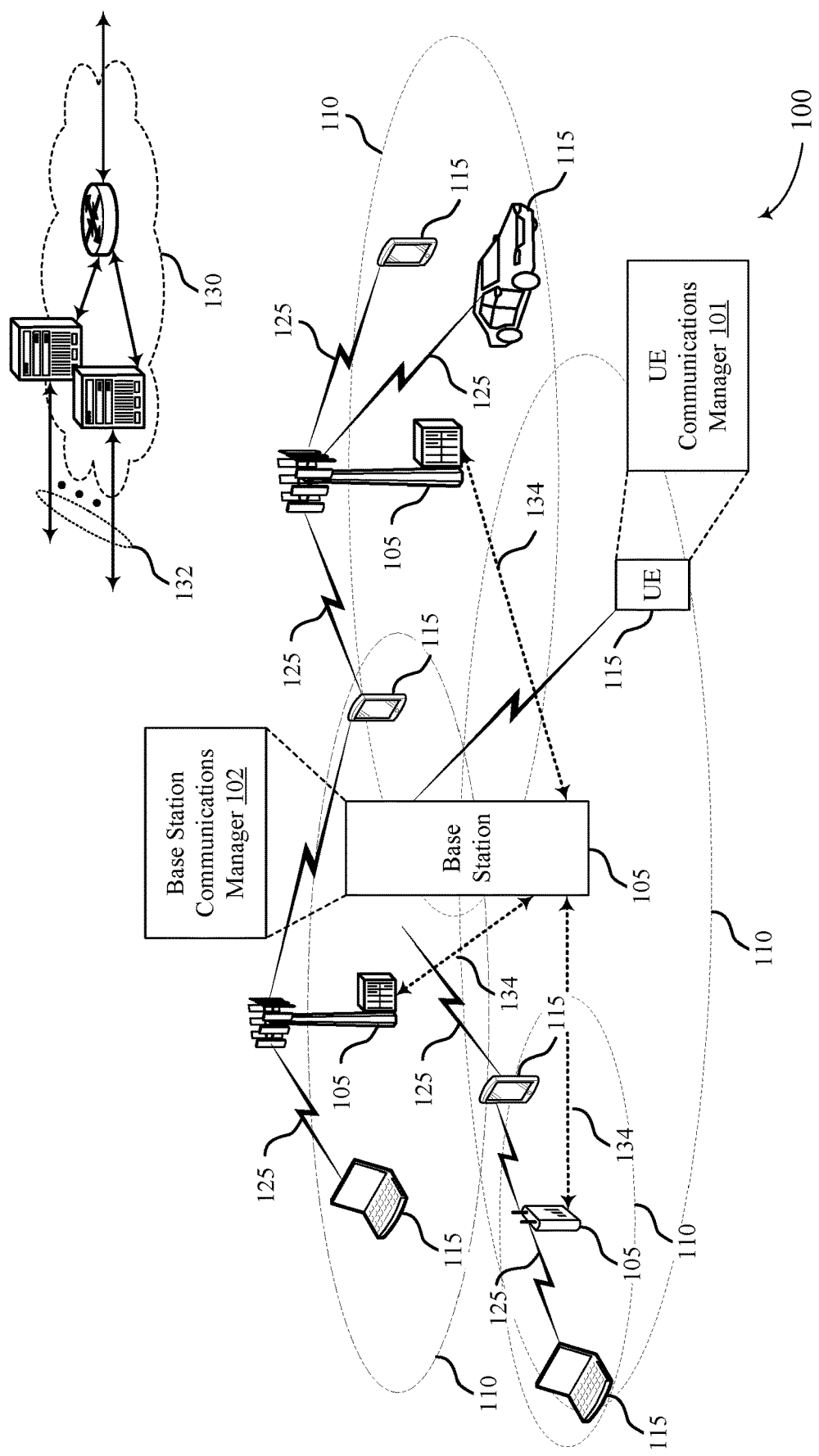
FIG. 1 illustrates an example of a system for wireless communications that supports transmission methods to handle vulnerable symbols in accordance with aspects of the present disclosure.

Some wireless communications may support sidelink communications, device-to-device communications, vehicle-to-vehicle communications, vehicle-to-everything communications, etc. For example, one or more devices, such as UEs, may transmit to a receiving device, which may also be an example of a UE. There may be some scenarios in these wireless communications systems which lead to lost or unsuccessfully received symbols at the receiving device. For example, a first device (e.g., a transmitting device) may transmit in a first TTI (e.g., a slot, a mini-slot, etc.) to a second device (e.g., a receiving device), and the receiving device may not successfully receive at least one symbol of the TTI. In some cases, some symbols of a TTI may be more susceptible to being unsuccessfully received than other symbols. Or, some symbols may be more likely to be received correctly at the receiving device than other symbols. In some cases, symbols which are more likely to be received correctly may be referred to as non-vulnerable symbols, more reliable symbols, or higher priority symbols, where symbols which are less likely to be received correctly may be referred to as vulnerable symbols, less reliable symbols, or lower priority symbols. In some cases, a symbol may be more likely to be received correctly if it does not overlap with or fall within a time used for automatic gain control (AGC) retraining, transmitter/receiver retuning, half duplex constraints (e.g., the receiving UE is to transmit feedback on that symbol), or any combination thereof. If a symbol does overlap with any one or more of those events or factors, that symbol may be lost, punctured, or unsuccessfully received at the receiver.

In some cases, puncturing symbols at the receiver may lead to large error or a significant performance degradation. For some scenarios in the event of bit puncturing, there may be a loss approximately proportional to the number of punctured symbols over the total number of symbols. In some cases, however, greater error or significant performance degradation may occur based on coding, resource element (RE) mapping, and other factors. Therefore, devices described herein, such as UEs, vehicles, or any other device, may implement techniques to improve handling of less reliable symbols and provide robustness for potential symbol puncturing at the receiver.

Devices may implement techniques to map higher priority coded bits to symbols which are more likely to be successfully received by the receiver. An example of a higher priority bit may include systematic bits, while an example of a lower priority bit may include parity bits. For example, a transmitting device may avoid mapping coded bits with higher priority to less reliable or vulnerable symbols. In one or more examples, the transmitting device may implement techniques to improve reliability during low density parity check (LDPC) base graph selection, bit interleaving, code block concatenation, virtual resource block (VRB) mapping, or any combination thereof.

Aspects of the disclosure are initially described in the context of a wireless communications system. Aspects of the disclosure are further illustrated by and described with reference to apparatus diagrams, system diagrams, and flowcharts that relate to transmission methods to handle vulnerable symbols.

FIG. 1 illustrates an example of a wireless communications system 100 that supports transmission methods to handle vulnerable symbols in accordance with aspects of the present disclosure. The wireless communications system 100 includes base stations 105, UEs 115, and a core network 130. In some examples, the wireless communications system 100 may be a Long Term Evolution (LTE) network, an LTE-Advanced (LTE-A) network, an LTE-A Pro network, or a New Radio (NR) network. In some cases, wireless communications system 100 may support enhanced broadband communications, ultra-reliable (e.g., mission critical) communications, low latency communications, or communications with low-cost and low-complexity devices.

Base stations 105 may wirelessly communicate with UEs 115 via one or more base station antennas. Base stations 105 described herein may include or may be referred to by those skilled in the art as a base transceiver station, a radio base station, an access point, a radio transceiver, a NodeB, an eNodeB (eNB), a next-generation NodeB or giga-NodeB (either of which may be referred to as a gNB), a Home NodeB, a Home eNodeB, or some other suitable terminology. Wireless communications system 100 may include base stations 105 of different types (e.g., macro or small cell base stations). The UEs 115 described herein may be able to communicate with various types of base stations 105 and network equipment including macro eNBs, small cell eNBs, gNBs, relay base stations, and the like.

Each base station 105 may be associated with a particular geographic coverage area 110 in which communications with various UEs 115 is supported. Each base station 105 may provide communication coverage for a respective geographic coverage area 110 via communication links 125, and communication links 125 between a base station 105 and a UE 115 may utilize one or more carriers. Communication links 125 shown in wireless communications system 100 may include uplink transmissions from a UE 115 to a base station 105, or downlink transmissions from a base station 105 to a UE 115. Downlink transmissions may also be called forward link transmissions while uplink transmissions may also be called reverse link transmissions.

The geographic coverage area 110 for a base station 105 may be divided into sectors making up a portion of the geographic coverage area 110, and each sector may be associated with a cell. For example, each base station 105 may provide communication coverage for a macro cell, a small cell, a hot spot, or other types of cells, or various combinations thereof. In some examples, a base station 105 may be movable and therefore provide communication coverage for a moving geographic coverage area 110. In some examples, different geographic coverage areas 110 associated with different technologies may overlap, and overlapping geographic coverage areas 110 associated with different technologies may be supported by the same base station 105 or by different base stations 105. The wireless communications system 100 may include, for example, a heterogeneous LTE/LTE-A/LTE-A Pro or NR network in which different types of base stations 105 provide coverage for various geographic coverage areas 110.

The term "cell" refers to a logical communication entity used for communication with a base station 105 (e.g., over a carrier), and may be associated with an identifier for distinguishing neighboring cells (e.g., a physical cell identifier (PCID), a virtual cell identifier (VCID)) operating via the same or a different carrier. In some examples, a carrier may support multiple cells, and different cells may be configured according to different protocol types (e.g., machine-type communication (MTC), narrowband Internet-of-Things (NB-IoT), enhanced mobile broadband (eMBB), or others) that may provide access for different types of devices. In some cases, the term "cell" may refer to a portion of a geographic coverage area 110 (e.g., a sector) over which the logical entity operates.

UEs 115 may be dispersed throughout the wireless communications system 100, and each UE 115 may be stationary or mobile. A UE 115 may also be referred to as a mobile device, a wireless device, a remote device, a handheld device, or a subscriber device, or some other suitable terminology, where the "device" may also be referred to as a unit, a station, a terminal, or a client. A UE 115 may also be a personal electronic device such as a cellular phone, a personal digital assistant (PDA), a tablet computer, a laptop computer, or a personal computer. In some examples, a UE 115 may also refer to a wireless local loop (WLL) station, an Internet of Things (IoT) device, an Internet of Everything (IoE) device, or an MTC device, or the like, which may be implemented in various articles such as appliances, vehicles, meters, or the like.

Some UEs 115, such as MTC or IoT devices, may be low cost or low complexity devices, and may provide for automated communication between machines (e.g., via Machine-to-Machine (M2M) communication). M2M communication or MTC may refer to data communication technologies that allow devices to communicate with one another or a base station 105 without human intervention. In some examples, M2M communication or MTC may include communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

Some UEs 115 may be configured to employ operating modes that reduce power consumption, such as half-duplex communications (e.g., a mode that supports one-way communication via transmission or reception, but not transmission and reception simultaneously). In some examples half-duplex communications may be performed at a reduced peak rate. Other power conservation techniques for UEs 115 include entering a power saving "deep sleep" mode when not engaging in active communications, or operating over a limited bandwidth (e.g., according to narrowband communications). In some cases, UEs 115 may be designed to support critical functions (e.g., mission critical functions), and a wireless communications system 100 may be configured to provide ultra-reliable communications for these functions.

In some cases, a UE 115 may also be able to communicate directly with other UEs 115 (e.g., using a peer-to-peer (P2P) or device-to-device (D2D) protocol). One or more of a group of UEs 115 utilizing D2D communications may be within the geographic coverage area 110 of a base station 105. Other UEs 115 in such a group may be outside the geographic coverage area 110 of a base station 105, or be otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out between UEs 115 without the involvement of a base station 105.

Base stations 105 may communicate with the core network 130 and with one another. For example, base stations 105 may interface with the core network 130 through backhaul links 132 (e.g., via an S1, N2, N3, or other interface). Base stations 105 may communicate with one another over backhaul links 134 (e.g., via an X2, Xn, or other interface) either directly (e.g., directly between base stations 105) or indirectly (e.g., via core network 130).

The core network 130 may provide user authentication, access authorization, tracking, Internet Protocol (IP) connectivity, and other access, routing, or mobility functions. The core network 130 may be an evolved packet core (EPC), which may include at least one mobility management entity (MME), at least one serving gateway (S-GW), and at least one Packet Data Network (PDN) gateway (P-GW). The MME may manage non-access stratum (e.g., control plane) functions such as mobility, authentication, and bearer management for UEs 115 served by base stations 105 associated with the EPC. User IP packets may be transferred through the S-GW, which itself may be connected to the P-GW. The P-GW may provide IP address allocation as well as other functions. The P-GW may be connected to the network operators IP services. The operators IP services may include access to the Internet, Intranet(s), an IP Multimedia Subsystem (IMS), or a Packet-Switched (PS) Streaming Service.

At least some of the network devices, such as a base station 105, may include subcomponents such as an access network entity, which may be an example of an access node controller (ANC). Each access network entity may communicate with UEs 115 through a number of other access network transmission entities, which may be referred to as a radio head, a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate using one or more frequency bands, typically in the range of 300 megahertz (MHz) to 300 gigahertz (GHz). Generally, the region from 300 MHz to 3 GHz is known as the ultra-high frequency (UHF) region or decimeter band, since the wavelengths range from approximately one decimeter to one meter in length. UHF waves may be blocked or redirected by buildings and environmental features. However, the waves may penetrate structures sufficiently for a macro cell to provide service to UEs 115 located indoors. Transmission of UHF waves may be associated with smaller antennas and shorter range (e.g., less than 100 km) compared to transmission using the smaller frequencies and longer waves of the high frequency (HF) or very high frequency (VHF) portion of the spectrum below 300 MHz.

Wireless communications system 100 may also operate in a super high frequency (SHF) region using frequency bands from 3 GHz to 30 GHz, also known as the centimeter band. The SHF region includes bands such as the 5 GHz industrial, scientific, and medical (ISM) bands, which may be used opportunistically by devices that may be capable of tolerating interference from other users.

Wireless communications system 100 may also operate in an extremely high frequency (EHF) region of the spectrum (e.g., from 30 GHz to 300 GHz), also known as the millimeter band. In some examples, wireless communications system 100 may support millimeter wave (mmW) communications between UEs 115 and base stations 105, and EHF antennas of the respective devices may be even smaller and more closely spaced than UHF antennas. In some cases, this may facilitate use of antenna arrays within a UE 115. However, the propagation of EHF transmissions may be subject to even greater atmospheric attenuation and shorter range than SHF or UHF transmissions. Techniques disclosed herein may be employed across transmissions that use one or more different frequency regions, and designated use of bands across these frequency regions may differ by country or regulating body.

In some cases, wireless communications system 100 may utilize both licensed and unlicensed radio frequency spectrum bands. For example, wireless communications system 100 may employ License Assisted Access (LAA), LTE-Unlicensed (LTE-U) radio access technology, or NR technology in an unlicensed band such as the 5 GHz ISM band. When operating in unlicensed radio frequency spectrum bands, wireless devices such as base stations 105 and UEs 115 may employ listen-before-talk (LBT) procedures to ensure a frequency channel is clear before transmitting data. In some cases, operations in unlicensed bands may be based on a carrier aggregation configuration in conjunction with component carriers operating in a licensed band (e.g., LAA). Operations in unlicensed spectrum may include downlink transmissions, uplink transmissions, peer-to-peer transmissions, or a combination of these. Duplexing in unlicensed spectrum may be based on frequency division duplexing (FDD), time division duplexing (TDD), or a combination of both.

In some examples, base station 105 or UE 115 may be equipped with multiple antennas, which may be used to employ techniques such as transmit diversity, receive diversity, multiple-input multiple-output (MIMO) communications, or beamforming. For example, wireless communications system 100 may use a transmission scheme between a transmitting device (e.g., a base station 105) and a receiving device (e.g., a UE 115), where the transmitting device is equipped with multiple antennas and the receiving device is equipped with one or more antennas. MIMO communications may employ multipath signal propagation to increase the spectral efficiency by transmitting or receiving multiple signals via different spatial layers, which may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream, and may carry bits associated with the same data stream (e.g., the same codeword) or different data streams. Different spatial layers may be associated with different antenna ports used for channel measurement and reporting. MIMO techniques include single-user MIMO (SU-MIMO) where multiple spatial layers are transmitted to the same receiving device, and multiple-user MIMO (MU-MIMO) where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105 or a UE 115) to shape or steer an antenna beam (e.g., a transmit beam or receive beam) along a spatial path between the transmitting device and the receiving device. Beamforming may be achieved by combining the signals communicated via antenna elements of an antenna array such that signals propagating at particular orientations with respect to an antenna array experience constructive interference while others experience destructive interference. The adjustment of signals communicated via the antenna elements may include a transmitting device or a receiving device applying certain amplitude and phase offsets to signals carried via each of the antenna elements associated with the device. The adjustments associated with each of the antenna elements may be defined by a beamforming weight set associated with a particular orientation (e.g., with respect to the antenna array of the transmitting device or receiving device, or with respect to some other orientation).

In one example, a base station 105 may use multiple antennas or antenna arrays to conduct beamforming operations for directional communications with a UE 115. For instance, some signals (e.g. synchronization signals, reference signals, beam selection signals, or other control signals) may be transmitted by a base station 105 multiple times in different directions, which may include a signal being transmitted according to different beamforming weight sets associated with different directions of transmission. Transmissions in different beam directions may be used to identify (e.g., by the base station 105 or a receiving device, such as a UE 115) a beam direction for subsequent transmission and/or reception by the base station 105.

Some signals, such as data signals associated with a particular receiving device, may be transmitted by a base station 105 in a single beam direction (e.g., a direction associated with the receiving device, such as a UE 115). In some examples, the beam direction associated with transmissions along a single beam direction may be determined based at least in in part on a signal that was transmitted in different beam directions. For example, a UE 115 may receive one or more of the signals transmitted by the base station 105 in different directions, and the UE 115 may report to the base station 105 an indication of the signal it received with a highest signal quality, or an otherwise acceptable signal quality. Although these techniques are described with reference to signals transmitted in one or more directions by a base station 105, a UE 115 may employ similar techniques for transmitting signals multiple times in different directions (e.g., for identifying a beam direction for subsequent transmission or reception by the UE 115), or transmitting a signal in a single direction (e.g., for transmitting data to a receiving device).

A receiving device (e.g., a UE 115, which may be an example of a mmW receiving device) may try multiple receive beams when receiving various signals from the base station 105, such as synchronization signals, reference signals, beam selection signals, or other control signals. For example, a receiving device may try multiple receive directions by receiving via different antenna subarrays, by processing received signals according to different antenna subarrays, by receiving according to different receive beamforming weight sets applied to signals received at a plurality of antenna elements of an antenna array, or by processing received signals according to different receive beamforming weight sets applied to signals received at a plurality of antenna elements of an antenna array, any of which may be referred to as "listening" according to different receive beams or receive directions. In some examples a receiving device may use a single receive beam to receive along a single beam direction (e.g., when receiving a data signal). The single receive beam may be aligned in a beam direction determined based at least in part on listening according to different receive beam directions (e.g., a beam direction determined to have a highest signal strength, highest signal-to-noise ratio, or otherwise acceptable signal quality based at least in part on listening according to multiple beam directions).

In some cases, the antennas of a base station 105 or UE 115 may be located within one or more antenna arrays, which may support MIMO operations, or transmit or receive beamforming. For example, one or more base station antennas or antenna arrays may be co-located at an antenna assembly, such as an antenna tower. In some cases, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may perform packet segmentation and reassembly to communicate over logical channels. A Medium Access Control (MAC) layer may perform priority handling and multiplexing of logical channels into transport channels. The MAC layer may also use hybrid automatic repeat request (HARQ) to provide retransmission at the MAC layer to improve link efficiency. In the control plane, the Radio Resource Control (RRC) protocol layer may provide establishment, configuration, and maintenance of an RRC connection between a UE 115 and a base station 105 or core network 130 supporting radio bearers for user plane data. At the Physical layer, transport channels may be mapped to physical channels.

In some cases, UEs 115 and base stations 105 may support retransmissions of data to increase the likelihood that data is received successfully. HARQ feedback is one technique of increasing the likelihood that data is received correctly over a communication link 125. HARQ may include a combination of error detection (e.g., using a cyclic redundancy check (CRC)), forward error correction (FEC), and retransmission (e.g., automatic repeat request (ARQ)). HARQ may improve throughput at the MAC layer in poor radio conditions (e.g., signal-to-noise conditions). In some cases, a wireless device may support same-slot HARQ feedback, where the device may provide HARQ feedback in a specific slot for data received in a previous symbol in the slot. In other cases, the device may provide HARQ feedback in a subsequent slot, or according to some other time interval.

Time intervals in LTE or NR may be expressed in multiples of a basic time unit, which may, for example, refer to a sampling period of $T_s=1/30,720,000$ seconds. Time intervals of a communications resource may be organized according to radio frames each having a duration of 10 milliseconds (ms), where the frame period may be expressed as $T_f=307,200$ $T_s$. The radio frames may be identified by a system frame number (SFN) ranging from 0 to 1023. Each frame may include 10 subframes numbered from 0 to 9, and each subframe may have a duration of 1 ms. A subframe may be further divided into 2 slots each having a duration of 0.5 ms, and each slot may contain 6 or 7 modulation symbol periods (e.g., depending on the length of the cyclic prefix prepended to each symbol period). Excluding the cyclic prefix, each symbol period may contain 2048 sampling periods. In some cases, a subframe may be the smallest scheduling unit of the wireless communications system 100, and may be referred to as a transmission time interval (TTI). In other cases, a smallest scheduling unit of the wireless communications system 100 may be shorter than a subframe or may be dynamically selected (e.g., in bursts of shortened TTIs (sTTIs) or in selected component carriers using sTTIs).

In some wireless communications systems, a slot may further be divided into multiple mini-slots containing one or more symbols. In some instances, a symbol of a mini-slot or a mini-slot may be the smallest unit of scheduling. Each symbol may vary in duration depending on the subcarrier spacing or frequency band of operation, for example. Further, some wireless communications systems may implement slot aggregation in which multiple slots or mini-slots are aggregated together and used for communication between a UE 115 and a base station 105.

The term "carrier" refers to a set of radio frequency spectrum resources having a defined physical layer structure for supporting communications over a communication link 125. For example, a carrier of a communication link 125 may include a portion of a radio frequency spectrum band that is operated according to physical layer channels for a given radio access technology. Each physical layer channel may carry user data, control information, or other signaling. A carrier may be associated with a pre-defined frequency channel (e.g., an evolved universal mobile telecommunication system terrestrial radio access (E-UTRA) absolute radio frequency channel number (EARFCN)), and may be positioned according to a channel raster for discovery by UEs 115. Carriers may be downlink or uplink (e.g., in an FDD mode), or be configured to carry downlink and uplink communications (e.g., in a TDD mode). In some examples, signal waveforms transmitted over a carrier may be made up of multiple sub-carriers (e.g., using multi-carrier modulation (MCM) techniques such as orthogonal frequency division multiplexing (OFDM) or discrete Fourier transform spread OFDM (DFT-S-OFDM)).

The organizational structure of the carriers may be different for different radio access technologies (e.g., LTE, LTE-A, LTE-A Pro, NR). For example, communications over a carrier may be organized according to TTIs or slots, each of which may include user data as well as control information or signaling to support decoding the user data. A carrier may also include dedicated acquisition signaling (e.g., synchronization signals or system information, etc.) and control signaling that coordinates operation for the carrier. In some examples (e.g., in a carrier aggregation configuration), a carrier may also have acquisition signaling or control signaling that coordinates operations for other carriers.

Physical channels may be multiplexed on a carrier according to various techniques. A physical control channel and a physical data channel may be multiplexed on a downlink carrier, for example, using time division multiplexing (TDM) techniques, frequency division multiplexing (FDM) techniques, or hybrid TDM-FDM techniques. In some examples, control information transmitted in a physical control channel may be distributed between different control regions in a cascaded manner (e.g., between a common control region or common search space and one or more UE-specific control regions or UE-specific search spaces).

A carrier may be associated with a particular bandwidth of the radio frequency spectrum, and in some examples the carrier bandwidth may be referred to as a "system bandwidth" of the carrier or the wireless communications system 100. For example, the carrier bandwidth may be one of a number of predetermined bandwidths for carriers of a particular radio access technology (e.g., 1.4, 3, 5, 10, 15, 20, 40, or 80 MHz). In some examples, each served UE 115 may be configured for operating over portions or all of the carrier bandwidth. In other examples, some UEs 115 may be configured for operation using a narrowband protocol type that is associated with a predefined portion or range (e.g., set of subcarriers or RBs) within a carrier (e.g., "in-band" deployment of a narrowband protocol type).

In a system employing MCM techniques, a resource element may consist of one symbol period (e.g., a duration of one modulation symbol) and one subcarrier, where the symbol period and subcarrier spacing are inversely related. The number of bits carried by each resource element may depend on the modulation scheme (e.g., the order of the modulation scheme). Thus, the more resource elements that a UE 115 receives and the higher the order of the modulation scheme, the higher the data rate may be for the UE 115. In MIMO systems, a wireless communications resource may refer to a combination of a radio frequency spectrum resource, a time resource, and a spatial resource (e.g., spatial layers), and the use of multiple spatial layers may further increase the data rate for communications with a UE 115.

Devices of the wireless communications system 100 (e.g., base stations 105 or UEs 115) may have a hardware configuration that supports communications over a particular carrier bandwidth, or may be configurable to support communications over one of a set of carrier bandwidths. In some examples, the wireless communications system 100 may include base stations 105 and/or UEs 115 that support simultaneous communications via carriers associated with more than one different carrier bandwidth.

Wireless communications system 100 may support communication with a UE 115 on multiple cells or carriers, a feature which may be referred to as carrier aggregation or multi-carrier operation. A UE 115 may be configured with multiple downlink component carriers and one or more uplink component carriers according to a carrier aggregation configuration. Carrier aggregation may be used with both FDD and TDD component carriers.

In some cases, wireless communications system 100 may utilize enhanced component carriers (eCCs). An eCC may be characterized by one or more features including wider carrier or frequency channel bandwidth, shorter symbol duration, shorter TTI duration, or modified control channel configuration. In some cases, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (e.g., where more than one operator is allowed to use the spectrum). An eCC characterized by wide carrier bandwidth may include one or more segments that may be utilized by UEs 115 that are not capable of monitoring the whole carrier bandwidth or are otherwise configured to use a limited carrier bandwidth (e.g., to conserve power).

In some cases, an eCC may utilize a different symbol duration than other component carriers, which may include use of a reduced symbol duration as compared with symbol durations of the other component carriers. A shorter symbol duration may be associated with increased spacing between adjacent subcarriers. A device, such as a UE 115 or base station 105, utilizing eCCs may transmit wideband signals (e.g., according to frequency channel or carrier bandwidths of 20, 40, 60, 80 MHz, etc.) at reduced symbol durations (e.g., 16.67 microseconds). A TTI in eCC may consist of one or multiple symbol periods. In some cases, the TTI duration (that is, the number of symbol periods in a TTI) may be variable.

Wireless communications system 100 may be an NR system that may utilize any combination of licensed, shared, and unlicensed spectrum bands, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across the frequency domain) and horizontal (e.g., across the time domain) sharing of resources.

Devices, such as UEs 115 or other wireless devices that may operate in a device-to-device or vehicle-to-everything wireless communications system, may implement techniques to map higher priority coded bits to symbols which are more likely to be successfully received by the receiver. An example of a higher priority bit may include systematic bits, while an example of a lower priority bit may include parity bits. For example, a first device (e.g., transmitting the bits) may avoid mapping coded bits with higher priority to less reliable, lower priority, or vulnerable symbols. The device may implement techniques to improve reliability during LDPC base graph selection, bit interleaving, code block concatenation, VRB mapping, or any combination thereof.

Specifically, a first device may determine that a first set of transmission resources in a TTI has a higher priority at a second device than a second set of transmission resources in the TTI and transmit a bit sequence to the second device via the TTI, where the bit sequence is based on the first set of transmission resources in the TTI having a higher priority than the second set of transmission resources in the TTI. One or more of these operations may be performed by a UE communications manager 101, which may be an example of a communications manager 1015, 1115, 1205, or 1310 as described with reference to FIGS. 10 through 13. Additionally, or alternatively, these techniques may be performed by a base station communications manager 102. In some cases, a transceiver may perform the transmitting operations and a transmission resources component may determine the first set of transmission resources has the higher priority at the second device than the second set of transmission resources.

Correspondingly, a second device may receive a bit sequence from a first device in a TTI, determine that a first set of transmission resources in the TTI has a higher priority at the second device than a second set of transmission resources in the TTI, and decode the bit sequence based on the first set of transmission resources in the TTI having a higher priority than the second set of transmission resources in the TTI. One or more of these operations may be performed by a UE communications manager 101, which may be an example of a communications manager 1015, 1115, 1205, or 1310 as described with reference to FIGS. 10 through 13. Additionally, or alternatively, these techniques may be performed by a base station communications manager 102. In some cases, a transceiver may perform the receiving operations, a scheduler may determine the configuration, and an bit sequence decoding component may decode the bit sequence based on the priorities of the transmission resources.

Figure 2:
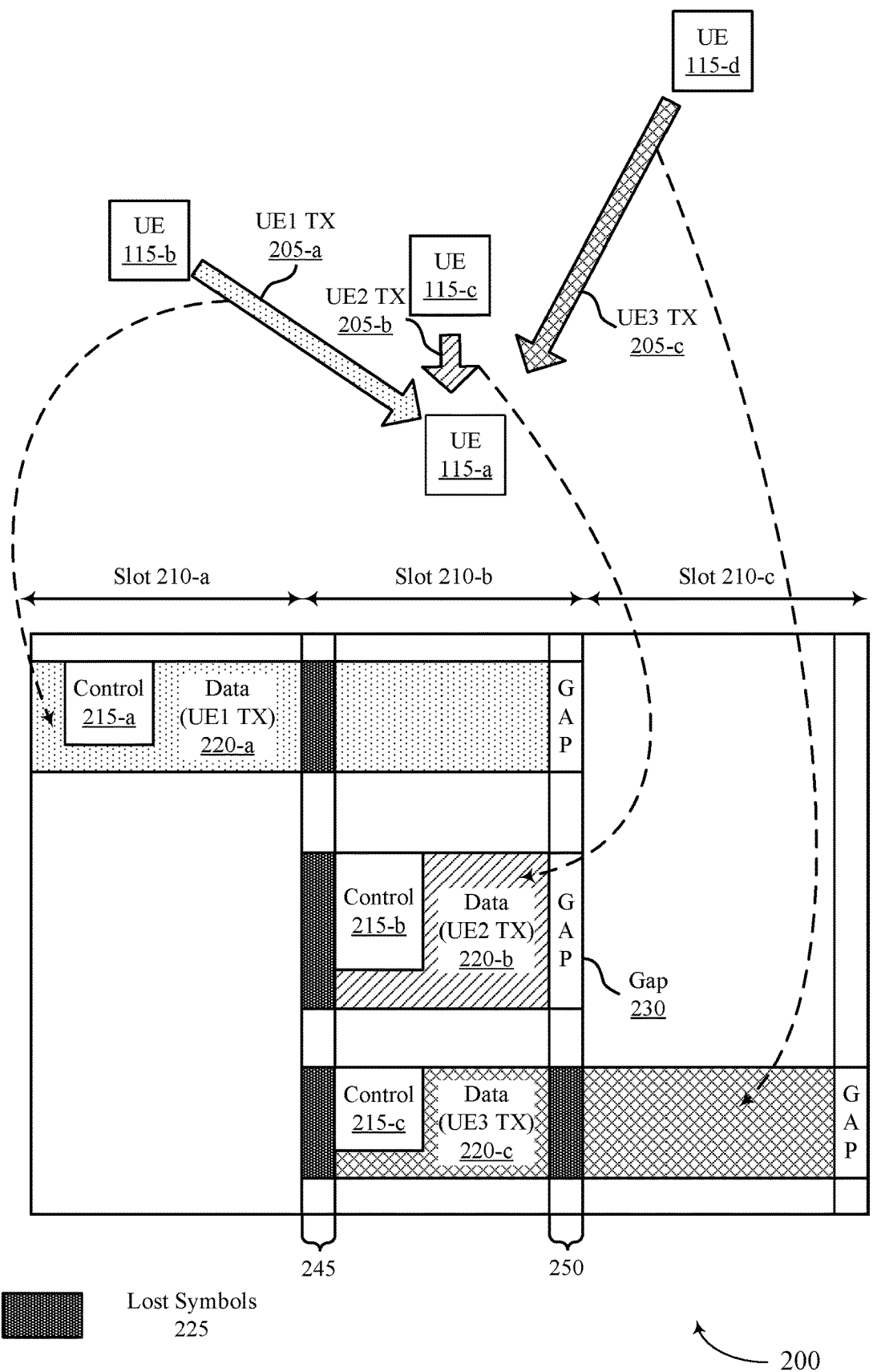
FIG. 2 illustrates an example of a wireless communications system that supports transmission methods to handle vulnerable symbols in accordance with aspects of the present disclosure.

FIG. 2 illustrates an example of a wireless communications system 200 that supports transmission methods to handle vulnerable symbols in accordance with aspects of the present disclosure. In some examples, wireless communications system 200 may implement aspects of wireless communication system 100 and may include UE 115-a, UE 115-b, UE 115-c, and UE 115-d, which may be examples of a UE 115 described with reference to FIG. 1. These techniques may be applied by other wireless devices, such as vehicles, mobile devices, access points, base stations 105, or any other device which can be used in a device-to-device, vehicle-to-vehicle, vehicle-to-anything (e.g., vehicle-to-X (V2X)), car-to-X, or vehicle-to-computer communications system (among others). In some cases, the techniques described herein relate to sidelink wireless communications, such as between devices of a V2X or D2D wireless communications system. However, these techniques may also be applicable for communications between other devices and transmission and reception points, such as communications between a UE 115 and a base station 105.

UE 115-b, UE 115-c, and UE 115-d may each transmit to UE 115-a. For example, UE 115-b may send UE1 transmission 205-a, UE 115-c may send UE2 transmission 205-b, and UE 115-d may send UE3 transmission 205-c. In some cases, the UEs 115 may be mobile devices which can move and communicate at the same time. Therefore, the distances between the UEs 115 may vary based on the movements of the UEs 115. In an example shown, UE 115-c may be very close to UE 115-a while UE 115-b and UE 115-d are farther away.

There may be some scenarios in a device-to-device or vehicle-to-everything wireless communications system which lead to lost symbols at a receiver. In some cases, some symbols may be more susceptible to being lost than other symbols. Or, some symbols may be more likely to be received correctly at the receiving device than other symbols. Symbols which are more likely to be received correctly may be referred to as non-vulnerable symbols, where symbols which are less likely to be received correctly may be referred to as vulnerable symbols. In some cases, a symbol may be more likely to be received correctly if it does not overlap with or fall within a time used for automatic gain control (AGC) retraining, transmitter/receiver retuning, half duplex constraints (e.g., the receiving UE 115 is to transmit an ACK/NACK on that symbol), or any combination thereof. If a symbol does overlap with any one or more of those events or factors, that symbol may be lost, or punctured, at the receiver.

In some cases, the transmitting device may determine which resources are considered higher priority or lower priority based on a resource pool. For example, the transmitting device may identify that the non-vulnerable, or more reliable, symbols have a higher priority at the receiving device than the vulnerable, or less reliable, symbols based on an RRC configuration of a resource pool. The resource pool may include a first set of transmission resources (e.g., the non-vulnerable or more reliable symbols) and a second set of transmission resources (e.g., the vulnerable or less reliable symbols).

In some cases, puncturing symbols at the receiver may lead to large error or a significant performance degradation. In some scenarios in the event of bit puncturing, there may be a loss approximately proportional to the number of punctured symbols over the total number of symbols. In some cases, however, greater error or significant performance degradation may occur based on coding, RE mapping, and other factors.

In an example, UE 115-b begins UE1 transmission 205-a at the beginning of slot 210-a. UE1 transmission 205-a may include control signaling 215-a and UE1 data transmission 220-a. At 245, at the first symbol of slot 215-b, UE 115-c may begin UE2 transmission 205-b, and UE 115-d may begin UE3 transmission 205-c. UE 115-c may be much closer to the receiver (e.g., UE 115-a) than UE 115-b. This may lead to a greatly different received power level and LNA saturation at UE 115-a. To account for the new received power level, UE 115-a may perform AGC retraining and set an LNA gain based on the new received power level during the first symbol of slot 210-b. Performing the AGC retraining and setting the new LNA gain may cause UE 115-a to lose or puncture the first symbol of slot 210-b. This may result in a lost symbol 225 at UE 115-a in the first symbol of slot 210-b for UE1 transmission 205-a, UE2 transmission 205-b, and UE3 transmission 205-c.

Similarly, when UE 115-c stops its transmission for slot 210-c at 250, this may lead to a much lower received power in slot 210-c and last symbol of 210-b. UE 115-a may again perform AGC retraining in the last symbol of slot 210-b (e.g., which may correspond to a gap 230 for UE2 transmission 205-b) to reduce quantization noise when receiving UE2 transmission 205-b. This may lead to a lost symbol 225 for the last symbol of slot 210-b of UE3 transmission 205-c.

As described, symbol puncturing or loss at the receiver may lead to performance degradation. Therefore, devices described herein, such as UEs 115-a, 115-b, 115-c, and 115-d, may implement techniques to improve handling of vulnerable symbol and provide robustness for potential symbol puncturing at the receiver.

Generally, devices may implement techniques to map high priority coded bits to symbols which are more likely to be successfully received by the receiver. For example, a transmitting device may avoid mapping coded bits with higher importance to vulnerable or susceptible symbols. These techniques may be applied during LDPC base graph selection, bit interleaving, code block concatenation, VRB mapping, or any combination thereof.

Some examples described herein relate to cases where a subset of symbols are vulnerable (e.g., due to AGC retraining, etc.). However, the techniques may be applicable to any situation where certain resource elements are more vulnerable (e.g., considered lower priority by the receiver) than other resource elements within a TTI. This may occur when a reference signal is present in certain symbols vs relying on time interpolation of a channel. In very high speeds with insufficient time-density of demodulation reference signals, not all of the resource elements may be of equal quality. Or in some cases, these techniques may be application in ultra-reliable low latency communications (URLLC) due to puncturing or interference of URLLC traffic, among other cases, situations, or examples.

Figure 3:
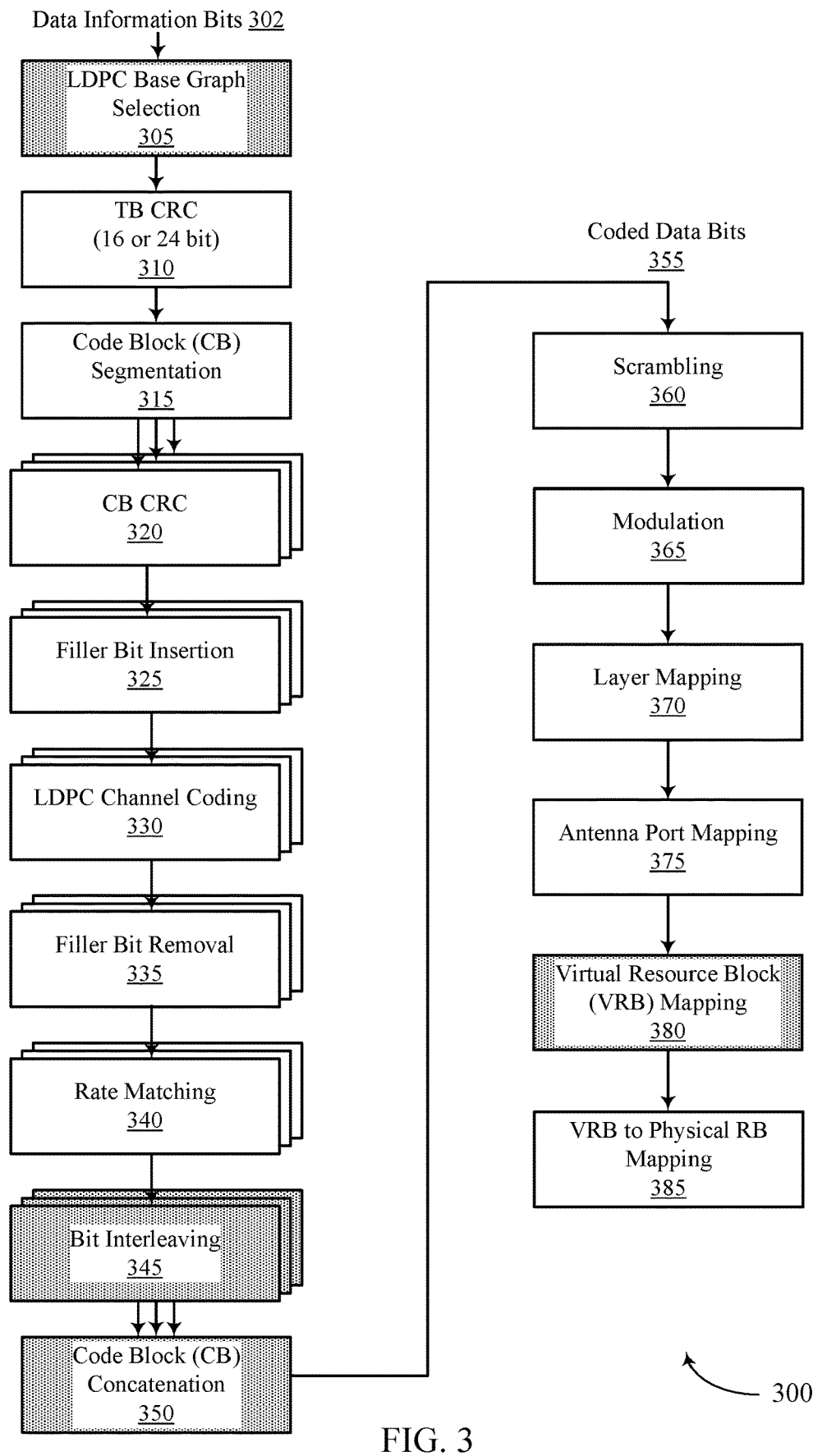
FIG. 3 illustrates an example of a coding and modulation processing flow that supports transmission methods to handle vulnerable symbols in accordance with aspects of the present disclosure.

FIG. 3 illustrates an example of a coding and modulation processing flow 300 that supports transmission methods to handle vulnerable symbols in accordance with aspects of the present disclosure. In some examples, coding and modulation processing flow 300 may implement aspects of wireless communication system 100.

As described in FIG. 2, a transmitting device may implement techniques to map high priority coded bits to symbols which are more likely to be successfully received at the receiver. The coding and modulation processing flow 300 may describe an example process for generating coded bits and mapping to resource blocks.

For example, data information bits 302 may be passed to an LDPC base graph selection component 305. The LDPC base graph selection component 305 may select an LDPC base graph. The coding processing flow may then include a transport block CRC component 310. In some cases, the TB CRC may be based on 16 or 24 bit CRC scheme. The coding process flow may include a code block segmentation component 315. The code block segmentation component 315 may generate one or more code blocks, which may be provided to a code block CRC component 320. The output of the code block CRC component 320 may be provided to a filler bit insertion component 325. The output of the filler bit insertion component 325 may be provided to an LDPC channel coding component 330, the output of which may be provided to a filler bit removal component 335. The output of the filler bit removal component 335 may be provided to a bit interleaving component 345. The bit interleaving component 345 may provide its output to a code block concatenation component 350, which may result in a concatenated code block.

For symbol modulation and RE mapping, coded data bits 355 may be provided to a scrambling component 360. In some cases, the coded data bits 355 may be based on encoding the data information bits 302 and may, in some cases, be the output of the code block concatenation block 350. The output of the scrambling component 360 may be sent to a modulation component 365, and the output of the modulation component 365 may be sent to a layer mapping component 370. The output of the layer mapping component 370 may be sent to an antenna port mapping 375, the output of which may be sent to a VRB mapping component 380. The VRB mapping component 380 may send its output to a VRB-to-PRB mapping component 385.

A transmitting device, such as a UE 115 or another device in a device-to-device or vehicle-to-X wireless communications system, may identify some processes in the coding and modulation processing flow 300 which can use techniques to provide improved handling on symbols which may be more likely to be punctured or lost at the receiver. For example, the transmitting wireless device may, generally, map high importance or high priority coded bits to symbols which are more likely to be successfully received at the receiver.

The transmitting device may implement techniques during the LDPC base graph selection component 305, bit interleaving component 345, code block concatenation component 350, VRB mapping component 380, or any combination thereof. Techniques applied in the LDPC base graph selection component 305 may include calculating a target code rate (e.g., corresponding to a base graph selection) based on a pessimistic case when vulnerable symbols are punctured at the receiver. Examples of techniques corresponding to the LDPC base graph selection component 305 are described in more detail in FIG. 4. Techniques applied in the bit interleaving component 345 may include avoiding systematic bits being present in every modulated symbol (e.g., for a code rate which is greater than $1/Q_m$, where $Q_m$ is the modulation order of the QAM constellation used in the transmission. E.g., Qm=2 for QPSK, Qm=4 for 16QAM modulation, etc.) and avoid mapping systematic bits to vulnerable REs. Examples of techniques corresponding to the bit interleaving component 345 are described in more detail in FIGS. 5 and 6. Techniques applied in the code block concatenation component 350 may include ensuring equal protection across code blocks by mapping equally to vulnerable vs non-vulnerable symbols (e.g., REs) for each code block. Examples of techniques corresponding to the code block concatenation component 350 are described in more detail in FIGS. 7 and 8. Techniques applied in the VRB mapping component 380 may include mapping systematic bits to REs which are more likely to be received at the receiver. Examples of techniques corresponding to the VRB mapping component 380 are described in more detail in FIGS. 7 and 8.

Figure 4:
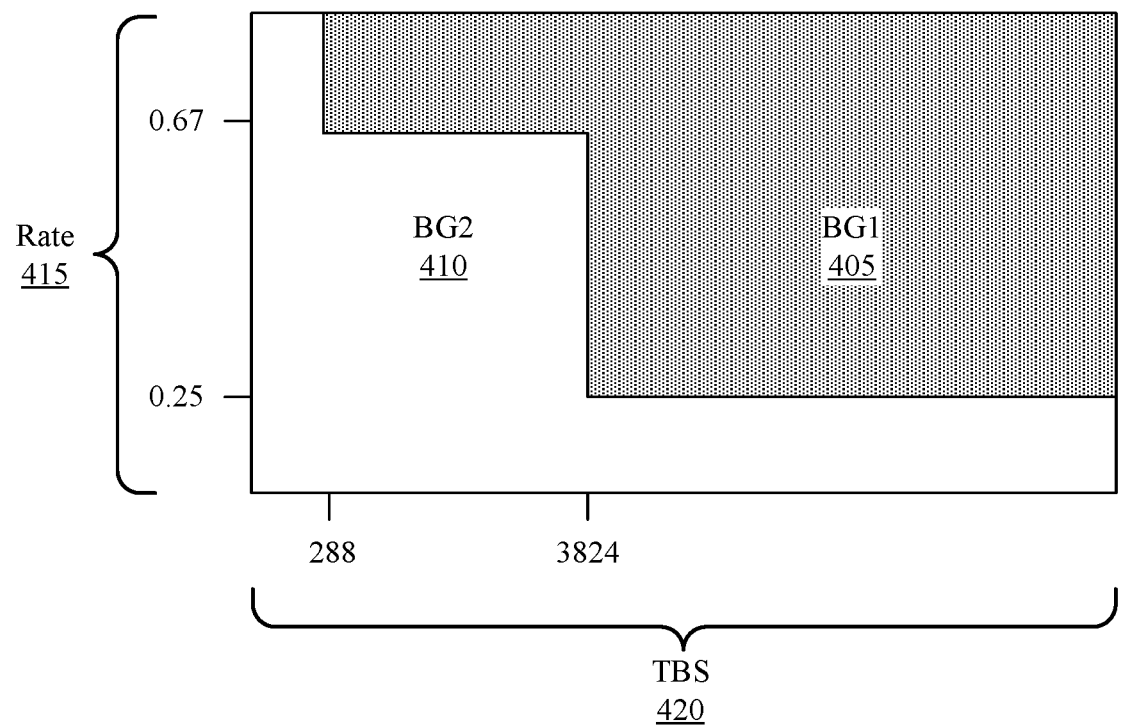
FIG. 4 illustrates an example of a low density parity check (LDPC) base graph selection that supports transmission methods to handle vulnerable symbols in accordance with aspects of the present disclosure.

FIG. 4 illustrates an example of an LDPC base graph selection 400 that supports transmission methods to handle vulnerable symbols in accordance with aspects of the present disclosure. In some examples, LDPC base graph selection 400 may implement aspects of wireless communication system 100.

In some case, two LDPC base graphs may be used for data channels. For example, a first base graph 405 ("BG1") may be an example of a first LDPC base graph, and a second base graph 410 ("BG2") may be an example of a second LDPC base graph. The first base graph 405 may be used for combinations of a TBS 420 of K>308 and code rates of R>2/3. The second base graph may be used for a TBS 420 of K≤308 for all code rates. The first base graph 405 may have a maximum information block length Kmax=8448, a Zmax=384, kb=22, and Rmin=1/3. The second base graph 410 may have a Kmax=3840, Zmax=384, kb=10, and Rmin=1/5.

To improve handling of transmitting to a receiving device which is more likely to successfully receive a first set of resources in a TTI than a second set of resources in the TTI, the transmitting device may determine the number of vulnerable symbols that can be potentially punctured at the receiving device. In some cases, this may correspond to a number of transmission resources within the second set of resources in the TTI. The transmitting device may determine the target code rate 415, R, considering a pessimistic assumption that resources in the second set (e.g., the vulnerable symbols) will not be successfully received at the receiving device. The transmitting device may determine an LDPC base graph based on the pessimistic assumption.

In some cases, the transmitting device may determine a target code rate (e.g., R1) under an assumption that all symbols (e.g., those of the first set and those of the second set) are received by the receiving device (e.g., an optimistic assumption). The transmitting device may also determine a target code rate (e.g., R2) under an assumption that the vulnerable symbols (e.g., the second set of resources) will be punctured at the receiving UE (e.g., the pessimistic assumption). The transmitting device may, in some cases, determine a target code rate as a function of R1 and R2 for determining the base graph. For example, the transmitting device may consider the optimistic assumption (e.g., where all symbols are successfully received) and the pessimistic assumption (e.g., where only the resources of the first resource set are successfully received and not the resources of the second set) to determine an LDPC base graph. In some cases, determining the base graph may be based on a type of traffic for the transmission, such as whether the transmission is transmitted using unicast, multicast, or broadcast. For example, a unicast transmission may be more based or weighted on the pessimistic assumption, while the multicast transmission may be more heavily based or weighted on the optimistic assumption. In some examples, the function to determine the base graph (e.g., which is based on R1 and R2) may be modified adapted over time. For example, the function may change based on ACK/NACK feedback, channel conditions, etc.

Figure 5:
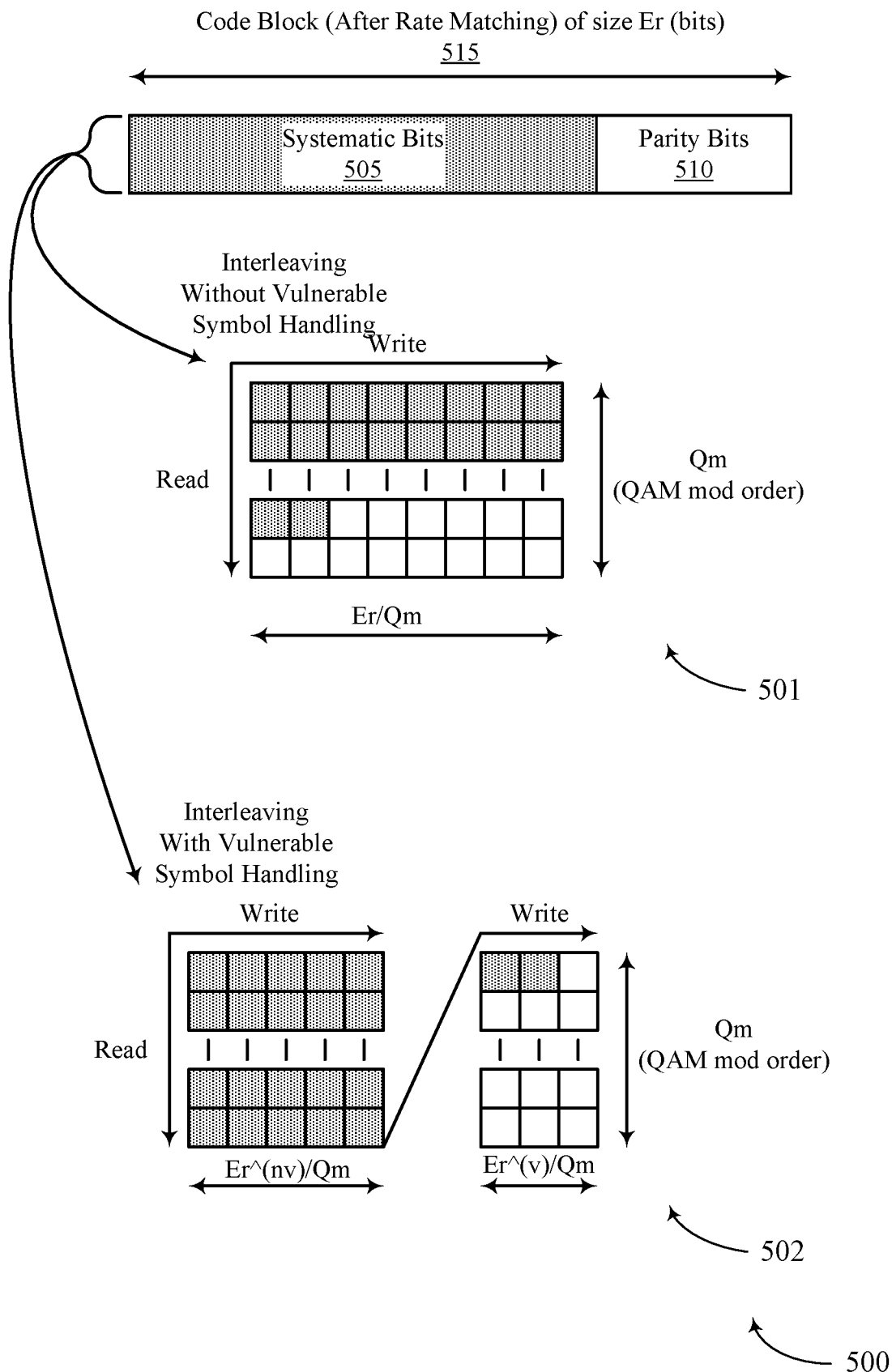
FIG. 5 illustrates an example of a bit-interleaving process that supports transmission methods to handle vulnerable symbols in accordance with aspects of the present disclosure.

FIG. 5 illustrates an example of a bit-interleaving process 500 that supports transmission methods to handle vulnerable symbols in accordance with aspects of the present disclosure. In some examples, bit-interleaving process 500 may implement aspects of wireless communication system 100.

A transmitting device may apply bit interleaving to a code block 515 after rate-matching to ensure that systematic bits 505 get mapped to bit locations with a most significant bit (MSB) value (e.g., corresponding to higher reliability) in the QAM modulated symbols. Bit interleaving schemes may support systematic bit priority ordering for Redundancy Version 0 (RV0). However, for a code rate which is greater than 1 over the modulation order, Qm (e.g., code rate greater than 1/Qm), each of the modulated symbols (e.g., that get mapped to each RE) may have at least one MSB systematic bit 505.

The bit interleaving scheme 501 may show conventional techniques for bit interleaving. The bit interleaving scheme 502 may show the techniques described herein to support improved handling of vulnerable REs. Generally, the bit interleaving scheme 502 may support forming modulated symbols corresponding to high reliability REs first, then the transmitting device may form modulated symbols corresponding to lower-reliability REs. By implementing these techniques, the transmitting device may assign higher priority coded bits to REs which are more likely to be successfully received at the receiving device. Bits which are not high priority or are relatively less important (e.g., parity bits 510) may be assigned to REs which are more likely to be unsuccessfully received by the receiver.

Figure 6:
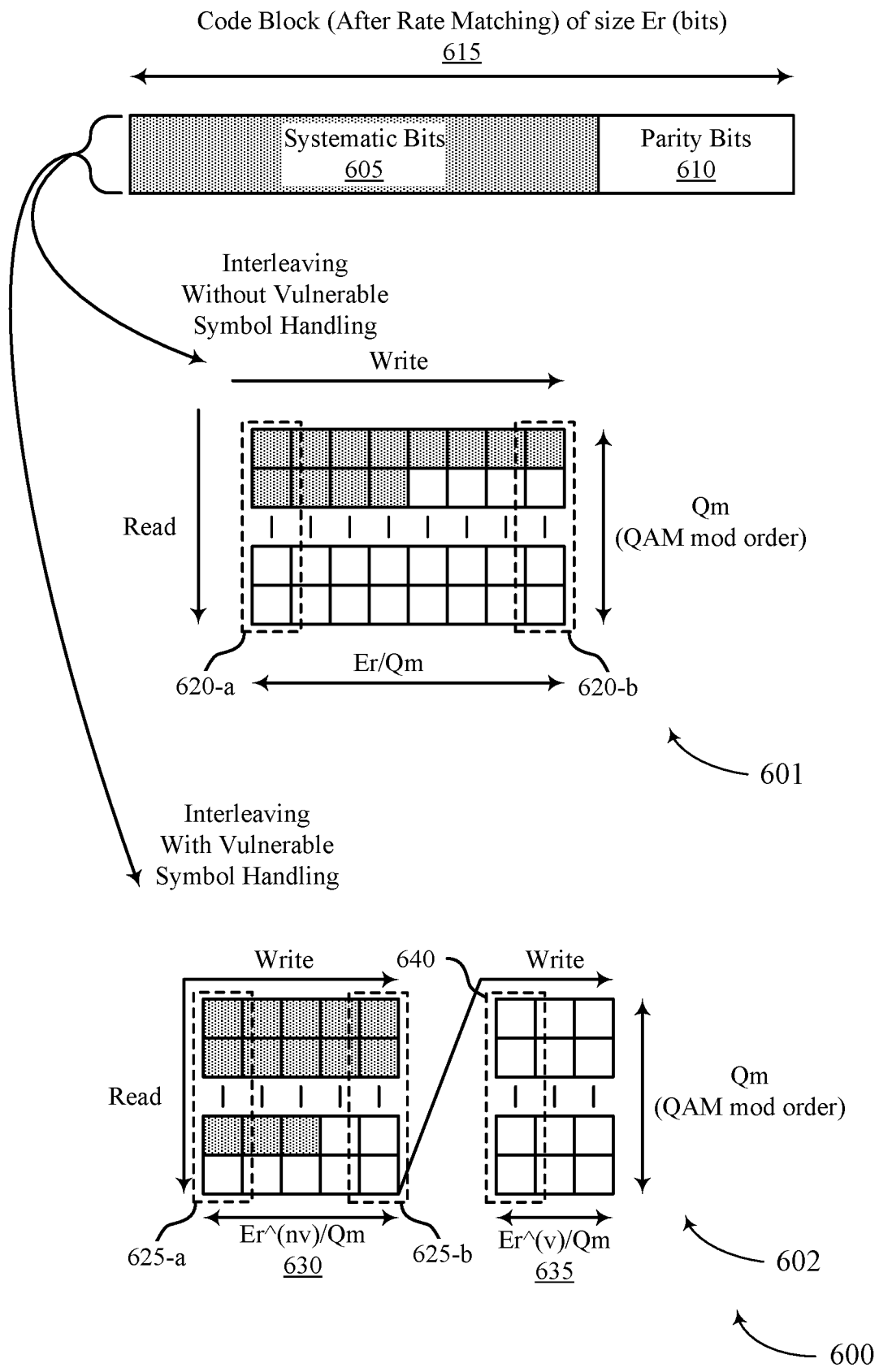
FIG. 6 illustrates an example of a bit-interleaving process that supports transmission methods to handle vulnerable symbols in accordance with aspects of the present disclosure.

FIG. 6 illustrates an example of a bit-interleaving process 600 that supports transmission methods to handle vulnerable symbols in accordance with aspects of the present disclosure. In some examples, bit-interleaving process 600 may implement aspects of wireless communication system 100.

As described in FIG. 5, a transmitting device may apply bit interleaving to a code block 615 after rate-matching to ensure that systematic bits 605 get mapped to bit locations with a most significant bit (MSB) value (e.g., corresponding to higher reliability) in the QAM modulated symbols. The systematic bits 605 may be examples of higher priority bits or higher priority coded bits, and a transmitting device described herein may implement techniques to assign the higher priority coded bits to more reliable modulated symbols or more reliable resource elements. Some bit interleaving schemes may support systematic bit priority ordering for Redundancy Version 0 (RV0). However, for a code rate which is greater than 1 over the modulation order, Qm (e.g., code rate greater than 1/Qm), the modulated symbols (e.g., each RE) may have at least one MSB systematic bit 605. The code bit interleaving 600 may describe an example where a code rate is greater than 1/Qm, but less than 2/Qm.

The transmitting device may determine Er(nv) as the ratio of coded bits that are likely to be received at the receiver and Er(v) as the ratio of coded bits that are less likely to be successfully received at the receiver. For example, Er(nv)+Er(v)=Er, where Er is the size of the code block 615. A ratio of Er(v)/Er may be approximately equal to a total number of vulnerable symbols (e.g., not likely to be successfully received) out of the total number of symbols of the code block 615

The bit interleaving scheme 602 may implement techniques to improve bit interleaving techniques and reduce the likelihood that a systematic bit is not successfully received at the receiver. For example, in the bit interleaving scheme 602, bit interleaving may be performed such that the first $Er^{(nv)}/Qm$ columns are filled first (e.g., row-wise), and the remaining $Er^{(v)}/Qm$ columns are filled after. Output bits may be read column-wise, where the bit mapper starts from the first column toward the Er/Qm column.

The bit interleaving scheme 601, in comparison, may include systematic bits 605 in each modulated symbol 620. For example, in 601, each modulated symbol 620, from the first modulated symbol 620-a through the last modulated symbol 620-b (e.g., the Er/Qm modulated symbol) may include at least one systematic bit 605. The receiver in the bit interleaving scheme 601 may be likely to unsuccessfully receive at least one of these modulated symbols, which would result in the receiver not receiving at least one of the systematic bits 605.

In the bit interleaving scheme 602, the systematic bits 605 are only included in the first $Er^{(nv)}/Qm$ modulated symbols 630, which may correspond to the most reliable modulated symbols or most reliable resource elements. For example, the systematic bits 605 may only be included from modulated symbol 625-a to modulated symbol 625-b, which may span the relatively most reliable modulated symbols. The less reliable modulated symbols, such as the $Er^{(v)}/Qm$ modulated symbols 635, may carry parity bits 610, and generally may not be interleaved to include systematic bits 605. Therefore, the transmitting device may implement the techniques of the bit interleaving scheme 602 to map higher priority coded bits to more reliable modulated symbols while mapping lower priority coded bits to less reliable modulated symbols.

Figure 7:
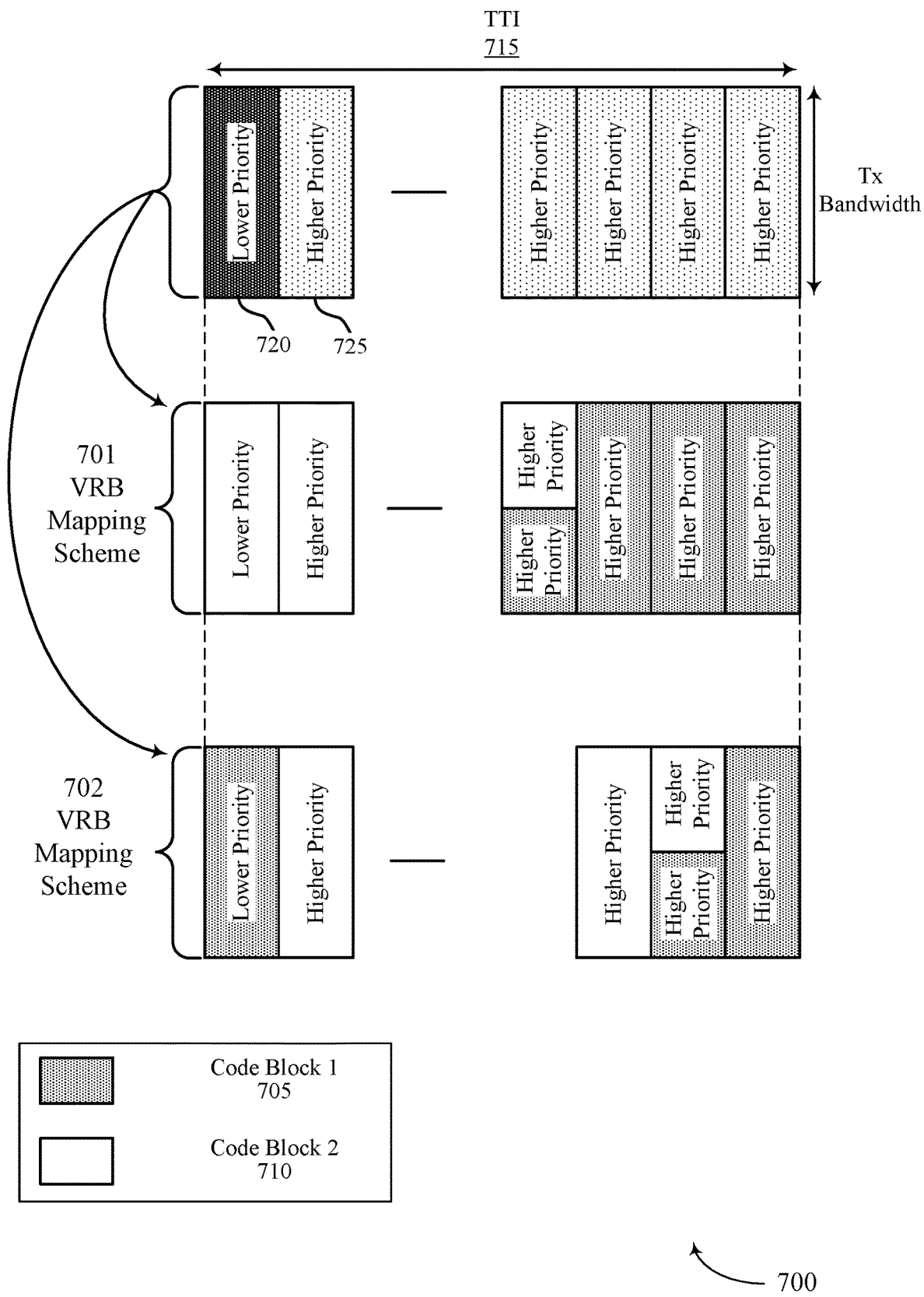
FIG. 7 illustrates an example of a code block concatenation that supports transmission methods to handle vulnerable symbols in accordance with aspects of the present disclosure.

FIG. 7 illustrates an example of a code block concatenation 700 that supports transmission methods to handle vulnerable symbols in accordance with aspects of the present disclosure. In some examples, code block concatenation 700 may implement aspects of wireless communication system 100.

As described in FIG. 2, some symbols in a TTI 715 may be more likely to be successfully received than other symbols. For example, in some cases, a first symbol of a TTI 715 may be less likely to be correctly or successfully received by the receiver. These symbols may be referred to as vulnerable symbols, lower reliability, or unreliable symbols, etc. In some cases, the receiving device may still successfully receive a lower reliability symbol. The symbols which are more likely to be successfully received may be referred to as reliable symbols (e.g., the reliable symbols 725), non-vulnerable symbols, etc. Generally, a transmitting device described herein may implement techniques to map high priority coded bits to reliable symbols 725. Therefore, even if the receiving device does not successfully receive each symbol in a TTI, the receiving device is more likely to successfully receive the high priority information.

In some examples, a transmitting device may have more than one code block to transmit to a receiving device. For example, the transmitting device may have a first code block 705 and a second code block 710 to transmit to the receiving device. The transmitting device may perform code block concatenation by sequentially concatenating the code blocks. For example, a concatenated code block may include the first code block 705 and the second code block 710.

Based on the VRB mapping, the code block concatenation may result in the first code block 705 being mapped to higher reliable symbols 725, while the second code block 710 may be mapped to both reliable symbols 725 and unreliable symbols 720. Therefore, according to some VRB mapping techniques, only the second code block 710 may be mapped to the unreliable symbols 720, which may lead to unequal protection and coding rates of the first code block 705 and the second code block 710. This example is shown by VRB mapping scheme 701. Here, the second code block 710 (e.g., "Code Block 2") is mapped to the unreliable symbol 720, and no portion of the first code block 705 (e.g., "Code Block 1") is mapped to an unreliable symbol 720. If an alternate VRB mapping technique (e.g., shown by the VRB mapping scheme 702) is applied to map to reliable symbols first, then only the second code block 710 may be mapped to the unreliable symbols 720. The VRB mapping scheme 701 and the VRB mapping scheme 702 may both span the TTI 715 but show different ways the concatenated code block can be mapped to symbol periods (e.g., to higher priority symbol periods 720 and to lower priority symbol periods 725) in the TTI 715. A transmitting device described herein may instead apply the techniques described in FIG. 8 for code block concatenating and VRB mapping. The techniques of FIG. 7 and FIG. 8 may also be applicable when concatenating other numbers of code blocks, for example including concatenating 3 or more code blocks.

Figure 8:
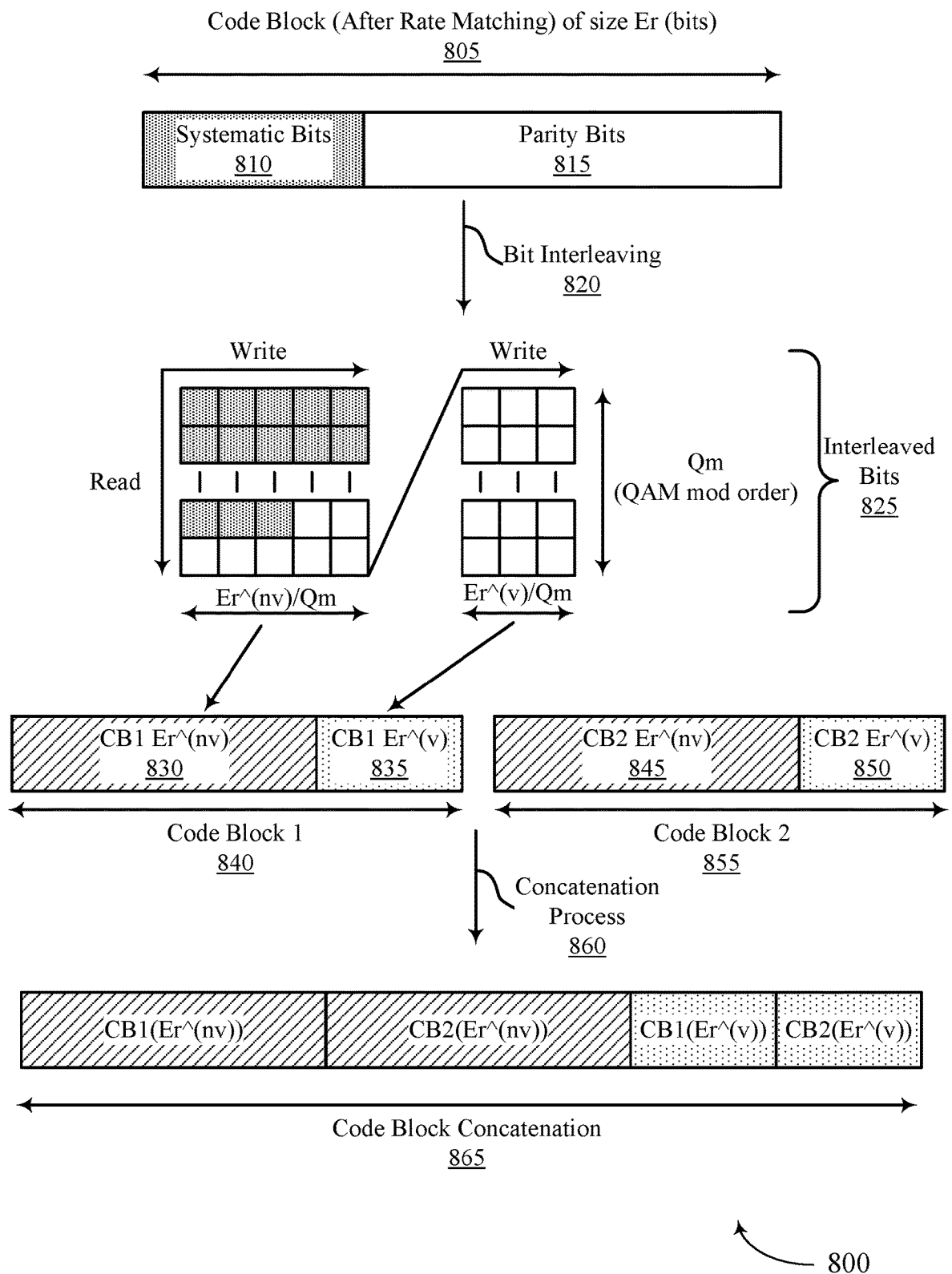
FIG. 8 illustrates an example of a code block concatenation that supports transmission methods to handle vulnerable symbols in accordance with aspects of the present disclosure.

FIG. 8 illustrates an example of a code block concatenation 800 that supports transmission methods to handle vulnerable symbols in accordance with aspects of the present disclosure. In some examples, code block concatenation 800 may implement aspects of wireless communication system 100.

A transmitting device may implement a bit interleaving technique as described in FIGS. 5 and 6 to generate a code block 805. For example, the transmitting device may assign high priority coded bits to the most reliable modulated symbols. This may generate an interleaved code block (e.g., a first code block 840) with a higher priority part 830 and a lesser priority part 835. The higher priority part 830 may include the $Er^{nv}$ most high priority symbols, while the lesser priority part 835 may include the $Er^{v}$ least priority symbols.

In some cases, the transmitting device may concatenate two or more code blocks which have been generated according to the techniques described in FIGS. 5 and 6. For example, the transmitting device may concatenate the first code block 840 with a second code block 855. Where some conventional devices concatenating conventional code blocks may implement concatenation techniques to produce concatenated code blocks similar to the concatenated code blocks of FIG. 7, a transmitting device herein may implement the concatenation process 860. For example, the transmitting device may split the first code block 840 and the second code block 855 into their higher priority parts (e.g., higher priority part 830 and higher priority part 845) and lesser priority parts (e.g., lesser priority part 835 and lesser priority part 850), concatenate the higher priority parts across the code blocks first, then concatenate the lesser priority parts across the code blocks second. This may generate a code block concatenation 865. Thus, the higher priority sections of all of the concatenated code blocks are grouped together, and the lesser priority sections of all of the concatenated code blocks are grouped together.

This may assist the transmitting device in implementing a VRM mapping scheme which fairly assigns the first code block 840 and the second code block 845 to higher priority or lesser priority symbols in a TTI. If the first code block 840 and the second code block 845 are fairly, or approximately fairly, assigned to lesser priority symbols in the TTI, then the transmitting device may assume similar protection for the two code blocks and use a similar code rate for the two code blocks. The concatenation process 860 may support a transmitting device to use a VRB mapping technique where the transmitting device maps to higher reliability symbols first and to lower reliability symbols last.

Some wireless communications systems may support frequency-first VRB mapping. VRB to PRB mapping may support non-interleaved and interleaved mapping. In some cases, VRB to PRB mapping in conventional systems may lead to systematic bits (e.g., or other higher priority bits) being mapped to lower reliability, or vulnerable, symbols. A transmitting device described herein may implement techniques to map to higher reliability symbols first and lower reliability symbols last. The transmitting device described herein may utilize frequency first mapping within those symbols. When implemented with the code block concatenation techniques described in FIG. 8, this may provide equal protection across multiple code blocks.

In some cases, the transmitting device may support multi-slot transmission. In a first example for multi-slot transmission, the transmitting device may map slot-by-slot, starting with higher reliability symbols in a given slot followed by lower reliability symbols in that slot. For example, the organization of the symbols may go from slot 1 higher reliability, then slot 1 lower reliability, then slot 2 higher reliability, then slot 2 lower reliability. This first example may be referred to as a first option for VRB mapping. In a second example of multi-slot transmission, the transmitting device may map to higher reliability symbols across aggregated slots first, and vulnerable slots across the aggregated slots last. For example, the organization of the symbols may go from slot 1 higher reliability, then slot 2 higher reliability, then slot 1 lower reliability, then slot 2 lower reliability. The second example may be referred to as a second option for VRB mapping.

In some cases, the transmitting device may either concatenate code blocks by appending a second code block to a first code block (e.g., as shown in FIG. 7), or the transmitting device may first concatenate the reliable parts of the code blocks followed by the lower reliability parts of the code blocks (e.g., as shown in FIG. 8). Appending code blocks as described in FIG. 7 may be referred to as a first code block concatenation option, where appending code blocks as described in FIG. 8 may be referred to as a second code block concatenation option.

In some cases, the transmitting device may select a concatenation option or a VRB-to-PRB mapping technique based on one or more considerations. A first consideration may include equal or unequal protection among code blocks. A second consideration may include on-time decoding for a first code block, such that the receiving device may not have to wait until the end of the TTI to decode the first code block. A third consideration may include local memory requirements, for example to store out-of-order LLRs that may not be directly pushed into the decoder. In some cases, the transmitting device may select a code block concatenation option and a VRB mapping option according to table 1 below.

TABLE 1

| | VRB Mapping Option 1 | VRB Mapping Option 2 |
|---|---|---|
| Code Block Concatenation Option 1 | 1 slot TTI with 2 code blocks: Unequal error protection<br>2 slot TTI with 2 code blocks: mostly equal protection<br>Local storage: only for vulnerable symbols<br>code block1 on-time decode: yes | N/A |
| Code Block Concatenation Option 2 | N/A | 1 slot TTI with 2 code blocks: Equal error protection<br>2 slot TTI with 2 code blocks: Equal protection<br>Local storage: only for vulnerable symbols<br>code block1 on-time decode: yes |

For example, in some cases, the transmitting device may apply both the second code block concatenation option and the second VRB mapping option. Applying the second code block concatenation option and the second VRB mapping option may provide equal protection, on-time code block1 decoding, and the same local memory storage usages.

Figure 9:
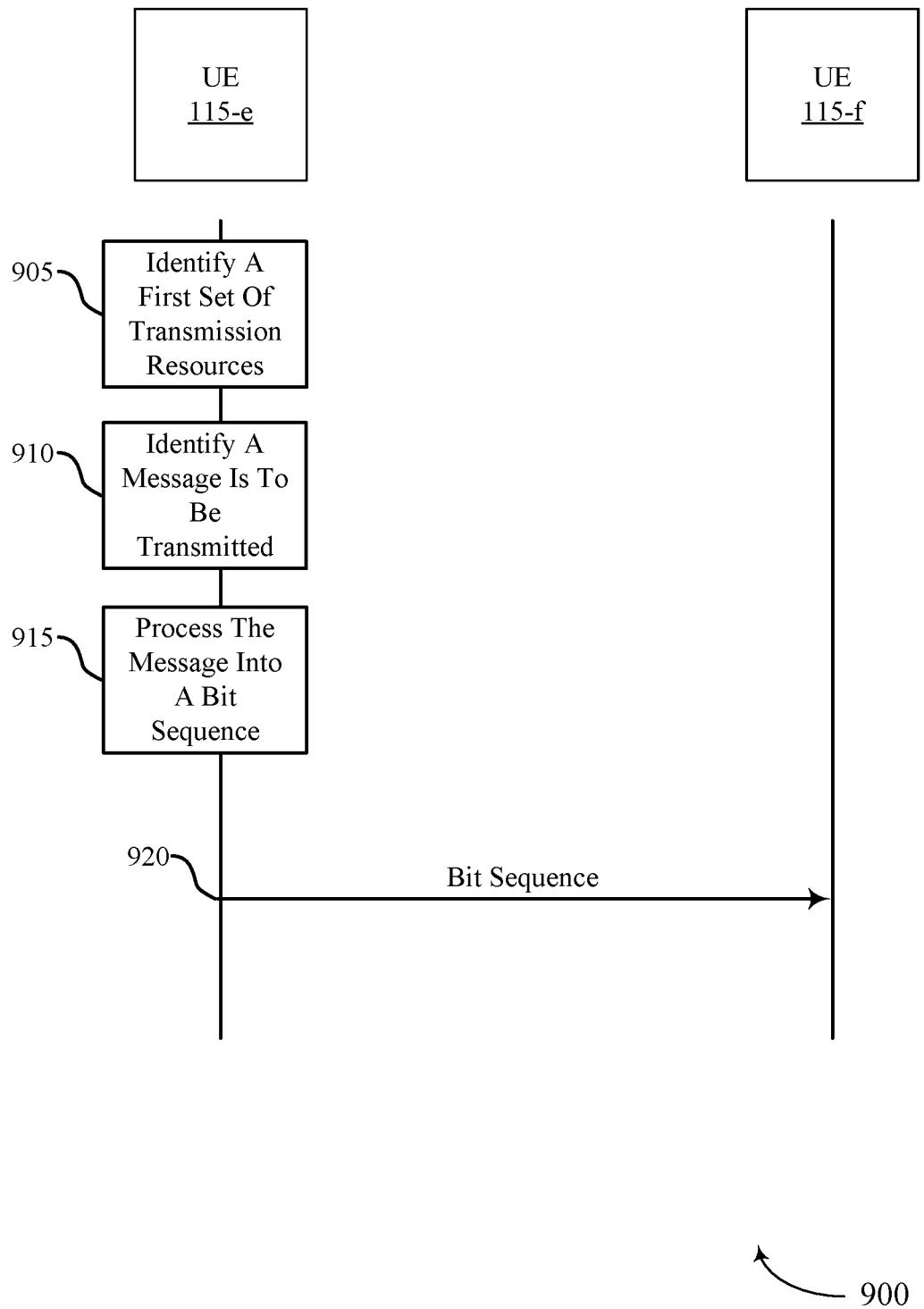
FIG. 9 illustrates an example of a process flow that supports transmission methods to handle vulnerable symbols in accordance with aspects of the present disclosure.

FIG. 9 illustrates an example of a process flow 900 that supports transmission methods to handle vulnerable symbols in accordance with aspects of the present disclosure. In some examples, process flow 900 may implement aspects of wireless communication system 100.

A first device (e.g., UE 115-*e*) and a second device (e.g., UE 115-*f*) may be configured for communication in a wireless communications system. In some cases, UE 115-*e* and UE 115-*f* are in communication with each other over a V2X network. In some cases, UE 115-*e* and UE 115-*f* are in communication with each other over a device-to-device (D2D) network. The UEs 115 may be examples of wireless devices, mobile devices, cellular devices, vehicles, etc. In some cases, the techniques described herein relate to sidelink wireless communications, such as between devices of a V2X or D2D wireless communications system. In some cases, the first device may be an example of a transmitting device, and the second device may be an example of a receiving device.

At 905, UE 115-*e* may identify that a first set of transmission resources in a TTI has a higher priority at a receiving device (e.g., UE 115-*f*) than a second set of transmission resources in the TTI. For example, UE 115-*e* may identify a set of non-vulnerable symbols (e.g., the first set of transmission resources) and a set of vulnerable symbols (e.g., the second set of transmission resources).

In some cases, the first set of transmission resources may be referred to as higher priority symbols or higher reliability symbols. In some cases, the second set of transmission resources may be referred to as lower priority symbols or lower reliability symbols. In some examples, the first set of transmission resources may include a first set of OFDM symbols, and the second set of transmission resources may include a second set of OFDM symbols. In some cases, the first and second set of transmission resources may include respective sets of slots, mini-slots, etc.

In some examples, such as for sidelink communications, the set of vulnerable symbols may be based on a configuration for a resource pool. For example, a first OFDM symbol may be vulnerable if 30 KHz subcarrier spacing is used, or the first OFDM symbol and a second OFDM symbol may be vulnerable if 60 KHz subcarrier spacing is used for the transmission. The configuration and corresponding parameters for the resource pool, such as subcarrier spacing, a presence or absence of a feedback symbol in a given slot, etc. may be configured via higher layer signaling, such as RRC signaling. These higher layer configurations may be associated with the resource pool within which the transmission resources are selected or assigned.

In some examples, UE 115-e may identify that the first set of transmission resources has a higher priority at UE 115-f than the second set of transmission resources based on an RRC configuration of a resource pool that includes the first set of transmission resources and the second set of transmission resources. In some cases, UE 115-e may identify that the second set of transmission resources is more likely to be punctured at UE 115-f than the first set of transmission resources. At 910, UE 115-e may identify that a message is to be transmitted from UE 115-e to UE 115-f via the TTI.

At 915, UE 115-e may process the message into a bit sequence based on the identification of the second set of transmission resources in the TTI, where the processing increases a likelihood that systematic bits of the message are received at UE 115-f despite presence of the second set of transmission resources in the TTI.

By increasing the likelihood that high priority bits of the message, such as systematic bits, are successfully received at the second device, performance of wireless communications between the first device (e.g., UE 115-e) and the second device (e.g., UE 115-f) may be improved. For example, the systematic bits may indicate configurations or parameters to the second device, and the second device may not be able to operate, decode, transmit, or monitor according to a latest configuration without receiving the systematic bits. Therefore, by employing techniques to ensure that the systematic bits, or other high priority bits, are correctly received at the receiver, a wireless communications system is also ensuring that the wireless devices of the wireless communications system can operate and communicate successfully.

In some cases, UE 115-e may determine a number of second transmission resources within the second set of transmission resource and determine a target code rate for the bit sequence based on exclusion of the number of second transmission resources from a calculation of the target code rate. UE 115-e may select an LDPC base graph for use in processing the message into the bit sequence based on the target code rate. Additional examples of the LDPC base graph selection may be described in more detail in at least FIG. 4.

In some cases, UE 115-e may generate one or more code blocks corresponding to the message and identify that each code block includes a set of systematic bits and a set of parity bits. UE 115-e may bit-interleave the set of systematic bits and the set of parity bits of each code block so that at least a majority of the systematic bits are organized in a first set of columns and so that at least a majority of the parity bits are organized in a second set of columns. UE 115-e may then form a first set of modulated symbols based on the first set of columns and a second set of modulated symbols based on the second set of columns. Additional examples of the bit-interleaving techniques may be described in more detail in at least FIGS. 5 and 6.

In some cases, UE 115-e may identify that the bit sequence includes a set of code blocks that each include a set of systematic bits and a set of parity bits. UE 115-e may determine, for each code block, a first set of coded bits and a second set of coded bits and determine a concatenated third set of coded bits by concatenating the first sets of coded bits of the set of code blocks, starting with a first code block of the set of code blocks and continuing through a last code block of the set of code blocks. UE 115-e may determine a concatenated fourth set of coded bits by concatenating the second sets of coded bits of the set of code blocks, starting with the first code block and continuing through the last code block, and UE 115-e may determine concatenated code block bits for transmission on the transmission resources by concatenating the concatenated third set of coded bits first, followed by the concatenated fourth set of coded bits. Additional examples of code block concatenation techniques may be described in more detail in at least FIGS. 7 and 8.

In some cases, UE 115-e may map coded bits of the message to the first set of transmission resources in the TTI before mapping to the second set of transmission resources in the TTI. Additional examples of bit mapping (e.g., VRB mapping or VRB-to-PRB mapping) may be described in more detail in at least FIGS. 7 and 8. At 920, UE 115-e may transmit the bit sequence to UE 115-f via the TTI.

The second device (e.g., the receiving device) may receive the bit sequence and decode the bit sequence accordingly. For example, the second device may determine that the first set of transmission resources in the TTI has a higher priority than the second set of transmission resources in the TTI and decode the bit sequence based on the first set of transmission resources in the TTI having the higher priority than the second set of transmission resources in the TTI.

In some cases, a decoding process performed at the second device may be based on a reverse ordering of the encoding process performed at the transmitter. The receiver may be indicated which resources are more reliable and may determine that the transmitted encoded the higher priority information to the more reliable resources. The receiver may decode the bit sequence based on determining that the higher priority information was mapped to the higher reliability resources.

In some cases, the receiver may be configured with the higher and lower priority transmission resources via RRC. For example, based on a configuration of a resource pool (e.g., including the first set of transmission resources and the second set of transmission resources), the receiver may determine which resources of the resource pool are more reliable or less reliable. For example, if the transmitter uses a 30 KHz subcarrier spacing to transmit the bit sequence, the receiver may determine that a first OFDM symbol is vulnerable. In some examples, the transmitter may indicate a mapping sequence to the receiver. For example, the first device may indicate how the bit sequence was generated to the second device, and the second device may decode the bit sequence based on the indication from the first device.

In some examples, some procedures and techniques of process flow 900 are described with reference to sidelink communications. However, these techniques and procedures may be applicable to other types of communications as well. For example, these techniques may be used in URLLC. For example, lower priority resources may be punctured for URLLC traffic, and vulnerable resources may be indicated and avoided for high value information. Therefore, while in some examples the first device and the second device are shown or described to both be UEs 115, the first device and the second device may each be a UE 115, a base station 105, or another type of transmission and reception point.

Figure 10:
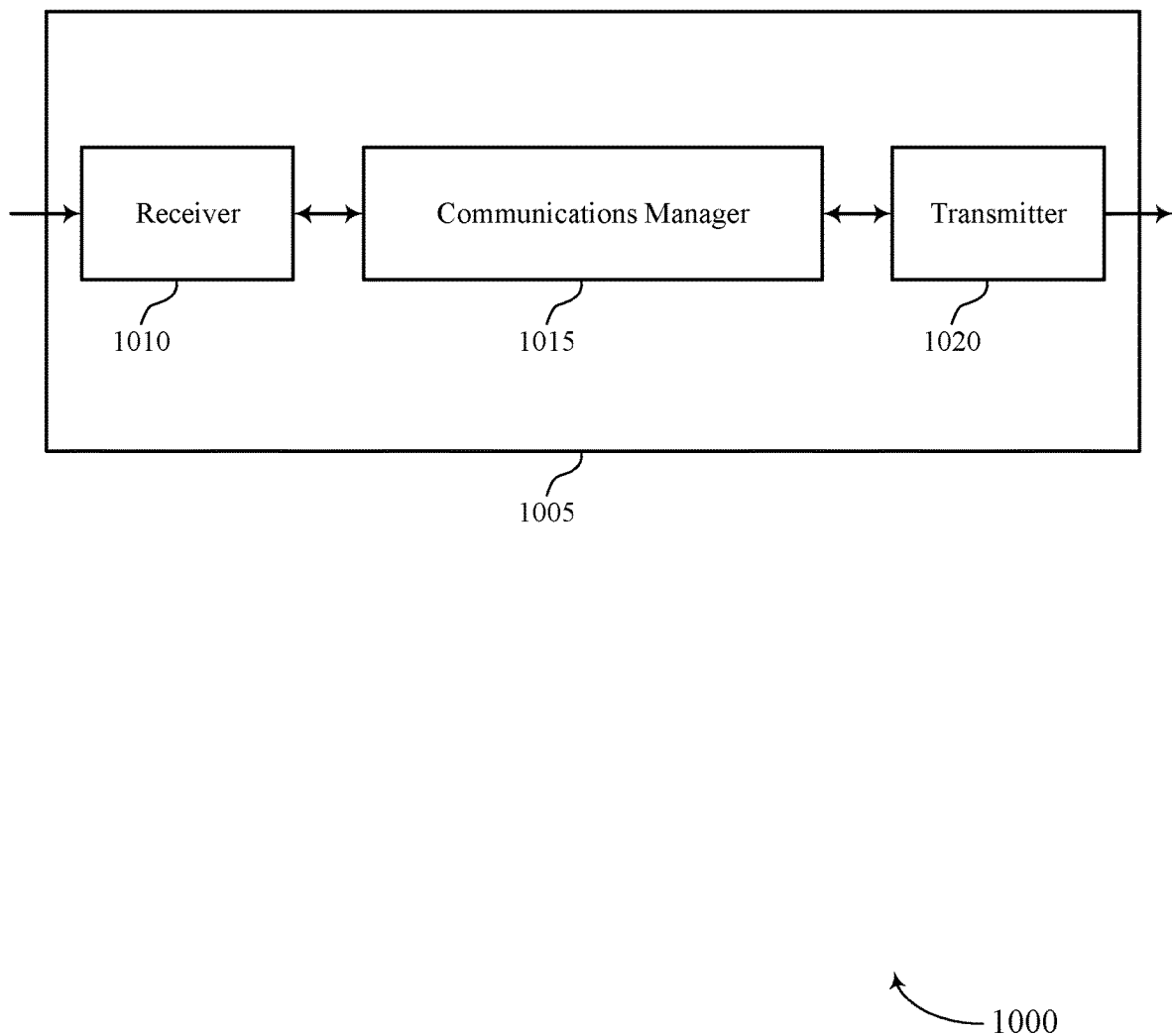
FIGS. 10 and 11 show block diagrams of devices that support transmission methods to handle vulnerable symbols in accordance with aspects of the present disclosure.

FIG. 10 shows a block diagram 1000 of a device 1005 that supports transmission methods to handle vulnerable symbols in accordance with aspects of the present disclosure. The device 1005 may be an example of aspects of a UE 115 as described herein. In some examples, the device 1005 may be an example of aspects of a base station 105 as described herein. The device 1005 may include a receiver 1010, a communications manager 1015, and a transmitter 1020. The device 1005 may also include a processor. Each of these components may be in communication with one another (e.g., via one or more buses).

The receiver 1010 may receive information such as packets, user data, or control information associated with various information channels (e.g., control channels, data channels, and information related to transmission methods to handle vulnerable symbols, etc.). Information may be passed on to other components of the device 1005. The receiver 1010 may be an example of aspects of the transceiver 1320 described with reference to FIG. 13. The receiver 1010 may utilize a single antenna or a set of antennas.

The communications manager 1015 may determine, at a first device, that a first set of transmission resources in a TTI has a higher priority at a second device than a second set of transmission resources in the TTI, and transmit a bit sequence to the second device via the TTI, where the bit sequence is based on the first set of transmission resources in the TTI having a higher priority than the second set of transmission resources in the TTI. For example, the communications manager 1015 may identify, at a first device, that a first set of transmission resources in a TTI has a higher priority at a second device than a second set of transmission resources in the TTI, identify that a message is to be transmitted from the first device to the second device via the TTI, process the message into a bit sequence based on the identification of the second set of transmission resources in the TTI, where the processing increases a likelihood that systematic bits of the message are received at the second device despite presence of the second set of transmission resources in the TTI, and transmit the bit sequence to the second device via the TTI.

The communications manager 1015 may also receive, at a second device, a bit sequence from a first device in a TTI, determine that a first set of transmission resources in the TTI has a higher priority at the second device than a second set of transmission resources in the TTI, and decode the bit sequence based on the first set of transmission resources in the TTI having a higher priority than the second set of transmission resources in the TTI. The communications manager 1015 may be an example of aspects of the communications manager 1310 described herein. The communications manager 1015 may be an example of aspects of the communications manager 1310 described herein.

The communications manager 1015, or its sub-components, may be implemented in hardware, code (e.g., software or firmware) executed by a processor, or any combination thereof. If implemented in code executed by a processor, the functions of the communications manager 1015, or its sub-components may be executed by a general-purpose processor, a DSP, an application-specific integrated circuit (ASIC), a FPGA or other programmable logic device, discrete gate or transistor logic, discrete hardware components, or any combination thereof designed to perform the functions described in the present disclosure.

The communications manager 1015, or its sub-components, may be physically located at various positions, including being distributed such that portions of functions are implemented at different physical locations by one or more physical components. In some examples, the communications manager 1015, or its sub-components, may be a separate and distinct component in accordance with various aspects of the present disclosure. In some examples, the communications manager 1015, or its sub-components, may be combined with one or more other hardware components, including but not limited to an input/output (I/O) component, a transceiver, a network server, another computing device, one or more other components described in the present disclosure, or a combination thereof in accordance with various aspects of the present disclosure.

The transmitter 1020 may transmit signals generated by other components of the device 1005. In some examples, the transmitter 1020 may be collocated with a receiver 1010 in a transceiver module. For example, the transmitter 1020 may be an example of aspects of the transceiver 1320 described with reference to FIG. 13. The transmitter 1020 may utilize a single antenna or a set of antennas.

Figure 11:
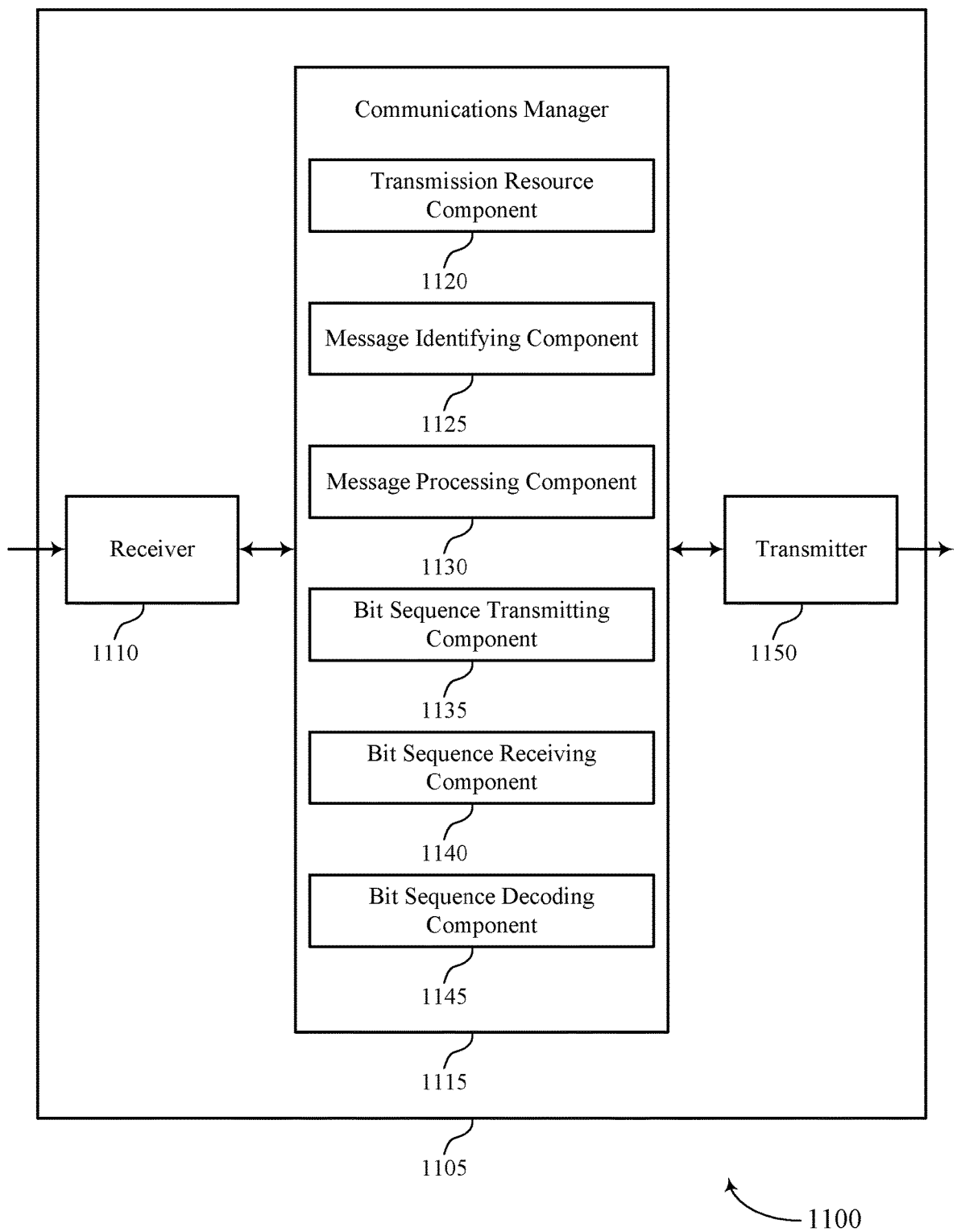

FIG. 11 shows a block diagram 1100 of a device 1105 that supports transmission methods to handle vulnerable symbols in accordance with aspects of the present disclosure. The device 1105 may be an example of aspects of a device 1005, or a UE 115 as described herein. In some examples, the device 1105 may be an example of aspects of a base station 105 as described herein. The device 1105 may include a receiver 1110, a communications manager 1115, and a transmitter 1150. The device 1105 may also include a processor. Each of these components may be in communication with one another (e.g., via one or more buses).

The receiver 1110 may receive information such as packets, user data, or control information associated with various information channels (e.g., control channels, data channels, and information related to transmission methods to handle vulnerable symbols, etc.). Information may be passed on to other components of the device 1105. The receiver 1110 may be an example of aspects of the transceiver 1320 described with reference to FIG. 13. The receiver 1110 may utilize a single antenna or a set of antennas.

The communications manager 1115 may be an example of aspects of the communications manager 1015 as described herein. The communications manager 1115 may include a transmission resource component 1120, a message identifying component 1125, a message processing component 1130, and a bit sequence transmitting component 1135. The communications manager 1115 may be an example of aspects of the communications manager 1310 described herein.

The transmission resource component 1120 may determine, at a first device, that a first set of transmission resources in a TTI has a higher priority at a second device than a second set of transmission resources in the TTI. The bit sequence transmitting component 1135 may transmit a bit sequence to the second device via the TTI, where the bit sequence is based on the first set of transmission resources in the TTI having a higher priority than the second set of transmission resources in the TTI.

In some cases, the transmission resource component 1120 may identify, at a first device, that a first set of transmission resources in a TTI has a higher priority at a second device than a second set of transmission resources in the TTI. The message identifying component 1125 may identify that a message is to be transmitted from the first device to the second device via the TTI. The message processing component 1130 may process the message into a bit sequence based on the identification of the second set of transmission resources in the TTI, where the processing increases a likelihood that systematic bits of the message are received at the second device despite presence of the second set of transmission resources in the TTI. The bit sequence transmitting component 1135 may transmit the bit sequence to the second device via the TTI.

The bit sequence receiving component 1140 may receive, at a second device, a bit sequence from a first device in a TTI. The transmission resource component 1120 may determine that a first set of transmission resources in the TTI has a higher priority at the second device than a second set of transmission resources in the TTI. The bit sequence decoding component 1145 may decode the bit sequence based on the first set of transmission resources in the TTI having a higher priority than the second set of transmission resources in the TTI.

The transmitter 1150 may transmit signals generated by other components of the device 1105. In some examples, the transmitter 1150 may be collocated with a receiver 1110 in a transceiver module. For example, the transmitter 1150 may be an example of aspects of the transceiver 1320 described with reference to FIG. 13. The transmitter 1150 may utilize a single antenna or a set of antennas.

Figure 12:
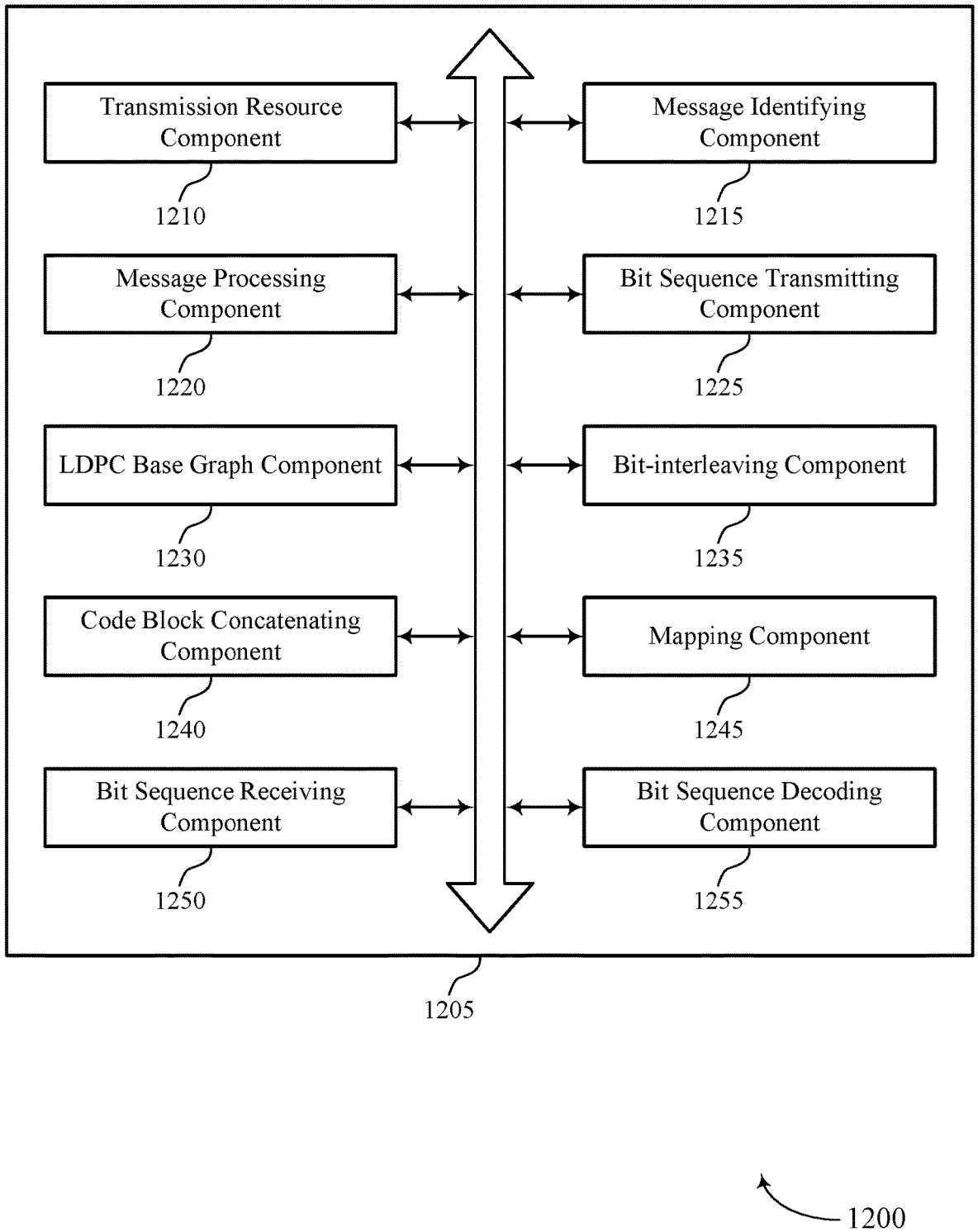
FIG. 12 shows a block diagram of a communications manager that supports transmission methods to handle vulnerable symbols in accordance with aspects of the present disclosure.

FIG. 12 shows a block diagram 1200 of a communications manager 1205 that supports transmission methods to handle vulnerable symbols in accordance with aspects of the present disclosure. The communications manager 1205 may be an example of aspects of a communications manager 1015, a communications manager 1115, or a communications manager 1310 described herein. The communications manager 1205 may include a transmission resource component 1210, a message identifying component 1215, a message processing component 1220, a bit sequence transmitting component 1225, a LDPC base graph component 1230, a bit-interleaving component 1235, a code block concatenating component 1240, and a mapping component 1245. Each of these modules may communicate, directly or indirectly, with one another (e.g., via one or more buses).

The transmission resource component 1210 may identify, at a first device, that a first set of transmission resources in a TTI has a higher priority at a second device than a second set of transmission resources in the TTI.

In some examples, the transmission resource component 1210 may identify that the first set of transmission resources has a higher priority at the second device than the second set of transmission resources is based on a RRC configuration of a resource pool that includes the first set of transmission resources and the second set of transmission resources.

In some examples, the transmission resource component 1210 may identify that the second set of transmission resources is more likely to be punctured at the second device than the first set of transmission resources. In some cases, the first set of transmission resources includes a first set of resource elements, and where the second set of transmission resources includes a second set of resource elements. In some cases, the first set of transmission resources includes a first set of orthogonal frequency-division multiplexing (OFDM) symbols, and where the second set of transmission resources includes a second set of OFDM symbols. In some cases, the first device and the second device are in communication with each other over a vehicle-to-everything (V2X) network. In some cases, the first device and the second device are in communication with each other over a device-to-device (D2D) network.

The message identifying component 1215 may identify that a message is to be transmitted from the first device to the second device via the TTI. The message processing component 1220 may process the message into a bit sequence based on the identification of the second set of transmission resources in the TTI, where the processing increases a likelihood that systematic bits of the message are received at the second device despite presence of the second set of transmission resources in the TTI. The bit sequence transmitting component 1225 may transmit the bit sequence to the second device via the TTI.

The LDPC base graph component 1230 may determine a number of second transmission resources within the second set of transmission resources. In some examples, the LDPC base graph component 1230 may determine a target code rate for the bit sequence based on exclusion of the number of second transmission resources from a calculation of the target code rate. In some examples, the LDPC base graph component 1230 may select a low-density parity check (LDPC) base graph for use in processing the message into the bit sequence based on the target code rate.

In some examples, the LDPC base graph component 1230 may determine the target code rate based on a function that includes a first input target code rate and a second input target code rate, where the first input target code rate is based on exclusion of the number of second transmission resources from the calculation of the first input target code rate, and where the second input target code rate is based on inclusion of the number of second transmission resources in the calculation of the second input target code rate. In some examples, the LDPC base graph component 1230 may adapt the function over time based on feedback received from one or more second devices. In some cases, the function includes a weighting of the first input target code rate and the second input target code rate based on a traffic type of the of the message. In some cases, the first input target code rate is weighted more heavily than the second input target code rate when the traffic type is unicast. In some cases, the second input target code rate is weighted more heavily than the first input target code rate when the traffic type is multicast. In some cases, the second input target code rate is weighted more heavily than the first input target code rate when the traffic type is broadcast.

The bit-interleaving component 1235 may generate one or more code blocks corresponding to the message. In some examples, the bit-interleaving component 1235 may identify that each code block includes a set of systematic bits and a set of parity bits. In some examples, the bit-interleaving component 1235 may bit-interleave the set of systematic bits and the set of parity bits of each code block so that at least a majority of the systematic bits are organized in a first set of columns and so that at least a majority of the parity bits are organized in a second set of columns.

In some examples, the bit-interleaving component 1235 may form a first set of modulated symbols based on the first set of columns and a second set of modulated symbols based on the second set of columns. In some examples, the bit-interleaving component 1235 may organize the set of systematic bits and the set of parity bits in row-column manner, where a number of rows depends on a modulated symbol order of the first set of modulated symbols and the second set of modulated symbols.

In some examples, the bit-interleaving component 1235 may bit-interleave to write the set of systematic bits and the set of parity bits column-wise within the first set of columns first, and then column-wise within the second set of columns next. In some examples, the bit-interleaving component 1235 may read out the bit-interleaved set of systematic bits and set of parity bits row-wise, starting with a first column and continuing until a last column. In some examples, the bit-interleaving component 1235 may map as many as possible of the systematic bits to the first set of columns.

In some examples, the bit-interleaving component 1235 may map any remainder of the systematic bits to the second set of columns. In some examples, the bit-interleaving component 1235 may map the parity bits to either the first set of columns or the second set of columns after the systematic bits are mapped. In some examples, the bit-interleaving component 1235 may determine a ratio between the first set of transmission resources and the second set of transmission resources. In some examples, the bit-interleaving component 1235 may organize the first set of modulated symbols and the second set of modulated symbols based on the ratio. In some examples, the bit-interleaving component 1235 may organize the first set of modulated symbols and the second set of modulated symbols is further based on a number of code blocks used to transmit the bit sequence.

The code block concatenating component 1240 may identify that the bit sequence includes a set of code blocks that each include a set of systematic bits and a set of parity bits. In some examples, the code block concatenating component 1240 may determine, for each code block, a first set of coded bits and a second set of coded bits. In some examples, the code block concatenating component 1240 may determine a concatenated third set of coded bits by concatenating the first sets of coded bits of the set of code blocks, starting with a first code block of the set of code blocks and continuing through a last code block of the set of code blocks.

In some examples, the code block concatenating component 1240 may determine a concatenated fourth set of coded bits by concatenating the second sets of coded bits of the set of code blocks, starting with the first code block and continuing through the last code block. In some examples, the code block concatenating component 1240 may determine concatenated code block bits for transmission on the transmission resources by concatenating the concatenated third set of coded bits first, followed by the concatenated fourth set of coded bits.

In some examples, the code block concatenating component 1240 may determine a ratio between the first set of transmission resources and the second set of transmission resources. In some examples, the code block concatenating component 1240 may determine a size of the first set of coded bits and a size of the second set of coded bits based on the ratio. In some cases, the size of the first set of coded bits and the size of the second set of coded bits is further based on a number of code blocks corresponding to the bit sequence being transmitted.

The mapping component 1245 may map coded bits of the message to the first set of transmission resources in the TTI before mapping to the second set of transmission resources in the TTI. In some examples, the mapping component 1245 may map the coded bits via a frequency-first mapping, where the first set of transmission resources and the second set of transmission resources are orthogonal frequency-division multiplexing (OFDM) symbols. In some examples, the mapping component 1245 may identify that the TTI includes at least two or more slots.

In some examples, the mapping component 1245 may determine, for each of the at least two or more slots, a first subset of transmission resources that belong to the first set of transmission resources and that are for transmitting in a corresponding slot. In some examples, the mapping component 1245 may determine a mapping order to map the coded bits based on the first subsets of transmission resources of each slot. In some examples, the mapping component 1245 may map the coded bits based on the mapping order.

In some examples, the mapping component 1245 may map first to the first subset of transmission resources of a corresponding slot, starting with a first slot of the at least two or more slots and continuing through to a last slot of the at least two or more slots. In some examples, the mapping component 1245 may map next to a second subset of transmission resources of a corresponding slot, starting with the first slot and continuing through to the last slot. In some examples, the mapping component 1245 may map first to the first subset of transmission resources of a corresponding slot. In some examples, the mapping component 1245 may map next to a second subset of transmission resources of the corresponding slot. In some examples, the mapping component 1245 may map each slot sequentially, starting with a first slot of the at least two or more slots and continuing through to a last slot of the at least two or more slots.

The bit sequence receiving component 1250 may receive, at a second device, a bit sequence from a first device in a TTI. The bit sequence decoding component 1255 may decode the bit sequence based on the first set of transmission resources in the TTI having a higher priority than the second set of transmission resources in the TTI.

In some examples, the bit sequence decoding component 1255 may demodulate a first set of modulated symbols of the bit sequence into a first set of columns and a second set of modulated symbols of the bit sequence into a second set of columns. In some examples, the bit sequence decoding component 1255 may de-interleave the first set of modulated symbols and the second set of modulated symbols based on a majority of a set of systematic bits of a message for the second device being organized into the first set of columns and a majority of parity bits of the message being organized into the second set of columns.

In some examples, the bit sequence decoding component 1255 may determine one or more code blocks corresponding to the message for the second device based on de-interleaving the first set of modulated symbols and the second set of modulated symbols.

In some examples, the bit sequence decoding component 1255 may read in a bit-interleaved set of systematic bits and set of parity bits row-wise, starting with a first column and continuing until a last column. In some examples, the bit sequence decoding component 1255 may de-interleave to write the set of systematic bits and the set of parity bits column-wise within the first set of columns first, and then column-wise within the second set of columns next, where the set of systematic bits and the set of parity bits are organized in row-column manner, where a number of rows depends on a modulated symbol order of the first set of modulated symbols and the second set of modulated symbols.

In some examples, the bit sequence decoding component 1255 may determine a ratio between the first set of transmission resources and the second set of transmission resources, where the first set of modulated symbols and the second set of modulated symbols are organized based on the ratio. In some examples, the bit sequence decoding component 1255 may determine a size of the first set of coded bits and a size of the second set of coded bits is based on a ratio between the first set of transmission resources and the second set of transmission resources. In some examples, the bit sequence decoding component 1255 may determine coded bits of a message for the second device were mapped to the first set of transmission resources in the TTI before coded bits of the message were mapped to the second set of transmission resources in the TTI.

In some examples, the bit sequence decoding component 1255 may determine the coded bits were mapped via a frequency-first mapping, where the first set of transmission resources and the second set of transmission resources are OFDM symbols. In some examples, the bit sequence decoding component 1255 may determine that the TTI includes at least two or more slots.

In some examples, the bit sequence decoding component 1255 may determine, for each of the at least two or more slots, a first subset of transmission resources that belong to the first set of transmission resources and that are for transmitting in a corresponding slot. In some examples, the bit sequence decoding component 1255 may determine a mapping order of the coded bits based on the first subsets of transmission resources of each slot. In some examples, the bit sequence decoding component 1255 may determine the coded bits based on the mapping order.

In some examples, the bit sequence decoding component 1255 may determine the transmitter first mapped the coded bits to the first subset of transmission resources of a corresponding slot, starting with a first slot of the at least two or more slots and continuing through to a last slot of the at least two or more slots. In some examples, the bit sequence decoding component 1255 may determine the transmitter next mapped the coded bits to a second subset of transmission resources of a corresponding slot, starting with the first slot and continuing through to the last slot.

In some examples, the bit sequence decoding component 1255 may determine the transmitter first mapped the coded bits to the first subset of transmission resources of a corresponding slot. In some examples, the bit sequence decoding component 1255 may determine the transmitter next mapped the coded bits to a second subset of transmission resources of the corresponding slot.

In some examples, the bit sequence decoding component 1255 may determine the transmitter then mapped the coded bits to each slot sequentially, starting with a first slot of the at least two or more slots and continuing through to a last slot of the at least two or more slots. In some cases, the first set of modulated symbols and the second set of modulated symbols are organized based on a number of code blocks used to transmit the bit sequence.

In some cases, the bit sequence includes a set of concatenated code blocks that each include a set of systematic bits and a set of parity bits. In some cases, the size of the first set of coded bits and the size of the second set of coded bits is further based on a number of code blocks corresponding to the bit sequence being transmitted.

In some examples, the LDPC base graph component 1230 may determine a target code rate for the bit sequence based on exclusion of the number of second transmission resources from a calculation of the target code rate. In some examples, the LDPC base graph component 1230 may select an LDPC base graph for use in decoding the bit sequence based on the target code rate.

In some examples, the LDPC base graph component 1230 may determine the target code rate based on a function that includes a first input target code rate and a second input target code rate, where the first input target code rate is based on exclusion of the number of second transmission resources from the calculation of the first input target code rate, and where the second input target code rate is based on inclusion of the number of second transmission resources in the calculation of the second input target code rate. In some examples, the LDPC base graph component 1230 may transmit feedback to the first device based on the decoding. In some examples, the LDPC base graph component 1230 may adapt the function over time based on the feedback. In some cases, the function includes a weighting of the first input target code rate and the second input target code rate based on a traffic type of a message for the second device.

Figure 13:
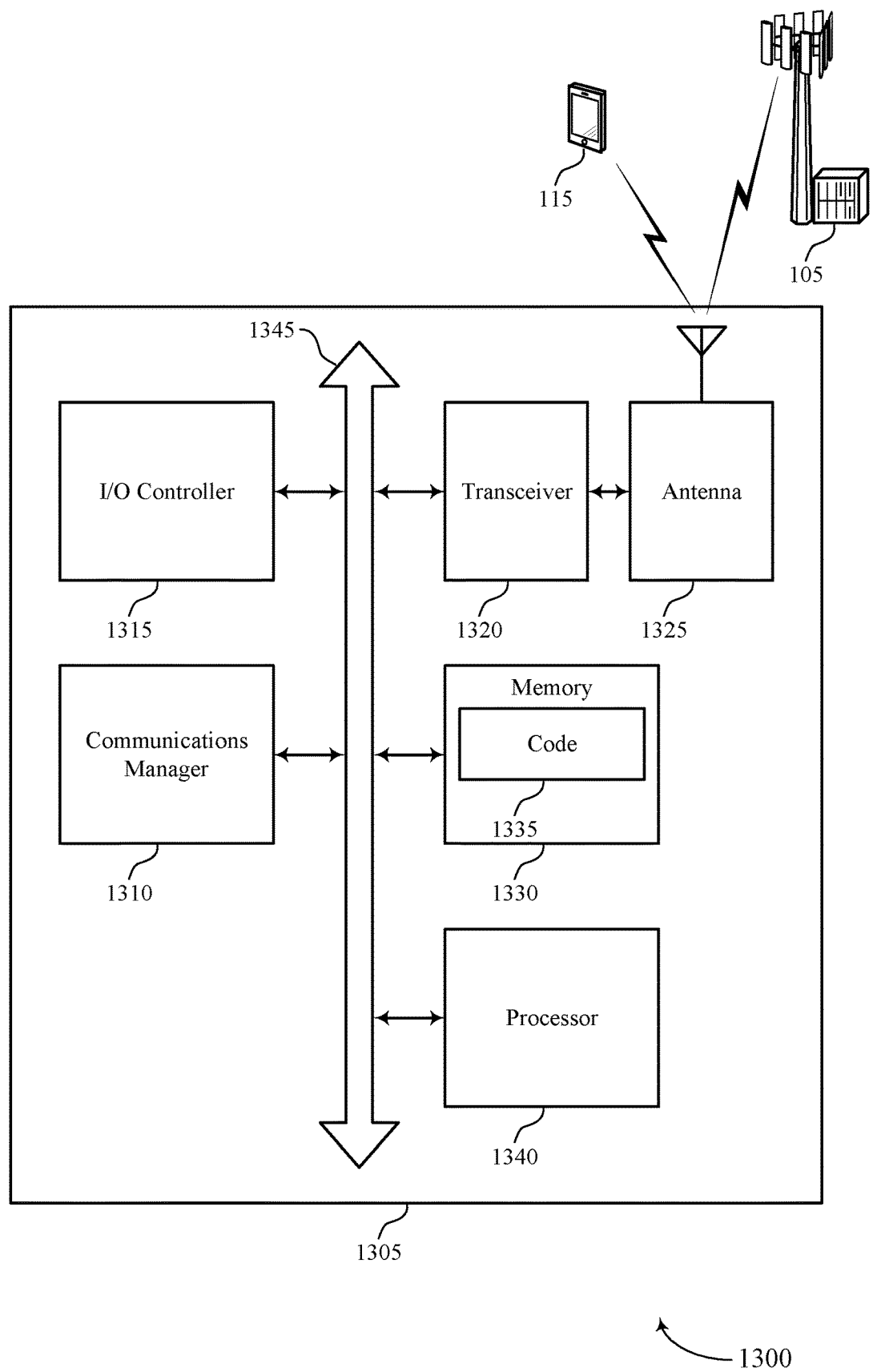
FIG. 13 shows a diagram of a system including a device that supports transmission methods to handle vulnerable symbols in accordance with aspects of the present disclosure.

FIG. 13 shows a diagram of a system 1300 including a device 1305 that supports transmission methods to handle vulnerable symbols in accordance with aspects of the present disclosure. The device 1305 may be an example of or include the components of device 1005, device 1105, a base station 105, or a UE 115 as described herein. The device 1305 may include components for bi-directional voice and data communications including components for transmitting and receiving communications, including a communications manager 1310, an I/O controller 1315, a transceiver 1320, an antenna 1325, memory 1330, and a processor 1340. These components may be in electronic communication via one or more buses (e.g., bus 1345). In some cases, such as if the device 1305 is a base station 105, the device 1305 may include an inter-base station communications manager, which may handle communications with another base station 105, such as over backhaul links.

The communications manager 1310 may determine, at a first device, that a first set of transmission resources in a TTI has a higher priority at a second device than a second set of transmission resources in the TTI, and transmit a bit sequence to the second device via the TTI, where the bit sequence is based on the first set of transmission resources in the TTI having a higher priority than the second set of transmission resources in the TTI. For example, the communications manager 1310 may identify, at a first device, that a first set of transmission resources in a TTI has a higher priority at a second device than a second set of transmission resources in the TTI, identify that a message is to be transmitted from the first device to the second device via the TTI, process the message into a bit sequence based on the identification of the second set of transmission resources in the TTI, where the processing increases a likelihood that systematic bits of the message are received at the second device despite presence of the second set of transmission resources in the TTI, and transmit the bit sequence to the second device via the TTI.

The communications manager 1310 may also receive, at a second device, a bit sequence from a first device in a TTI, determine that a first set of transmission resources in the TTI has a higher priority at the second device than a second set of transmission resources in the TTI, and decode the bit sequence based on the first set of transmission resources in the TTI having a higher priority than the second set of transmission resources in the TTI.

The I/O controller 1315 may manage input and output signals for the device 1305. The I/O controller 1315 may also manage peripherals not integrated into the device 1305. In some cases, the I/O controller 1315 may represent a physical connection or port to an external peripheral. In some cases, the I/O controller 1315 may utilize an operating system such as iOS®, ANDROID®, MS-DOS®, MS-WINDOWS®, OS/2®, UNIX®, LINUX®, or another known operating system. In other cases, the I/O controller 1315 may represent or interact with a modem, a keyboard, a mouse, a touchscreen, or a similar device. In some cases, the I/O controller 1315 may be implemented as part of a processor. In some cases, a user may interact with the device 1305 via the I/O controller 1315 or via hardware components controlled by the I/O controller 1315.

The transceiver 1320 may communicate bi-directionally, via one or more antennas, wired, or wireless links as described above. For example, the transceiver 1320 may represent a wireless transceiver and may communicate bi-directionally with another wireless transceiver. The transceiver 1320 may also include a modem to modulate the packets and provide the modulated packets to the antennas for transmission, and to demodulate packets received from the antennas.

In some cases, the wireless device may include a single antenna 1325. However, in some cases the device may have more than one antenna 1325, which may be capable of concurrently transmitting or receiving multiple wireless transmissions.

The memory 1330 may include RAM and ROM. The memory 1330 may store computer-readable, computer-executable code 1335 including instructions that, when executed, cause the processor to perform various functions described herein. In some cases, the memory 1330 may contain, among other things, a BIOS which may control basic hardware or software operation such as the interaction with peripheral components or devices.

The processor 1340 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 1340 may be configured to operate a memory array using a memory controller. In other cases, a memory controller may be integrated into the processor 1340. The processor 1340 may be configured to execute computer-readable instructions stored in a memory (e.g., the memory 1330) to cause the device 1305 to perform various functions (e.g., functions or tasks supporting transmission methods to handle vulnerable symbols).

The code 1335 may include instructions to implement aspects of the present disclosure, including instructions to support wireless communications. The code 1335 may be stored in a non-transitory computer-readable medium such as system memory or other type of memory. In some cases, the code 1335 may not be directly executable by the processor 1340 but may cause a computer (e.g., when compiled and executed) to perform functions described herein.

Figure 14:
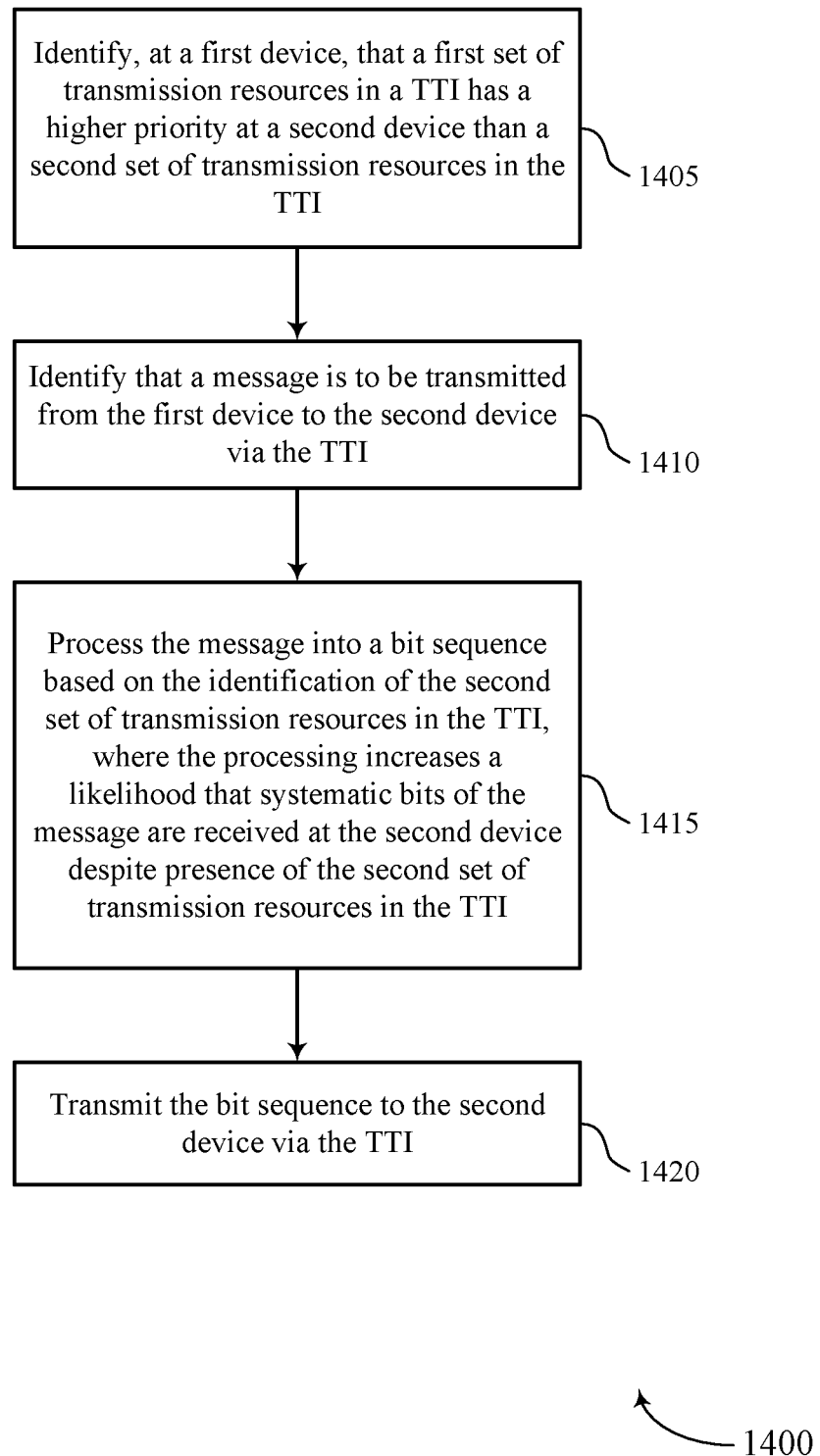
FIGS. 14 through 20 show flowcharts illustrating methods that support transmission methods to handle vulnerable symbols in accordance with aspects of the present disclosure.

FIG. 14 shows a flowchart illustrating a method 1400 that supports transmission methods to handle vulnerable symbols in accordance with aspects of the present disclosure. The operations of method 1400 may be implemented by a UE 115 or its components as described herein. For example, the operations of method 1400 may be performed by a communications manager as described with reference to FIGS. 10 through 13. In some examples, a UE may execute a set of instructions to control the functional elements of the UE to perform the functions described below. Additionally or alternatively, a UE may perform aspects of the functions described below using special-purpose hardware.

At 1405, the UE may identify, at a first device, that a first set of transmission resources in a TTI has a higher priority at a second device than a second set of transmission resources in the TTI. The operations of 1405 may be performed according to the methods described herein. In some examples, aspects of the operations of 1405 may be performed by a transmission resource component as described with reference to FIGS. 10 through 13.

At 1410, the UE may identify that a message is to be transmitted from the first device to the second device via the TTI. The operations of 1410 may be performed according to the methods described herein. In some examples, aspects of the operations of 1410 may be performed by a message identifying component as described with reference to FIGS. 10 through 13.

At 1415, the UE may process the message into a bit sequence based on the identification of the second set of transmission resources in the TTI, where the processing increases a likelihood that systematic bits of the message are received at the second device despite presence of the second set of transmission resources in the TTI. The operations of 1415 may be performed according to the methods described herein. In some examples, aspects of the operations of 1415 may be performed by a message processing component as described with reference to FIGS. 10 through 13.

At 1420, the UE may transmit the bit sequence to the second device via the TTI. The operations of 1420 may be performed according to the methods described herein. In some examples, aspects of the operations of 1420 may be performed by a bit sequence transmitting component as described with reference to FIGS. 10 through 13.

Figure 15:
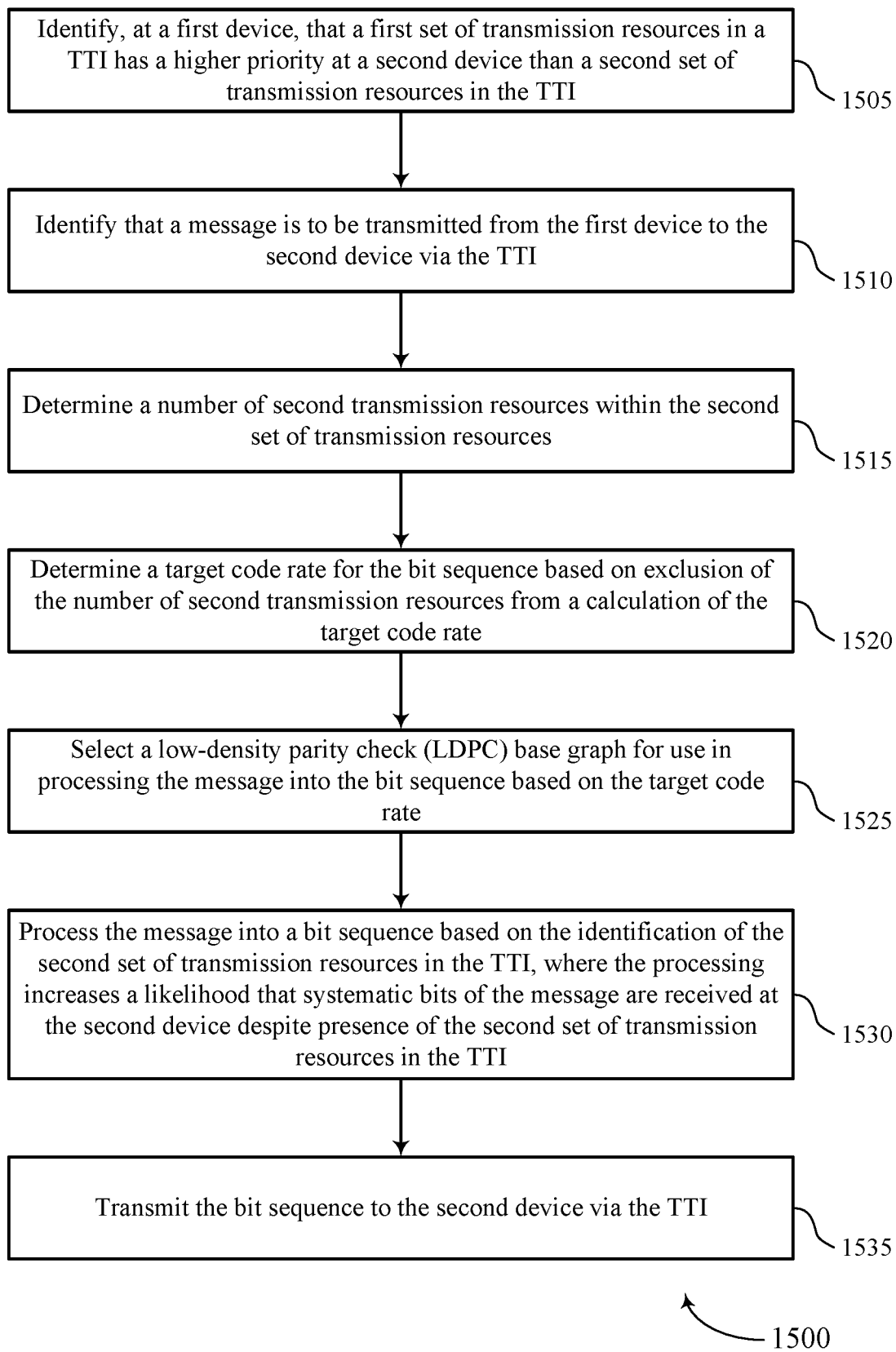

FIG. 15 shows a flowchart illustrating a method 1500 that supports transmission methods to handle vulnerable symbols in accordance with aspects of the present disclosure. The operations of method 1500 may be implemented by a UE 115 or its components as described herein. For example, the operations of method 1500 may be performed by a communications manager as described with reference to FIGS. 10 through 13. In some examples, a UE may execute a set of instructions to control the functional elements of the UE to perform the functions described below. Additionally or alternatively, a UE may perform aspects of the functions described below using special-purpose hardware.

At 1505, the UE may identify, at a first device, that a first set of transmission resources in a TTI has a higher priority at a second device than a second set of transmission resources in the TTI. The operations of 1505 may be performed according to the methods described herein. In some examples, aspects of the operations of 1505 may be performed by a transmission resource component as described with reference to FIGS. 10 through 13.

At 1510, the UE may identify that a message is to be transmitted from the first device to the second device via the TTI. The operations of 1510 may be performed according to the methods described herein. In some examples, aspects of the operations of 1510 may be performed by a message identifying component as described with reference to FIGS. 10 through 13.

At 1515, the UE may determine a number of second transmission resources within the second set of transmission resources. The operations of 1515 may be performed according to the methods described herein. In some examples, aspects of the operations of 1515 may be performed by a LDPC base graph component as described with reference to FIGS. 10 through 13.

At 1520, the UE may determine a target code rate for the bit sequence based on exclusion of the number of second transmission resources from a calculation of the target code rate. The operations of 1520 may be performed according to the methods described herein. In some examples, aspects of the operations of 1520 may be performed by a LDPC base graph component as described with reference to FIGS. 10 through 13.

At 1525, the UE may select a low-density parity check (LDPC) base graph for use in processing the message into the bit sequence based on the target code rate. The operations of 1525 may be performed according to the methods described herein. In some examples, aspects of the operations of 1525 may be performed by a LDPC base graph component as described with reference to FIGS. 10 through 13.

At 1530, the UE may process the message into a bit sequence based on the identification of the second set of transmission resources in the TTI, where the processing increases a likelihood that systematic bits of the message are received at the second device despite presence of the second set of transmission resources in the TTI. The operations of 1530 may be performed according to the methods described herein. In some examples, aspects of the operations of 1530 may be performed by a message processing component as described with reference to FIGS. 10 through 13.

At 1535, the UE may transmit the bit sequence to the second device via the TTI. The operations of 1535 may be performed according to the methods described herein. In some examples, aspects of the operations of 1535 may be performed by a bit sequence transmitting component as described with reference to FIGS. 10 through 13.

Figure 16:
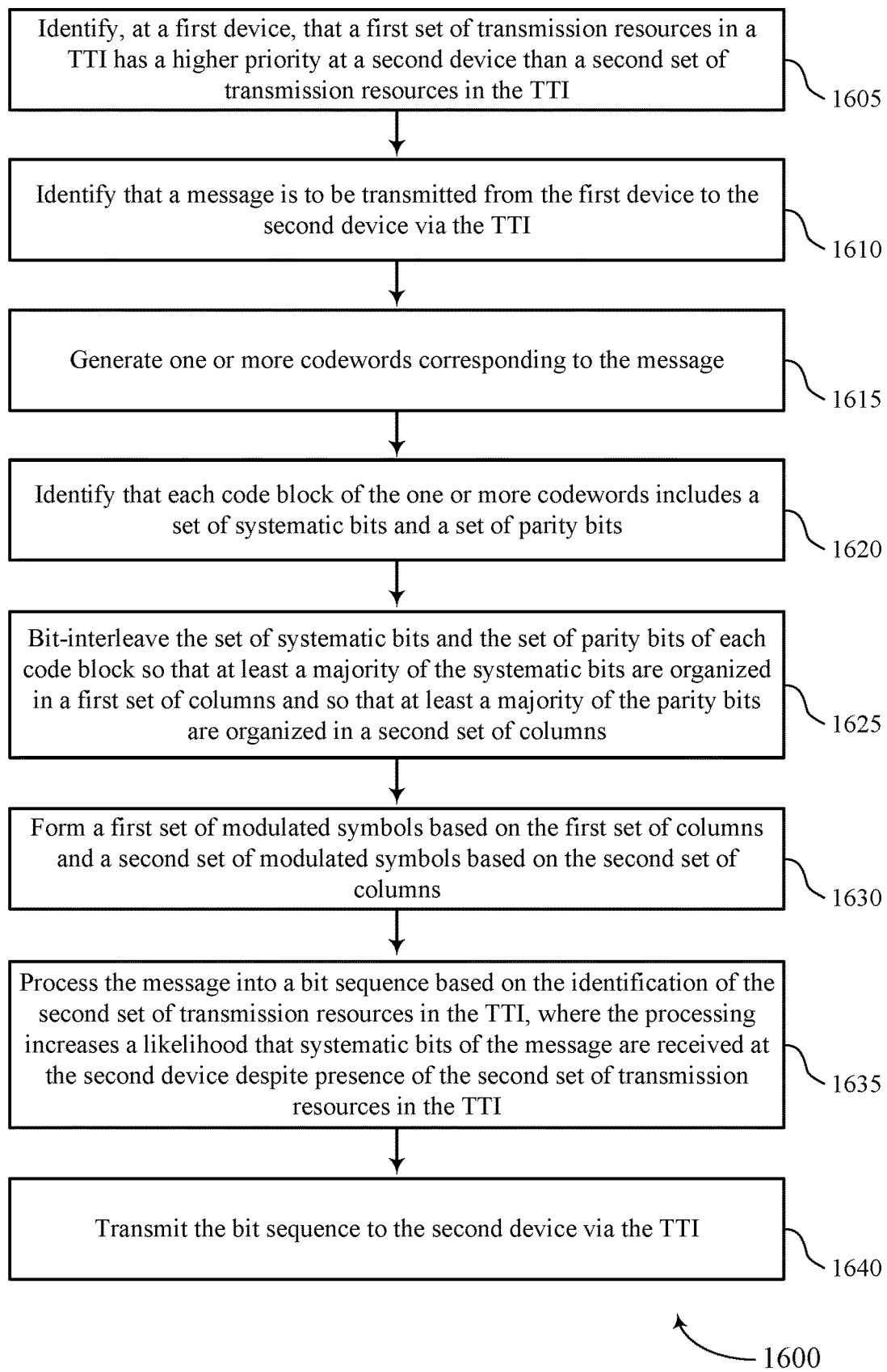

FIG. 16 shows a flowchart illustrating a method 1600 that supports transmission methods to handle vulnerable symbols in accordance with aspects of the present disclosure. The operations of method 1600 may be implemented by a UE 115 or its components as described herein. For example, the operations of method 1600 may be performed by a communications manager as described with reference to FIGS. 10 through 13. In some examples, a UE may execute a set of instructions to control the functional elements of the UE to perform the functions described below. Additionally or alternatively, a UE may perform aspects of the functions described below using special-purpose hardware.

At 1605, the UE may identify, at a first device, that a first set of transmission resources in a TTI has a higher priority at a second device than a second set of transmission resources in the TTI. The operations of 1605 may be performed according to the methods described herein. In some examples, aspects of the operations of 1605 may be performed by a transmission resource component as described with reference to FIGS. 10 through 13.

At 1610, the UE may identify that a message is to be transmitted from the first device to the second device via the TTI. The operations of 1610 may be performed according to the methods described herein. In some examples, aspects of the operations of 1610 may be performed by a message identifying component as described with reference to FIGS. 10 through 13.

At 1615, the UE may generate one or more code blocks corresponding to the message. The operations of 1615 may be performed according to the methods described herein. In some examples, aspects of the operations of 1615 may be performed by a bit-interleaving component as described with reference to FIGS. 10 through 13.

At 1620, the UE may identify that each code block includes a set of systematic bits and a set of parity bits. The operations of 1620 may be performed according to the methods described herein. In some examples, aspects of the operations of 1620 may be performed by a bit-interleaving component as described with reference to FIGS. 10 through 13.

At 1625, the UE may bit-interleave the set of systematic bits and the set of parity bits of each code block so that at least a majority of the systematic bits are organized in a first set of columns and so that at least a majority of the parity bits are organized in a second set of columns. The operations of 1625 may be performed according to the methods described herein. In some examples, aspects of the operations of 1625 may be performed by a bit-interleaving component as described with reference to FIGS. 10 through 13.

At 1630, the UE may form a first set of modulated symbols based on the first set of columns and a second set of modulated symbols based on the second set of columns. The operations of 1630 may be performed according to the methods described herein. In some examples, aspects of the operations of 1630 may be performed by a bit-interleaving component as described with reference to FIGS. 10 through 13.

At 1635, the UE may process the message into a bit sequence based on the identification of the second set of transmission resources in the TTI, where the processing increases a likelihood that systematic bits of the message are received at the second device despite presence of the second set of transmission resources in the TTI. The operations of 1635 may be performed according to the methods described herein. In some examples, aspects of the operations of 1635 may be performed by a message processing component as described with reference to FIGS. 10 through 13.

At 1640, the UE may transmit the bit sequence to the second device via the TTI. The operations of 1640 may be performed according to the methods described herein. In some examples, aspects of the operations of 1640 may be performed by a bit sequence transmitting component as described with reference to FIGS. 10 through 13.

Figure 17:
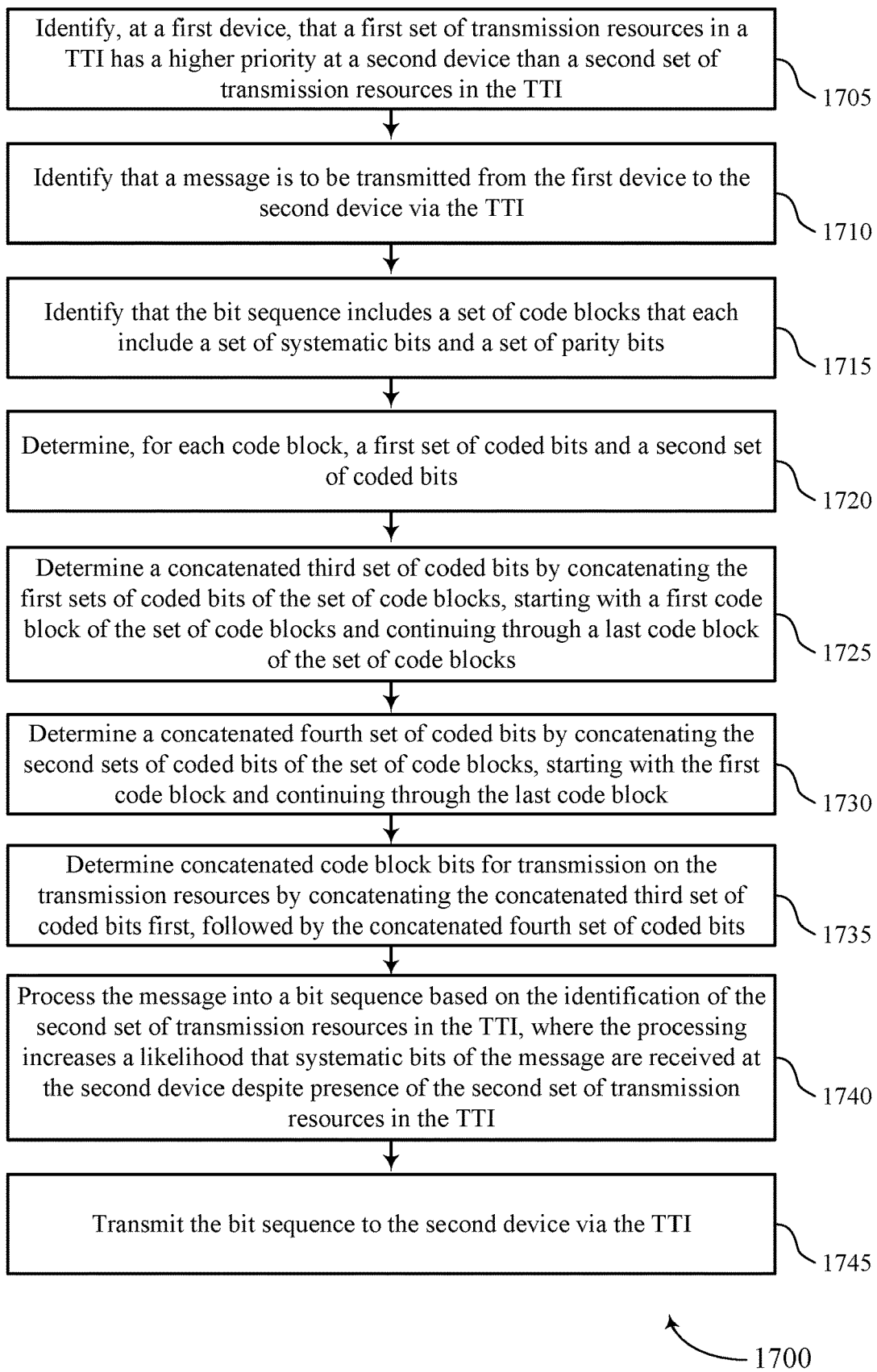

FIG. 17 shows a flowchart illustrating a method 1700 that supports transmission methods to handle vulnerable symbols in accordance with aspects of the present disclosure. The operations of method 1700 may be implemented by a UE 115 or its components as described herein. For example, the operations of method 1700 may be performed by a communications manager as described with reference to FIGS. 10 through 13. In some examples, a UE may execute a set of instructions to control the functional elements of the UE to perform the functions described below. Additionally or alternatively, a UE may perform aspects of the functions described below using special-purpose hardware.

At 1705, the UE may identify, at a first device, that a first set of transmission resources in a TTI has a higher priority at a second device than a second set of transmission resources in the TTI. The operations of 1705 may be performed according to the methods described herein. In some examples, aspects of the operations of 1705 may be performed by a transmission resource component as described with reference to FIGS. 10 through 13.

At 1710, the UE may identify that a message is to be transmitted from the first device to the second device via the TTI. The operations of 1710 may be performed according to the methods described herein. In some examples, aspects of the operations of 1710 may be performed by a message identifying component as described with reference to FIGS. 10 through 13.

At 1715, the UE may identify that the bit sequence includes a set of code blocks that each include a set of systematic bits and a set of parity bits. The operations of 1715 may be performed according to the methods described herein. In some examples, aspects of the operations of 1715 may be performed by a code block concatenating component as described with reference to FIGS. 10 through 13.

At 1720, the UE may determine, for each code block, a first set of coded bits and a second set of coded bits. The operations of 1720 may be performed according to the methods described herein. In some examples, aspects of the operations of 1720 may be performed by a code block concatenating component as described with reference to FIGS. 10 through 13.

At 1725, the UE may determine a concatenated third set of coded bits by concatenating the first sets of coded bits of the set of code blocks, starting with a first code block of the set of code blocks and continuing through a last code block of the set of code blocks. The operations of 1725 may be performed according to the methods described herein. In some examples, aspects of the operations of 1725 may be performed by a code block concatenating component as described with reference to FIGS. 10 through 13.

At 1730, the UE may determine a concatenated fourth set of coded bits by concatenating the second sets of coded bits of the set of code blocks, starting with the first code block and continuing through the last code block. The operations of 1730 may be performed according to the methods described herein. In some examples, aspects of the operations of 1730 may be performed by a code block concatenating component as described with reference to FIGS. 10 through 13.

At 1735, the UE may determine concatenated code block bits for transmission on the transmission resources by concatenating the concatenated third set of coded bits first, followed by the concatenated fourth set of coded bits. The operations of 1735 may be performed according to the methods described herein. In some examples, aspects of the operations of 1735 may be performed by a code block concatenating component as described with reference to FIGS. 10 through 13.

At 1740, the UE may process the message into a bit sequence based on the identification of the second set of transmission resources in the TTI, where the processing increases a likelihood that systematic bits of the message are received at the second device despite presence of the second set of transmission resources in the TTI. The operations of 1740 may be performed according to the methods described herein. In some examples, aspects of the operations of 1740 may be performed by a message processing component as described with reference to FIGS. 10 through 13.

At 1745, the UE may transmit the bit sequence to the second device via the TTI. The operations of 1745 may be performed according to the methods described herein. In some examples, aspects of the operations of 1745 may be performed by a bit sequence transmitting component as described with reference to FIGS. 10 through 13.

Figure 18:
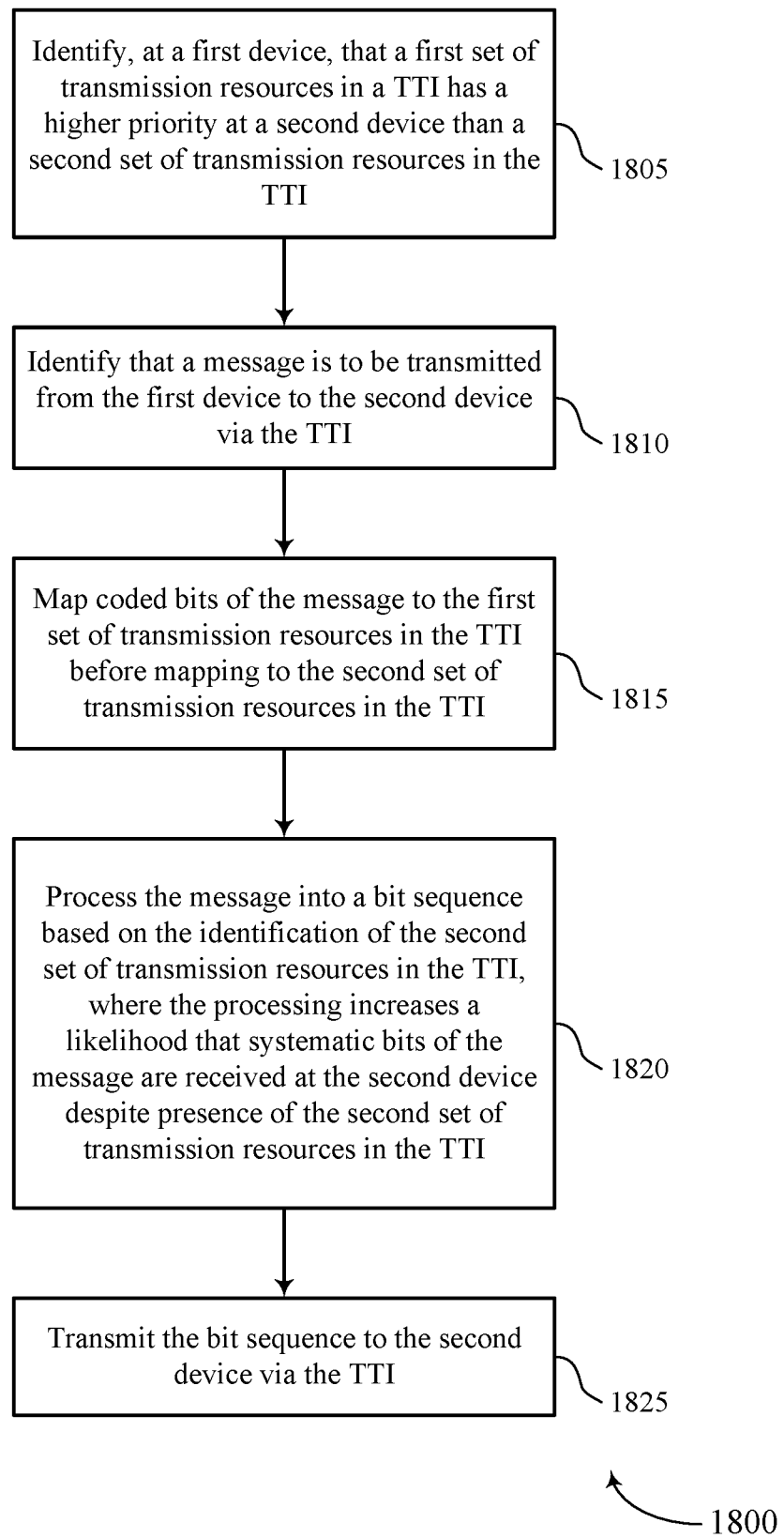

FIG. 18 shows a flowchart illustrating a method 1800 that supports transmission methods to handle vulnerable symbols in accordance with aspects of the present disclosure. The operations of method 1800 may be implemented by a UE 115 or its components as described herein. For example, the operations of method 1800 may be performed by a communications manager as described with reference to FIGS. 10 through 13. In some examples, a UE may execute a set of instructions to control the functional elements of the UE to perform the functions described below. Additionally or alternatively, a UE may perform aspects of the functions described below using special-purpose hardware.

At 1805, the UE may identify, at a first device, that a first set of transmission resources in a TTI has a higher priority at a second device than a second set of transmission resources in the TTI. The operations of 1805 may be performed according to the methods described herein. In some examples, aspects of the operations of 1805 may be performed by a transmission resource component as described with reference to FIGS. 10 through 13.

At 1810, the UE may identify that a message is to be transmitted from the first device to the second device via the TTI. The operations of 1810 may be performed according to the methods described herein. In some examples, aspects of the operations of 1810 may be performed by a message identifying component as described with reference to FIGS. 10 through 13.

At 1815, the UE may map coded bits of the message to the first set of transmission resources in the TTI before mapping to the second set of transmission resources in the TTI. The operations of 1815 may be performed according to the methods described herein. In some examples, aspects of the operations of 1815 may be performed by a mapping component as described with reference to FIGS. 10 through 13.

At 1820, the UE may process the message into a bit sequence based on the identification of the second set of transmission resources in the TTI, where the processing increases a likelihood that systematic bits of the message are received at the second device despite presence of the second set of transmission resources in the TTI. The operations of 1820 may be performed according to the methods described herein. In some examples, aspects of the operations of 1820 may be performed by a message processing component as described with reference to FIGS. 10 through 13.

At 1825, the UE may transmit the bit sequence to the second device via the TTI. The operations of 1825 may be performed according to the methods described herein. In some examples, aspects of the operations of 1825 may be performed by a bit sequence transmitting component as described with reference to FIGS. 10 through 13.

Figure 19:
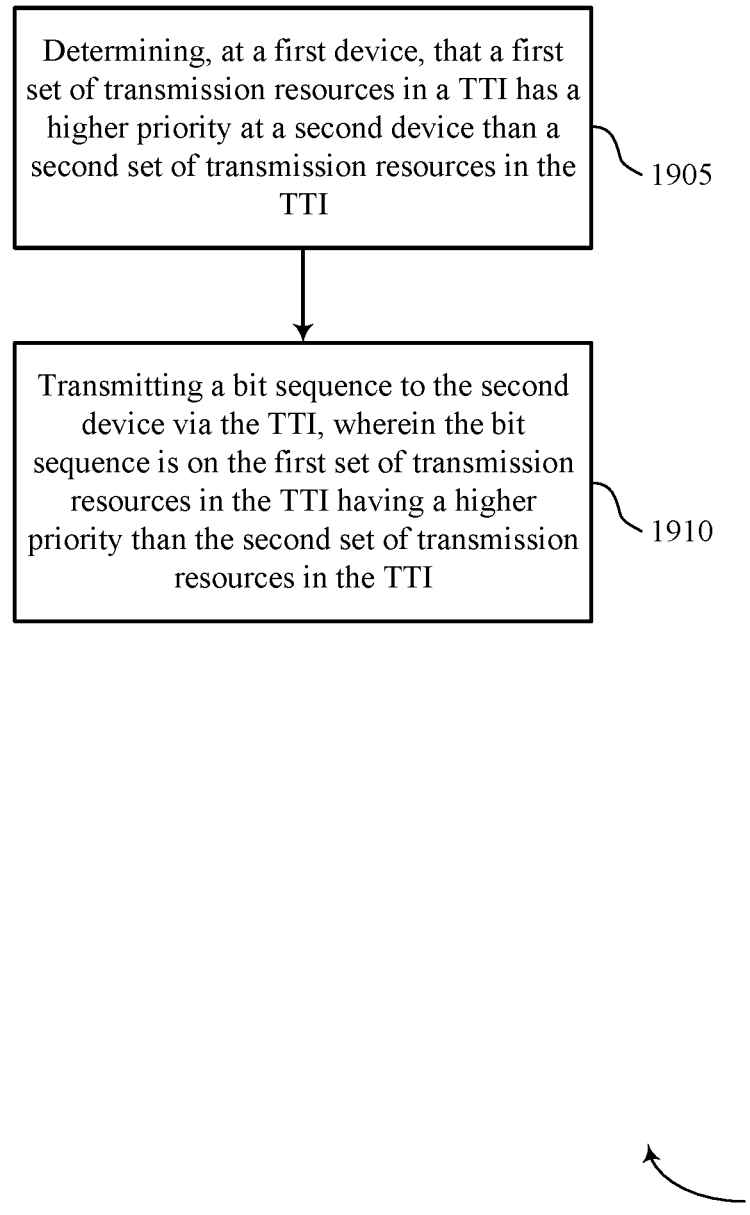

FIG. 19 shows a flowchart illustrating a method 1900 that supports transmission methods to handle vulnerable symbols in accordance with aspects of the present disclosure. The operations of method 1900 may be implemented by a device, such as a UE 115 or its components as described herein. For example, the operations of method 1900 may be performed by a communications manager as described with reference to FIGS. 10 through 13. In some examples, a device may execute a set of instructions to control the functional elements of the device to perform the functions described below. Additionally or alternatively, a device may perform aspects of the functions described below using special-purpose hardware.

At 1905, a first device (e.g., a transmitting device) may determine that a first set of transmission resources in a TTI has a higher priority at a second device than a second set of transmission resources in the TTI. The operations of 1905 may be performed according to the methods described herein. In some examples, aspects of the operations of 1905 may be performed by a transmission resource component as described with reference to FIGS. 10 through 13.

At 1910, the first device may transmit a bit sequence to the second device via the TTI, wherein the bit sequence is on the first set of transmission resources in the TTI having a higher priority than the second set of transmission resources in the TTI. The operations of 1910 may be performed according to the methods described herein. In some examples, aspects of the operations of 1910 may be performed by a bit sequence transmitting component as described with reference to FIGS. 10 through 13.

Figure 20:
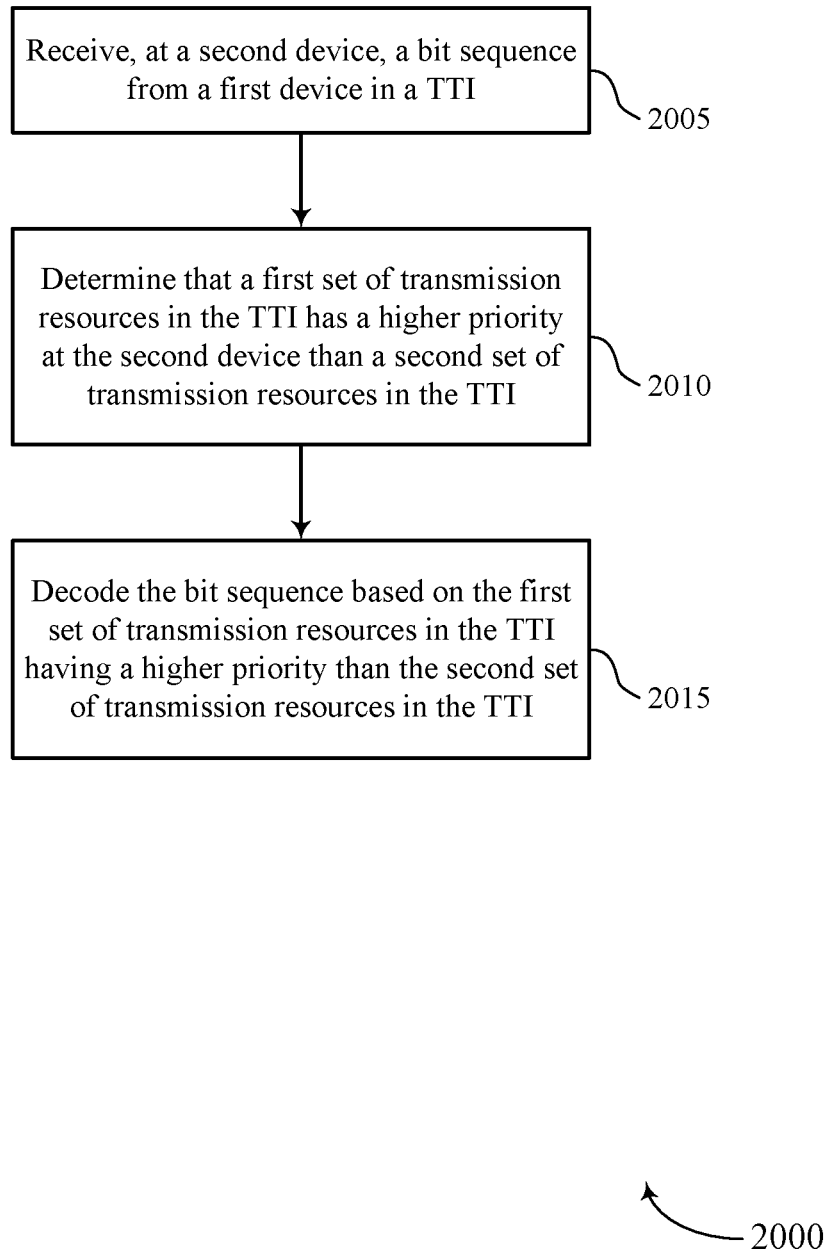

FIG. 20 shows a flowchart illustrating a method 2000 that supports transmission methods to handle vulnerable symbols in accordance with aspects of the present disclosure. The operations of method 2000 may be implemented by a device, such as a UE 115 or its components as described herein. For example, the operations of method 2000 may be performed by a communications manager as described with reference to FIGS. 10 through 13. In some examples, a device may execute a set of instructions to control the functional elements of the device to perform the functions described below. Additionally or alternatively, a device may perform aspects of the functions described below using special-purpose hardware.

At 2005, a second device (e.g., a receiving device) may receive a bit sequence from a first device in a TTI. The operations of 2005 may be performed according to the methods described herein. In some examples, aspects of the operations of 2005 may be performed by a bit sequence receiving component as described with reference to FIGS. 10 through 13.

At 2010, the second device may determine that a first set of transmission resources in the TTI has a higher priority at the second device than a second set of transmission resources in the TTI. The operations of 2010 may be performed according to the methods described herein. In some examples, aspects of the operations of 2010 may be performed by a transmission resource component as described with reference to FIGS. 10 through 13.

At 2015, the second device may decode the bit sequence based on the first set of transmission resources in the TTI having a higher priority than the second set of transmission resources in the TTI. The operations of 2015 may be performed according to the methods described herein. In some examples, aspects of the operations of 2015 may be performed by a bit sequence decoding component as described with reference to FIGS. 10 through 13.

It should be noted that the methods described herein describe possible implementations, and that the operations and the steps may be rearranged or otherwise modified and that other implementations are possible. Further, aspects from two or more of the methods may be combined.

Example 1

A method for wireless communication, comprising determining, at a first device, that a first set of transmission resources in a transmission time interval (TTI) has a higher priority at a second device than a second set of transmission resources in the TTI; and transmitting a bit sequence to the second device via the TTI, wherein the bit sequence is based at least in part on the first set of transmission resources in the TTI having a higher priority than the second set of transmission resources in the TTI.

Example 2

The method of example 1, wherein at least one of the first set of transmission resources or the second set of transmission resources are configured.

Example 3

The method of example 1, wherein transmission resources are selected or assigned within a resource pool; and at least one of the first set of transmission resources or the second set of transmission resources are based at least in part on one or more configurations of the resource pool.

Example 4

The method of example 1, wherein determining that the first set of transmission resources has a higher priority at the second device than the second set of transmission resources is based at least in part on a radio resource control (RRC) configuration of a resource pool that includes the first set of transmission resources and the second set of transmission resources.

Example 5

The method of example 4, wherein determining that the first set of transmission resources has a higher priority at the second device than the second set of transmission resources comprises: determining that the second set of transmission resources is more likely to be punctured at the second device than the first set of transmission resources.

Example 6

The method of example 1, further comprising: determining a number of second transmission resources within the second set of transmission resources; determining a target code rate for the bit sequence based at least in part on exclusion of the number of second transmission resources from a calculation of the target code rate; and selecting a low-density parity check (LDPC) base graph for use in processing the message into the bit sequence based at least in part on the target code rate.

Example 7

The method of example 6, wherein determining the target code rate for the bit sequence further comprises: determining the target code rate based on a function that includes a first input target code rate and a second input target code rate, wherein the first input target code rate is based on exclusion of the number of second transmission resources from the calculation of the first input target code rate, and wherein the second input target code rate is based on inclusion of the number of second transmission resources in the calculation of the second input target code rate.

Example 8

The method of example 7, wherein the function includes a weighting of the first input target code rate and the second input target code rate based at least in part on a traffic type of a message for the second device.

Example 9

The method of example 8, wherein the first input target code rate is weighted more heavily than the second input target code rate when the traffic type is unicast.

Example 10

The method of example 8, wherein the second input target code rate is weighted more heavily than the first input target code rate when the traffic type is multicast.

Example 11

The method of example 8, wherein the second input target code rate is weighted more heavily than the first input target code rate when the traffic type is broadcast.

Example 12

The method of example 7, further comprising: adapting the function over time based at least in part on feedback received from one or more second devices.

Example 13

The method of example 1, further comprising: generating one or more code blocks corresponding to a message for the second device, wherein each code block includes a plurality of systematic bits and a plurality of parity bits; bit-interleaving the plurality of systematic bits and the plurality of parity bits of each code block so that at least a majority of the systematic bits are organized in a first set of columns and so that at least a majority of the parity bits are organized in a second set of columns; and forming a first set of modulated symbols corresponding to the bit sequence based on the first set of columns and a second set of modulated symbols based on the second set of columns.

Example 14

The method of example 13, wherein bit-interleaving the plurality of systematic bits and the plurality of parity bits of each code block comprises: organizing the plurality of systematic bits and the plurality of parity bits in row-column manner, where a number of rows depends on a modulated symbol order of the first set of modulated symbols and the second set of modulated symbols; bit-interleaving to write the plurality of systematic bits and the plurality of parity bits column-wise within the first set of columns first, and then column-wise within the second set of columns next; and reading out the bit-interleaved plurality of systematic bits and plurality of parity bits row-wise, starting with a first column and continuing until a last column.

Example 15

The method of example 13, wherein bit-interleaving the plurality of systematic bits and the plurality of parity bits of each code block comprises: mapping as many as possible of the systematic bits to the first set of columns; mapping any remainder of the systematic bits to the second set of columns; and mapping the parity bits to either the first set of columns or the second set of columns after the systematic bits are mapped.

Example 16

The method of example 13, further comprising: determining a ratio between the first set of transmission resources and the second set of transmission resources; and organizing the first set of modulated symbols and the second set of modulated symbols based at least in part on the ratio.

Example 17

The method of example 16, wherein: organizing the first set of modulated symbols and the second set of modulated symbols is further based on a number of code blocks used to transmit the bit sequence.

Example 18

The method of example 1, further comprising: determining that the bit sequence includes a plurality of code blocks that each include a plurality of systematic bits and a plurality of parity bits; determining, for each code block, a first set of coded bits and a second set of coded bits; determining a concatenated third set of coded bits by concatenating the first sets of coded bits of the plurality of code blocks, starting with a first code block of the plurality of code blocks and continuing through a last code block of the plurality of code blocks; determining a concatenated fourth set of coded bits by concatenating the second sets of coded bits of the plurality of code blocks, starting with the first code block and continuing through the last code block; and determining concatenated code block bits for transmission on the transmission resources by concatenating the concatenated third set of coded bits first, followed by the concatenated fourth set of coded bits.

Example 19

The method of example 18, further comprising: determining a ratio between the first set of transmission resources and the second set of transmission resources; and determining a size of the first set of coded bits and a size of the second set of coded bits based at least in part on the ratio.

Example 20

The method of example 19, wherein the size of the first set of coded bits and the size of the second set of coded bits is further based on a number of code blocks corresponding to the bit sequence being transmitted.

Example 21

The method of example 1, further comprising: mapping coded bits of a message for the second device to the first set of transmission resources in the TTI before mapping to the second set of transmission resources in the TTI.

Example 22

The method of example 21, wherein the mapping of coded bits of the message comprises: mapping the coded bits via a frequency-first mapping, wherein the first set of transmission resources and the second set of transmission resources are orthogonal frequency-division multiplexing (OFDM) symbols.

Example 23

The method of example 21, wherein the mapping of coded bits of the message comprises: determining that the TTI includes at least two or more slots; determining, for each of the at least two or more slots, a first subset of transmission resources that belong to the first set of transmission resources and that are for transmitting in a corresponding slot; determining a mapping order to map the coded bits based on the first subsets of transmission resources of each slot; and mapping the coded bits based on the mapping order.

Example 24

The method of example 23, wherein determining the mapping order to map the coded bits comprises: mapping first to the first subset of transmission resources of a corresponding slot, starting with a first slot of the at least two or more slots and continuing through to a last slot of the at least two or more slots; and mapping next to a second subset of transmission resources of a corresponding slot, starting with the first slot and continuing through to the last slot.

Example 25

The method of example 23, wherein determining the mapping order to map the coded bits comprises: mapping first to the first subset of transmission resources of a corresponding slot; mapping next to a second subset of transmission resources of the corresponding slot; and mapping each slot sequentially, starting with a first slot of the at least two or more slots and continuing through to a last slot of the at least two or more slots.

Example 26

The method of example 1, wherein the first set of transmission resources comprises a first set of resource elements, and wherein the second set of transmission resources comprises a second set of resource elements.

Example 27

The method of example 1, wherein the first set of transmission resources comprises a first set of orthogonal frequency-division multiplexing (OFDM) symbols, and wherein the second set of transmission resources comprises a second set of OFDM symbols.

Example 28

The method of example 1, wherein the first device and the second device are in communication with each other over a vehicle-to-everything (V2X) network.

Example 29

The method of example 1, wherein the first device and the second device are in communication with each other over a device-to-device (D2D) network.

Example 30

A method for wireless communication, comprising: receiving, at a second device, a bit sequence from a first device in a transmission time interval (TTI); determining that a first set of transmission resources in the TTI has a higher priority at the second device than a second set of transmission resources in the TTI; and decoding the bit sequence based at least in part on the first set of transmission resources in the TTI having a higher priority than the second set of transmission resources in the TTI.

Example 31

The method of example 30, wherein: at least one of the first set of transmission resources or the second set of transmission resources are configured.

Example 32

The method of example 30, further comprising: indicating at least one of the first set of transmission resources or the second set of transmission resources to the second device.

Example 33

The method of example 30, further comprising: determining a number of second transmission resources within the second set of transmission resources; determining a target code rate for the bit sequence based at least in part on exclusion of the number of second transmission resources from a calculation of the target code rate; and selecting a low-density parity check (LDPC) base graph for use in decoding the bit sequence based at least in part on the target code rate.

Example 34

The method of example 33, wherein determining the target code rate for the bit sequence further comprises: determining the target code rate based on a function that includes a first input target code rate and a second input target code rate, wherein the first input target code rate is based on exclusion of the number of second transmission resources from the calculation of the first input target code rate, and wherein the second input target code rate is based on inclusion of the number of second transmission resources in the calculation of the second input target code rate.

Example 35

The method of example 34, wherein the function includes a weighting of the first input target code rate and the second input target code rate based at least in part on a traffic type of a message for the second device.

Example 36

The method of example 35, wherein the first input target code rate is weighted more heavily than the second input target code rate when the traffic type is unicast.

Example 37

The method of example 35, wherein the second input target code rate is weighted more heavily than the first input target code rate when the traffic type is multicast.

Example 38

The method of example 35, wherein the second input target code rate is weighted more heavily than the first input target code rate when the traffic type is broadcast.

Example 39

The method of example 34, further comprising: transmitting feedback to the first device based at least in part on the decoding; and adapting the function over time based at least in part on the feedback.

Example 40

The method of example 30, further comprising: demodulating a first set of modulated symbols of the bit sequence into a first set of columns and a second set of modulated symbols of the bit sequence into a second set of columns; de-interleaving the first set of modulated symbols and the second set of modulated symbols based at least in part on a majority of a plurality of systematic bits of a message for the second device being organized into the first set of columns and a majority of parity bits of the message being organized into the second set of columns; and determining one or more code blocks corresponding to the message for the second device based at least in part on de-interleaving the first set of modulated symbols and the second set of modulated symbols.

Example 41

The method of example 40, wherein de-interleaving the plurality of systematic bits and the plurality of parity bits of each code block comprises: reading in a bit-interleaved plurality of systematic bits and plurality of parity bits row-wise, starting with a first column and continuing until a last column; and de-interleaving to write the plurality of systematic bits and the plurality of parity bits column-wise within the first set of columns first, and then column-wise within the second set of columns next, wherein the plurality of systematic bits and the plurality of parity bits are organized in row-column manner, where a number of rows depends on a modulated symbol order of the first set of modulated symbols and the second set of modulated symbols.

Example 42

The method of example 40, further comprising: determining a ratio between the first set of transmission resources and the second set of transmission resources, wherein the first set of modulated symbols and the second set of modulated symbols are organized based at least in part on the ratio.

Example 43

The method of example 42, wherein the first set of modulated symbols and the second set of modulated symbols are organized based on a number of code blocks used to transmit the bit sequence.

Example 44

The method of example 30, wherein the bit sequence includes a plurality of concatenated code blocks that each include a plurality of systematic bits and a plurality of parity bits.

Example 45

The method of example 44, further comprising: determining a size of the first set of coded bits and a size of the second set of coded bits is based at least in part on a ratio between the first set of transmission resources and the second set of transmission resources.

Example 46

The method of example 45, wherein the size of the first set of coded bits and the size of the second set of coded bits is further based on a number of code blocks corresponding to the bit sequence being transmitted.

Example 47

The method of example 30, further comprising: determining coded bits of a message for the second device were mapped to the first set of transmission resources in the TTI before coded bits of the message were mapped to the second set of transmission resources in the TTI.

Example 48

The method of example 47, wherein the determining comprises: determining the coded bits were mapped via a frequency-first mapping, wherein the first set of transmission resources and the second set of transmission resources are orthogonal frequency-division multiplexing (OFDM) symbols.

Example 49

The method of example 47, wherein the determining comprises: determining that the TTI includes at least two or more slots; determining, for each of the at least two or more slots, a first subset of transmission resources that belong to the first set of transmission resources and that are for transmitting in a corresponding slot; determining a mapping order of the coded bits based on the first subsets of transmission resources of each slot; and determining the coded bits based on the mapping order.

Example 50

The method of example 49, wherein determining the mapping order for mapping of the coded bits comprises: determining the transmitter first mapped the coded bits to the first subset of transmission resources of a corresponding slot, starting with a first slot of the at least two or more slots and continuing through to a last slot of the at least two or more slots; and determining the transmitter next mapped the coded bits to a second subset of transmission resources of a corresponding slot, starting with the first slot and continuing through to the last slot.

Example 51

The method of example 49, wherein determining the mapping order for mapping of the coded bits comprises: determining the transmitter first mapped the coded bits to the first subset of transmission resources of a corresponding slot; determining the transmitter next mapped the coded bits to a second subset of transmission resources of the corresponding slot; and determining the transmitter then mapped the coded bits to each slot sequentially, starting with a first slot of the at least two or more slots and continuing through to a last slot of the at least two or more slots.

Example 52

The method of example 30, wherein the first set of transmission resources comprises a first set of resource elements, and wherein the second set of transmission resources comprises a second set of resource elements.

Example 53

The method of example 30, wherein the first set of transmission resources comprises a first set of orthogonal frequency-division multiplexing (OFDM) symbols, and wherein the second set of transmission resources comprises a second set of OFDM symbols.

Example 54

The method of example 30, wherein the first device and the second device are in communication with each other over a vehicle-to-everything (V2X) network.

Example 55

The method of example 30, wherein the first device and the second device are in communication with each other over a device-to-device (D2D) network.

Example 56

An apparatus comprising at least one means for performing a method of any of examples 1 to 29.

Example 57

An apparatus for wireless communications comprising a processor and memory coupled to the processor. The processor and memory may be configured to perform a method of any of examples 1 to 29.

Example 58

A non-transitory computer-readable medium storing code for wireless communications, the code comprising instructions executable by a processor to perform a method of any of examples 1 to 29.

Example 59

An apparatus comprising at least one means for performing a method of any of examples 30 to 55.

Example 60

An apparatus for wireless communications comprising a processor and memory coupled to the processor. The processor and memory may be configured to perform a method of any of examples 30 to 55

Example 61

A non-transitory computer-readable medium storing code for wireless communications, the code comprising instructions executable by a processor to perform a method of any of examples 30 to 55.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. A CDMA system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE, LTE-A, and LTE-A Pro are releases of UMTS that use E-UTRA. UTRA, E-UTRA, UMTS, LTE, LTE-A, LTE-A Pro, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned herein as well as other systems and radio technologies. While aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR applications.

A macro cell generally covers a relatively large geographic area (e.g., several kilometers in radius) and may allow unrestricted access by UEs with service subscriptions with the network provider. A small cell may be associated with a lower-powered base station, as compared with a macro cell, and a small cell may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells, and may also support communications using one or multiple component carriers.

The wireless communications systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA, or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may include random-access memory (RAM), read-only memory (ROM), electrically erasable programmable ROM (EEPROM), flash memory, compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:
    determining, at a first device, that a first set of transmission resources in a transmission time interval (TTI) has a higher priority than a second set of transmission resources in the TTI based at least in part on the second set of transmission resources having a higher likelihood of being punctured by a second device; and
    transmitting a bit sequence to the second device via the TTI, wherein the bit sequence is generated based at least in part on the first set of transmission resources in the TTI having the higher priority than the second set of transmission resources in the TTI.

2. The method of claim 1, wherein:
    at least one of the first set of transmission resources or the second set of transmission resources are configured.

3. The method of claim 1, wherein:
    transmission resources are selected or assigned within a resource pool; and
    at least one of the first set of transmission resources or the second set of transmission resources are based at least in part on one or more configurations of the resource pool.

4. The method of claim 1, wherein determining that the first set of transmission resources has the higher priority at the second device than the second set of transmission resources is based at least in part on a radio resource control (RRC) configuration of a resource pool that includes the first set of transmission resources and the second set of transmission resources.

5. The method of claim 1, further comprising:
    determining a number of second transmission resources within the second set of transmission resources;
    determining a target code rate for the bit sequence based at least in part on exclusion of the number of second transmission resources from a calculation of the target code rate; and
    selecting a low-density parity check (LDPC) base graph for use in processing the message into the bit sequence based at least in part on the target code rate.

6. The method of claim 5, wherein determining the target code rate for the bit sequence further comprises:
    determining the target code rate based on a function that includes a first input target code rate and a second input target code rate, wherein the first input target code rate is based on exclusion of the number of second transmission resources from the calculation of the first input target code rate, and wherein the second input target code rate is based on inclusion of the number of second transmission resources in the calculation of the second input target code rate.

7. The method of claim 6, wherein the function includes a weighting of the first input target code rate and the second input target code rate based at least in part on a traffic type of a message for the second device.

8. The method of claim 7, wherein the first input target code rate is weighted more heavily than the second input target code rate when the traffic type is unicast.

9. The method of claim 7, wherein the second input target code rate is weighted more heavily than the first input target code rate when the traffic type is multicast.

10. The method of claim 7, wherein the second input target code rate is weighted more heavily than the first input target code rate when the traffic type is broadcast.

11. The method of claim 6, further comprising:
adapting the function over time based at least in part on feedback received from one or more second devices.

12. The method of claim 1, further comprising:
generating one or more code blocks corresponding to a message for the second device, wherein each code block includes a plurality of systematic bits and a plurality of parity bits;
bit-interleaving the plurality of systematic bits and the plurality of parity bits of each code block so that at least a majority of the systematic bits are organized in a first set of columns and so that at least a majority of the parity bits are organized in a second set of columns; and
forming a first set of modulated symbols corresponding to the bit sequence based on the first set of columns and a second set of modulated symbols based on the second set of columns.

13. The method of claim 12, wherein bit-interleaving the plurality of systematic bits and the plurality of parity bits of each code block comprises:
organizing the plurality of systematic bits and the plurality of parity bits in row-column manner, where a number of rows depends on a modulated symbol order of the first set of modulated symbols and the second set of modulated symbols;
bit-interleaving to write the plurality of systematic bits and the plurality of parity bits column-wise within the first set of columns first, and then column-wise within the second set of columns next; and
reading out the bit-interleaved plurality of systematic bits and plurality of parity bits row-wise, starting with a first column and continuing until a last column.

14. The method of claim 12, wherein bit-interleaving the plurality of systematic bits and the plurality of parity bits of each code block comprises:
mapping as many as possible of the systematic bits to the first set of columns;
mapping any remainder of the systematic bits to the second set of columns; and
mapping the parity bits to either the first set of columns or the second set of columns after the systematic bits are mapped.

15. The method of claim 12, further comprising:
determining a ratio between the first set of transmission resources and the second set of transmission resources; and
organizing the first set of modulated symbols and the second set of modulated symbols based at least in part on the ratio.

16. The method of claim 15, wherein:
organizing the first set of modulated symbols and the second set of modulated symbols is further based on a number of code blocks used to transmit the bit sequence.

17. The method of claim 1, further comprising:
determining that the bit sequence includes a plurality of code blocks that each include a plurality of systematic bits and a plurality of parity bits;
determining, for each code block, a first set of coded bits and a second set of coded bits;
determining a concatenated third set of coded bits by concatenating the first sets of coded bits of the plurality of code blocks, starting with a first code block of the plurality of code blocks and continuing through a last code block of the plurality of code blocks;
determining a concatenated fourth set of coded bits by concatenating the second sets of coded bits of the plurality of code blocks, starting with the first code block and continuing through the last code block; and
determining concatenated code block bits for transmission on the transmission resources by concatenating the concatenated third set of coded bits first, followed by the concatenated fourth set of coded bits.

18. The method of claim 17, further comprising:
determining a ratio between the first set of transmission resources and the second set of transmission resources; and
determining a size of the first set of coded bits and a size of the second set of coded bits based at least in part on the ratio.

19. The method of claim 18, wherein the size of the first set of coded bits and the size of the second set of coded bits is further based on a number of code blocks corresponding to the bit sequence being transmitted.

20. The method of claim 1, further comprising:
mapping coded bits of a message for the second device to the first set of transmission resources in the TTI before mapping to the second set of transmission resources in the TTI.

21. The method of claim 20, wherein the mapping of coded bits of the message comprises:
mapping the coded bits via a frequency-first mapping, wherein the first set of transmission resources and the second set of transmission resources are orthogonal frequency-division multiplexing (OFDM) symbols.

22. The method of claim 20, wherein the mapping of coded bits of the message comprises:
determining that the TTI includes at least two or more slots;
determining, for each of the at least two or more slots, a first subset of transmission resources that belong to the first set of transmission resources and that are for transmitting in a corresponding slot;
determining a mapping order to map the coded bits based on the first subsets of transmission resources of each slot; and
mapping the coded bits based on the mapping order.

23. The method of claim 22, wherein determining the mapping order to map the coded bits comprises:
mapping first to the first subset of transmission resources of a corresponding slot, starting with a first slot of the at least two or more slots and continuing through to a last slot of the at least two or more slots; and
mapping next to a second subset of transmission resources of a corresponding slot, starting with the first slot and continuing through to the last slot.

24. The method of claim 22, wherein determining the mapping order to map the coded bits comprises:
mapping first to the first subset of transmission resources of a corresponding slot;
mapping next to a second subset of transmission resources of the corresponding slot; and
mapping each slot sequentially, starting with a first slot of the at least two or more slots and continuing through to a last slot of the at least two or more slots.

25. The method of claim 1, wherein the first set of transmission resources comprises a first set of resource elements, and wherein the second set of transmission resources comprises a second set of resource elements.

26. The method of claim 1, wherein the first set of transmission resources comprises a first set of orthogonal frequency-division multiplexing (OFDM) symbols, and wherein the second set of transmission resources comprises a second set of OFDM symbols.

27. The method of claim 1, wherein the first device and the second device are in communication with each other over a vehicle-to-everything (V2X) network.

28. The method of claim 1, wherein the first device and the second device are in communication with each other over a device-to-device (D2D) network.

29. A method for wireless communication, comprising:
receiving, at a second device, a bit sequence from a first device in a transmission time interval (TTI);
determining that a first set of transmission resources in the TTI has a higher priority at the second device than a second set of transmission resources in the TTI based at least in part on the second set of transmission resources having a higher likelihood of being punctured by the second device; and
decoding the bit sequence based at least in part on the first set of transmission resources in the TTI having the higher priority than the second set of transmission resources in the TTI.

30. The method of claim 29, wherein:
at least one of the first set of transmission resources or the second set of transmission resources are configured.

31. The method of claim 29, further comprising:
indicating at least one of the first set of transmission resources or the second set of transmission resources to the first device.

32. The method of claim 29, further comprising:
determining a number of second transmission resources within the second set of transmission resources;
determining a target code rate for the bit sequence based at least in part on exclusion of the number of second transmission resources from a calculation of the target code rate; and
selecting a low-density parity check (LDPC) base graph for use in decoding the bit sequence based at least in part on the target code rate.

33. The method of claim 32, wherein determining the target code rate for the bit sequence further comprises:
determining the target code rate based on a function that includes a first input target code rate and a second input target code rate, wherein the first input target code rate is based on exclusion of the number of second transmission resources from the calculation of the first input target code rate, and wherein the second input target code rate is based on inclusion of the number of second transmission resources in the calculation of the second input target code rate.

34. The method of claim 33, wherein the function includes a weighting of the first input target code rate and the second input target code rate based at least in part on a traffic type of a message for the second device.

35. The method of claim 34, wherein the first input target code rate is weighted more heavily than the second input target code rate when the traffic type is unicast.

36. The method of claim 34, wherein the second input target code rate is weighted more heavily than the first input target code rate when the traffic type is multicast.

37. The method of claim 34, wherein the second input target code rate is weighted more heavily than the first input target code rate when the traffic type is broadcast.

38. The method of claim 33, further comprising:
transmitting feedback to the first device based at least in part on the decoding; and
adapting the function over time based at least in part on the feedback.

39. The method of claim 29, further comprising:
demodulating a first set of modulated symbols of the bit sequence into a first set of columns and a second set of modulated symbols of the bit sequence into a second set of columns;
de-interleaving the first set of modulated symbols and the second set of modulated symbols based at least in part on a majority of a plurality of systematic bits of a message for the second device being organized into the first set of columns and a majority of parity bits of the message being organized into the second set of columns; and
determining one or more code blocks corresponding to the message for the second device based at least in part on de-interleaving the first set of modulated symbols and the second set of modulated symbols.

40. The method of claim 39, wherein de-interleaving the plurality of systematic bits and the plurality of parity bits of each code block comprises:
reading in a bit-interleaved plurality of systematic bits and plurality of parity bits row-wise, starting with a first column and continuing until a last column
de-interleaving to write the plurality of systematic bits and the plurality of parity bits column-wise within the first set of columns first, and then column-wise within the second set of columns next, wherein the plurality of systematic bits and the plurality of parity bits are organized in row-column manner, where a number of rows depends on a modulated symbol order of the first set of modulated symbols and the second set of modulated symbols.

41. The method of claim 39, further comprising:
determining a ratio between the first set of transmission resources and the second set of transmission resources, wherein the first set of modulated symbols and the second set of modulated symbols are organized based at least in part on the ratio.

42. The method of claim 41, wherein the first set of modulated symbols and the second set of modulated symbols are organized based on a number of code blocks used to transmit the bit sequence.

43. The method of claim 29, wherein the bit sequence includes a plurality of concatenated code blocks that each include a plurality of systematic bits and a plurality of parity bits.

44. The method of claim 43, further comprising:
determining a size of the first set of coded bits and a size of the second set of coded bits is based at least in part on a ratio between the first set of transmission resources and the second set of transmission resources.

45. The method of claim 44, wherein the size of the first set of coded bits and the size of the second set of coded bits is further based on a number of code blocks corresponding to the bit sequence being transmitted.

46. The method of claim 29, further comprising:
determining coded bits of a message for the second device were mapped to the first set of transmission resources in the TTI before coded bits of the message were mapped to the second set of transmission resources in the TTI.

47. The method of claim 46, wherein the determining comprises:

determining the coded bits were mapped via a frequency-first mapping, wherein the first set of transmission resources and the second set of transmission resources are orthogonal frequency-division multiplexing (OFDM) symbols.

48. The method of claim 46, wherein the determining comprises:
determining that the TTI includes at least two or more slots;
determining, for each of the at least two or more slots, a first subset of transmission resources that belong to the first set of transmission resources and that are for transmitting in a corresponding slot;
determining a mapping order of the coded bits based on the first subsets of transmission resources of each slot; and
determining the coded bits based on the mapping order.

49. The method of claim 48, wherein determining the mapping order for mapping of the coded bits comprises:
determining the transmitter first mapped the coded bits to the first subset of transmission resources of a corresponding slot, starting with a first slot of the at least two or more slots and continuing through to a last slot of the at least two or more slots; and
determining the transmitter next mapped the coded bits to a second subset of transmission resources of a corresponding slot, starting with the first slot and continuing through to the last slot.

50. The method of claim 48, wherein determining the mapping order for mapping of the coded bits comprises:
determining the transmitter first mapped the coded bits to the first subset of transmission resources of a corresponding slot;
determining the transmitter next mapped the coded bits to a second subset of transmission resources of the corresponding slot; and
determining the transmitter then mapped the coded bits to each slot sequentially, starting with a first slot of the at least two or more slots and continuing through to a last slot of the at least two or more slots.

51. The method of claim 29, wherein the first set of transmission resources comprises a first set of resource elements, and wherein the second set of transmission resources comprises a second set of resource elements.

52. The method of claim 29, wherein the first set of transmission resources comprises a first set of orthogonal frequency-division multiplexing (OFDM) symbols, and wherein the second set of transmission resources comprises a second set of OFDM symbols.

53. The method of claim 29, wherein the first device and the second device are in communication with each other over a vehicle-to-everything (V2X) network.

54. The method of claim 29, wherein the first device and the second device are in communication with each other over a device-to-device (D2D) network.

55. An apparatus for wireless communication, comprising: a processor; and memory coupled to the processor, the processor and memory configured to:
determine, at a first device, that a first set of transmission resources in a transmission time interval (TTI) has a higher priority at a second device than a second set of transmission resources in the TTI based at least in part on the second set of transmission resources having a higher likelihood of being punctured by the second device; and
transmit a bit sequence to the second device via the TTI, wherein the bit sequence is generated based at least in part on the first set of transmission resources in the TTI having the higher priority than the second set of transmission resources in the TTI.

56. The apparatus of claim 55, wherein: at least one of the first set of transmission resources or the second set of transmission resources are configured.

57. The apparatus of claim 55, wherein: transmission resources are selected or assigned within a resource pool, and at least one of the first set of transmission resources or the second set of transmission resources are based at least in part on one or more configurations of the resource pool.

58. The apparatus of claim 55, wherein identifying that the first set of transmission resources has the higher priority at the second device than the second set of transmission resources is based at least in part on a radio resource control (RRC) configuration of a resource pool that includes the first set of transmission resources and the second set of transmission resources.

59. The apparatus of claim 55, wherein the processor and memory are further configured to:
determine a number of second transmission resources within the second set of transmission resources;
determine a target code rate for the bit sequence based at least in part on exclusion of the number of second transmission resources from a calculation of the target code rate; and
select a low-density parity check (LDPC) base graph for use in processing the message into the bit sequence based at least in part on the target code rate.

60. The apparatus of claim 59, wherein the processor and memory are further configured to:
determine the target code rate based on a function that includes a first input target code rate and a second input target code rate, wherein the first input target code rate is based on exclusion of the number of second transmission resources from the calculation of the first input target code rate, and wherein the second input target code rate is based on inclusion of the number of second transmission resources in the calculation of the second input target code rate.

61. The apparatus of claim 55, wherein the processor and memory are further configured to:
generate one or more code blocks corresponding to the message;
identify that each code block includes a plurality of systematic bits and a plurality of parity bits;
bit-interleave the plurality of systematic bits and the plurality of parity bits of each code block so that at least a majority of the systematic bits are organized in a first set of columns and so that at least a majority of the parity bits are organized in a second set of columns; and
form a first set of modulated symbols based on the first set of columns and a second set of modulated symbols based on the second set of columns.

62. The apparatus of claim 55, wherein the processor and memory are further configured to:
identify that the bit sequence includes a plurality of code blocks that each include a plurality of systematic bits and a plurality of parity bits;
determine, for each code block, a first set of coded bits and a second set of coded bits;
determine a concatenated third set of coded bits by concatenating the first sets of coded bits of the plurality of code blocks, starting with a first code block of the plurality of code blocks and continuing through a last code block of the plurality of code blocks;

determine a concatenated fourth set of coded bits by concatenating the second sets of coded bits of the plurality of code blocks, starting with the first code block and continuing through the last code block; and determine concatenated code block bits for transmission on the transmission resources by concatenating the concatenated third set of coded bits first, followed by the concatenated fourth set of coded bits.

63. The apparatus of claim 55, wherein the processor and memory are further configured to:

map coded bits of the message to the first set of transmission resources in the TTI before mapping to the second set of transmission resources in the TTI.

64. An apparatus for wireless communication, comprising: a processor; and memory coupled to the processor, the processor and memory configured to:

receive, at a second device, a bit sequence from a first device in a transmission time interval (TTI);

determine that a first set of transmission resources in the TTI has a higher priority at the second device than a second set of transmission resources in the TTI based at least in part on the second set of transmission resources having a higher likelihood of being punctured by the second device; and decode the bit sequence based at least in part on the first set of transmission resources in the TTI having the higher priority than the second set of transmission resources in the TTI.

65. The apparatus of claim 64, wherein at least one of the first set of transmission resources or the second set of transmission resources are configured.

66. The apparatus of claim 64, wherein the processor and memory are further configured to:

indicate at least one of the first set of transmission resources or the second set of transmission resources to the first device.

67. The apparatus of claim 64, wherein the processor and memory are further configured to:

determine a number of second transmission resources within the second set of transmission resources;

determine a target code rate for the bit sequence based at least in part on exclusion of the number of second transmission resources from a calculation of the target code rate; and select a low-density parity check (LDPC) base graph for use in decoding the bit sequence based at least in part on the target code rate.

68. The apparatus of claim 64, wherein the processor and memory are further configured to:

demodulate a first set of modulated symbols of the bit sequence into a first set of columns and a second set of modulated symbols of the bit sequence into a second set of columns;

de-interleave the first set of modulated symbols and the second set of modulated symbols based at least in part on a majority of a plurality of systematic bits of a message for the second device being organized into the first set of columns and a majority of parity bits of the message being organized into the second set of columns; and determine one or more code blocks corresponding to the message for the second device based at least in part on de-interleaving the first set of modulated symbols and the second set of modulated symbols.

69. The apparatus of claim 64, wherein the bit sequence includes a plurality of concatenated code blocks that each include a plurality of systematic bits and a plurality of parity bits.

70. The apparatus of claim 64, wherein the processor and memory are further configured to:

determine coded bits of a message for the second device were mapped to the first set of transmission resources in the TTI before coded bits of the message were mapped to the second set of transmission resources in the TTI.

71. An apparatus for wireless communication, comprising:

means for determining, at a first device, that a first set of transmission resources in a transmission time interval (TTI) has a higher priority than a second set of transmission resources in the TTI based at least in part on the second set of transmission resources having a higher likelihood of being punctured by a second device; and means for transmitting a bit sequence to the second device via the TTI, wherein the bit sequence is generated based at least in part on the first set of transmission resources in the TTI having the higher priority than the second set of transmission resources in the TTI.

72. The apparatus of claim 71, wherein: at least one of the first set of transmission resources or the second set of transmission resources are configured.

73. The apparatus of claim 71, wherein: transmission resources are selected or assigned within a resource pool, and at least one of the first set of transmission resources or the second set of transmission resources are based at least in part on one or more configurations of the resource pool.

74. The apparatus of claim 71, wherein identifying that the first set of transmission resources has the higher priority at the second device than the second set of transmission resources is based at least in part on a radio resource control (RRC) configuration of a resource pool that includes the first set of transmission resources and the second set of transmission resources.

75. The apparatus of claim 71, wherein the means for processing the message into the bit sequence based at least in part on the identification of the second set of transmission resources in the TTI comprises:

means for determining a number of second transmission resources within the second set of transmission resources;

means for determining a target code rate for the bit sequence based at least in part on exclusion of the number of second transmission resources from a calculation of the target code rate; and means for selecting a low-density parity check (LDPC) base graph for use in processing the message into the bit sequence based at least in part on the target code rate.

76. The apparatus of claim 75, wherein the means for determining the target code rate for the bit sequence further comprises:

means for determining the target code rate based on a function that includes a first input target code rate and a second input target code rate, wherein the first input target code rate is based on exclusion of the number of second transmission resources from the calculation of the first input target code rate, and wherein the second input target code rate is based on inclusion of the number of second transmission resources in the calculation of the second input target code rate.

77. The apparatus of claim 71, wherein the means for processing the message into the bit sequence based at least in part on the identification of the second set of transmission resources in the TTI comprises:
  means for generating one or more code blocks corresponding to the message;
  means for identifying that each code block includes a plurality of systematic bits and a plurality of parity bits;
  means for bit-interleaving the plurality of systematic bits and the plurality of parity bits of each code block so that at least a majority of the systematic bits are organized in a first set of columns and so that at least a majority of the parity bits are organized in a second set of columns; and
  means for forming a first set of modulated symbols based on the first set of columns and a second set of modulated symbols based on the second set of columns.

78. The apparatus of claim 71, wherein the means for processing the message into the bit sequence based at least in part on the identification of the second set of transmission resources in the TTI comprises:
  means for identifying that the bit sequence includes a plurality of code blocks that each include a plurality of systematic bits and a plurality of parity bits;
  means for determining, for each code block, a first set of coded bits and a second set of coded bits;
  means for determining a concatenated third set of coded bits by concatenating the first sets of coded bits of the plurality of code blocks, starting with a first code block of the plurality of code blocks and continuing through a last code block of the plurality of code blocks;
  means for determining a concatenated fourth set of coded bits by concatenating the second sets of coded bits of the plurality of code blocks, starting with the first code block and continuing through the last code block; and
  means for determining concatenated code block bits for transmission on the transmission resources by concatenating the concatenated third set of coded bits first, followed by the concatenated fourth set of coded bits.

79. The apparatus of claim 71, wherein the means for processing the message into the bit sequence based at least in part on the identification of the second set of transmission resources in the TTI comprises:
  means for mapping coded bits of the message to the first set of transmission resources in the TTI before mapping to the second set of transmission resources in the TTI.

80. An apparatus for wireless communication, comprising:
  means for receiving, at a second device, a bit sequence from a first device in a transmission time interval (TTI);
  means for determining that a first set of transmission resources in the TTI has a higher priority at the second device than a second set of transmission resources in the TTI based at least in part on the second set of transmission resources having a higher likelihood of being punctured by the second device; and
  means for decoding the bit sequence based at least in part on the first set of transmission resources in the TTI having the higher priority than the second set of transmission resources in the TTI.

81. The apparatus of claim 80, wherein at least one of the first set of transmission resources or the second set of transmission resources are configured.

82. The apparatus of claim 80, further comprising:
  means for indicating at least one of the first set of transmission resources or the second set of transmission resources to the first device.

83. The apparatus of claim 80, further comprising:
  means for determining a number of second transmission resources within the second set of transmission resources;
  means for determining a target code rate for the bit sequence based at least in part on exclusion of the number of second transmission resources from a calculation of the target code rate; and
  means for selecting a low-density parity check (LDPC) base graph for use in decoding the bit sequence based at least in part on the target code rate.

84. The apparatus of claim 80, further comprising:
  means for demodulating a first set of modulated symbols of the bit sequence into a first set of columns and a second set of modulated symbols of the bit sequence into a second set of columns;
  means for de-interleaving the first set of modulated symbols and the second set of modulated symbols based at least in part on a majority of a plurality of systematic bits of a message for the second device being organized into the first set of columns and a majority of parity bits of the message being organized into the second set of columns; and
  means for determining one or more code blocks corresponding to the message for the second device based at least in part on de-interleaving the first set of modulated symbols and the second set of modulated symbols.

85. The apparatus of claim 80, wherein the bit sequence includes a plurality of concatenated code blocks that each include a plurality of systematic bits and a plurality of parity bits.

86. The apparatus of claim 83, further comprising:
  means for determining coded bits of a message for the second device were mapped to the first set of transmission resources in the TTI before coded bits of the message were mapped to the second set of transmission resources in the TTI.

87. A non-transitory computer-readable medium storing code for wireless communication, the code comprising instructions executable by a processor to:
  determine, at a first device, that a first set of transmission resources in a transmission time interval (TTI) has a higher priority than a second set of transmission resources in the TTI based at least in part on the second set of transmission resources having a higher likelihood of being punctured by a second device; and
  transmit a bit sequence to the second device via the TTI, wherein the bit sequence is generated based at least in part on the first set of transmission resources in the TTI having the higher priority than the second set of transmission resources in the TTI.

88. The non-transitory computer-readable medium of claim 87, wherein: at least one of the first set of transmission resources or the second set of transmission resources are configured.

89. The non-transitory computer-readable medium of claim 87, wherein: transmission resources are selected or assigned within a resource pool, and at least one of the first set of transmission resources or the second set of transmission resources are based at least in part on one or more configurations of the resource pool.

90. The non-transitory computer-readable medium of claim 8, wherein identifying that the first set of transmission resources has the higher priority at the second device than the second set of transmission resources is based at least in part on a radio resource control (RRC) configuration of a resource pool that includes the first set of transmission resources and the second set of transmission resources.

91. The non-transitory computer-readable medium of claim 87, wherein the instructions to process the message into the bit sequence based at least in part on the identification of the second set of transmission resources in the TTI are executable to:
   determine a number of second transmission resources within the second set of transmission resources;
   determine a target code rate for the bit sequence based at least in part on exclusion of the number of second transmission resources from a calculation of the target code rate; and
   select a low-density parity check (LDPC) base graph for use in processing the message into the bit sequence based at least in part on the target code rate.

92. The non-transitory computer-readable medium of claim 91, wherein the instructions to determine the target code rate for the bit sequence further are executable to:
   determine the target code rate based on a function that includes a first input target code rate and a second input target code rate, wherein the first input target code rate is based on exclusion of the number of second transmission resources from the calculation of the first input target code rate, and wherein the second input target code rate is based on inclusion of the number of second transmission resources in the calculation of the second input target code rate.

93. The non-transitory computer-readable medium of claim 87, wherein the instructions to process the message into the bit sequence based at least in part on the identification of the second set of transmission resources in the TTI are executable to:
   generate one or more code blocks corresponding to the message;
   identify that each code block includes a plurality of systematic bits and a plurality of parity bits;
   bit-interleave the plurality of systematic bits and the plurality of parity bits of each code block so that at least a majority of the systematic bits are organized in a first set of columns and so that at least a majority of the parity bits are organized in a second set of columns; and
   form a first set of modulated symbols based on the first set of columns and a second set of modulated symbols based on the second set of columns.

94. The non-transitory computer-readable medium of claim 87, wherein the instructions to process the message into the bit sequence based at least in part on the identification of the second set of transmission resources in the TTI are executable to:
   identify that the bit sequence includes a plurality of code blocks that each include a plurality of systematic bits and a plurality of parity bits;
   determine, for each code block, a first set of coded bits and a second set of coded bits;
   determine a concatenated third set of coded bits by concatenating the first sets of coded bits of the plurality of code blocks, starting with a first code block of the plurality of code blocks and continuing through a last code block of the plurality of code blocks;
   determine a concatenated fourth set of coded bits by concatenating the second sets of coded bits of the plurality of code blocks, starting with the first code block and continuing through the last code block; and
   determine concatenated code block bits for transmission on the transmission resources by concatenating the concatenated third set of coded bits first, followed by the concatenated fourth set of coded bits.

95. The non-transitory computer-readable medium of claim 87, wherein the instructions to process the message into the bit sequence based at least in part on the identification of the second set of transmission resources in the TTI are executable to:
   map coded bits of the message to the first set of transmission resources in the TTI before mapping to the second set of transmission resources in the TTI.

96. A non-transitory computer-readable medium storing code for wireless communication, the code comprising instructions executable by a processor to:
   receive, at a second device, a bit sequence from a first device in a transmission time interval (TTI);
   determine that a first set of transmission resources in the TTI has a higher priority at the second device than a second set of transmission resources in the TTI based at least in part on the second set of transmission resources having a higher likelihood of being punctured by a second device; and
   decode the bit sequence based at least in part on the first set of transmission resources in the TTI having the higher priority than the second set of transmission resources in the TTI.

97. The non-transitory computer-readable medium of claim 96, wherein at least one of the first set of transmission resources or the second set of transmission resources are configured.

98. The non-transitory computer-readable medium of claim 96, wherein the instructions are further executable to:
   indicate at least one of the first set of transmission resources or the second set of transmission resources to the first device.

99. The non-transitory computer-readable medium of claim 96, wherein the instructions are further executable to:
   determine a number of second transmission resources within the second set of transmission resources;
   determine a target code rate for the bit sequence based at least in part on exclusion of the number of second transmission resources from a calculation of the target code rate; and
   select a low-density parity check (LDPC) base graph for use in decoding the bit sequence based at least in part on the target code rate.

100. The non-transitory computer-readable medium of claim 96, wherein the instructions are further executable to:
   demodulate a first set of modulated symbols of the bit sequence into a first set of columns and a second set of modulated symbols of the bit sequence into a second set of columns;
   de-interleave the first set of modulated symbols and the second set of modulated symbols based at least in part on a majority of a plurality of systematic bits of a message for the second device being organized into the first set of columns and a majority of parity bits of the message being organized into the second set of columns; and
   determine one or more code blocks corresponding to the message for the second device based at least in part on de-interleaving the first set of modulated symbols and the second set of modulated symbols.

101. The non-transitory computer-readable medium of claim 96, wherein the bit sequence includes a plurality of concatenated code blocks that each include a plurality of systematic bits and a plurality of parity bits.

102. The non-transitory computer-readable medium of claim 96, wherein the instructions are further executable to:
   determine coded bits of a message for the second device were mapped to the first set of transmission resources in the TTI before coded bits of the message were mapped to the second set of transmission resources in the TTI.

\* \* \* \* \*